(12) United States Patent
Bartlett et al.

(10) Patent No.: US 11,014,804 B2
(45) Date of Patent: May 25, 2021

(54) SYSTEMS AND METHODS FOR FABRICATING 3D SOFT MICROSTRUCTURES

(71) Applicant: President and Fellows of Harvard College, Cambridge, MA (US)

(72) Inventors: Nicholas W. Bartlett, Somerville, MA (US); Tommaso Ranzani, Cambridge, MA (US); Sheila Russo, Cambridge, MA (US); Conor J. Walsh, Cambridge, MA (US); Michael Wehner, Berkeley, CA (US); Robert J. Wood, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 16/493,746

(22) PCT Filed: Mar. 14, 2018

(86) PCT No.: PCT/US2018/022494
§ 371 (c)(1),
(2) Date: Sep. 12, 2019

(87) PCT Pub. No.: WO2018/170170
PCT Pub. Date: Sep. 20, 2018

(65) Prior Publication Data
US 2020/0079643 A1 Mar. 12, 2020

Related U.S. Application Data

(60) Provisional application No. 62/471,134, filed on Mar. 14, 2017.

(51) Int. Cl.
*B81B 3/00* (2006.01)
*B81C 1/00* (2006.01)
*B33Y 80/00* (2015.01)

(52) U.S. Cl.
CPC .......... *B81B 3/0018* (2013.01); *B81C 1/0046* (2013.01); *B81C 1/00134* (2013.01);
(Continued)

(58) Field of Classification Search
CPC .............. B81B 3/0018; B81B 2201/05; B81C 1/00134; B81C 1/00357; B81C 1/0046; B33Y 80/00
See application file for complete search history.

(56) References Cited

U.S. PATENT DOCUMENTS 3,387,305 A 6/1968 Shafer
3,411,511 A 11/1968 Marino
(Continued)

FOREIGN PATENT DOCUMENTS

CN 1431084 A 7/2003
CN 1868434 A 11/2006
(Continued)

OTHER PUBLICATIONS

2011 IEEE/RSJ International Conference on Intelligent Robots and Systems Sep. 25-30, 2011. San Francisco, CA, USA (Year: 2011).*
(Continued)

*Primary Examiner* — Jarrett J Stark
(74) *Attorney, Agent, or Firm* — Wolf, Greenfield & Sacks, P.C.

(57) ABSTRACT

Systems and methods for fabricating 3D soft microstructures. The system comprises injecting a pressurized, curable liquid into certain structural layers induces folding and allows the 2D structures to reconfigure into a 3D form In addition to the injection of a curable liquid that permanently reconfigures the structure of the system, in an embodiment this method also allows for the injection of other liquids into certain actuator layers that enable motion in certain portions of the system Furthermore, the system allows for handling
(Continued)

of colored fluids that are passed to visualization layers. The method of creating such a system depends on taking advantage of laser machining of the individual layers to influence the behavior of how different portions bend and move.

13 Claims, 55 Drawing Sheets

(52) U.S. Cl.
    CPC ........... *B81C 1/00357* (2013.01); *B33Y 80/00* (2014.12); *B81B 2201/05* (2013.01)

(56) References Cited

U.S. PATENT DOCUMENTS

| | | |
|---|---|---|
| 3,831,467 A | 8/1974 | Moore |
| 4,023,215 A | 5/1977 | Moore |
| 4,252,112 A | 2/1981 | Joyce |
| 4,370,977 A | 2/1983 | Mauldin et al. |
| 4,682,776 A | 7/1987 | Mitchell et al. |
| 4,697,808 A | 10/1987 | Larson et al. |
| 4,724,827 A | 2/1988 | Schenck |
| 4,760,850 A | 8/1988 | Phillips et al. |
| 5,020,790 A | 6/1991 | Beard et al. |
| 5,282,460 A | 2/1994 | Boldt |
| 5,485,402 A | 1/1996 | Smith et al. |
| 5,584,799 A | 12/1996 | Gray |
| 5,599,283 A | 2/1997 | Lindenmeyer et al. |
| 5,667,461 A | 9/1997 | Hall |
| 5,826,578 A | 10/1998 | Curchod |
| 5,865,714 A | 2/1999 | Marlowe |
| 5,865,770 A | 2/1999 | Schectman |
| 5,955,667 A | 9/1999 | Fyfe |
| 6,123,649 A | 9/2000 | Lee et al. |
| 6,129,691 A | 10/2000 | Ruppert |
| 6,168,634 B1 | 1/2001 | Schmitz |
| 6,213,922 B1 | 4/2001 | Afanasenko et al. |
| 6,500,138 B1 | 12/2002 | Irby et al. |
| 6,517,503 B1 | 2/2003 | Naft et al. |
| 6,633,783 B1 | 10/2003 | Dariush et al. |
| 6,635,024 B2 | 10/2003 | Hatton et al. |
| 6,666,831 B1 | 12/2003 | Edgerton et al. |
| 6,689,075 B2 | 2/2004 | West |
| 6,741,911 B2 | 5/2004 | Simmons |
| 6,783,555 B2 | 8/2004 | Kuhn et al. |
| 6,790,165 B2 | 9/2004 | Huang |
| 6,796,926 B2 | 9/2004 | Reinkensmeyer et al. |
| 6,812,624 B1 | 11/2004 | Pei et al. |
| 6,955,692 B2 | 10/2005 | Grundei |
| 6,989,669 B2 | 1/2006 | Low et al. |
| 7,034,432 B1 | 4/2006 | Pelrine et al. |
| 7,034,527 B2 | 4/2006 | Low et al. |
| 7,049,732 B2 | 5/2006 | Pei et al. |
| 7,056,297 B2 | 6/2006 | Dohno et al. |
| 7,064,472 B2 | 6/2006 | Pelrine et al. |
| 7,090,650 B2 | 8/2006 | Ou et al. |
| 7,153,242 B2 | 12/2006 | Goffer |
| 7,153,246 B2 | 12/2006 | Koscielny et al. |
| 7,166,953 B2 | 1/2007 | Heim et al. |
| 7,190,141 B1 | 3/2007 | Ashrafiuon et al. |
| 7,199,501 B2 | 4/2007 | Pei et al. |
| 7,211,937 B2 | 5/2007 | Kornbluh et al. |
| 7,224,106 B2 | 5/2007 | Pei et al. |
| 7,229,390 B2 | 6/2007 | Fujii et al. |
| 7,233,097 B2 | 6/2007 | Rosenthal et al. |
| 7,252,644 B2 | 8/2007 | Dewald et al. |
| 7,259,503 B2 | 8/2007 | Pei et al. |
| 7,259,553 B2 | 8/2007 | Arns, Jr. et al. |
| 7,307,418 B2 | 12/2007 | Low et al. |
| 7,331,906 B2 | 2/2008 | He et al. |
| 7,341,295 B1 | 3/2008 | Veatch et al. |
| 7,355,519 B2 | 4/2008 | Grold et al. |
| 7,367,958 B2 | 5/2008 | McBean et al. |
| 7,368,862 B2 | 5/2008 | Pelrine et al. |
| 7,378,878 B2 | 5/2008 | Pelrine et al. |
| 7,390,309 B2 | 6/2008 | Dariush |
| 7,410,471 B1 | 8/2008 | Campbell et al. |
| 7,411,332 B2 | 8/2008 | Kornbluh et al. |
| 7,429,253 B2 | 9/2008 | Shimada et al. |
| 7,436,099 B2 | 10/2008 | Pei et al. |
| 7,445,606 B2 | 11/2008 | Rastegar et al. |
| 7,456,549 B2 | 11/2008 | Heim et al. |
| 7,476,185 B2 | 1/2009 | Drennan |
| 7,494,450 B2 | 2/2009 | Solomon |
| 7,521,840 B2 | 4/2009 | Heim |
| 7,521,847 B2 | 4/2009 | Heim |
| 7,537,573 B2 | 5/2009 | Horst |
| 7,549,969 B2 | 6/2009 | van Den Bogert |
| 7,567,681 B2 | 7/2009 | Pelrine et al. |
| 7,578,799 B2 | 8/2009 | Thorsteinsson et al. |
| 7,595,580 B2 | 9/2009 | Heim |
| 7,598,651 B2 | 10/2009 | Kornbluh et al. |
| 7,598,652 B2 | 10/2009 | Kornbluh et al. |
| 7,626,319 B2 | 12/2009 | Heim |
| 7,650,204 B2 | 1/2010 | Dariush |
| 7,652,386 B2 | 1/2010 | Donelan et al. |
| 7,654,973 B2 | 2/2010 | Firsov |
| 7,679,267 B2 | 3/2010 | Heim |
| 7,684,896 B2 | 3/2010 | Dariush |
| 7,705,521 B2 | 4/2010 | Pelrine et al. |
| 7,737,685 B2 | 6/2010 | Low et al. |
| 7,750,532 B2 | 7/2010 | Heim |
| 7,758,481 B2 | 7/2010 | Drennan |
| 7,774,177 B2 | 8/2010 | Dariush |
| 7,775,999 B2 | 8/2010 | Brown |
| 7,785,279 B2 | 8/2010 | Sankai |
| 7,785,656 B2 | 8/2010 | Pei et al. |
| 7,787,646 B2 | 8/2010 | Pelrine et al. |
| 7,804,227 B2 | 9/2010 | Pelrine et al. |
| 7,857,774 B2 | 12/2010 | Sankai |
| 7,860,562 B2 | 12/2010 | Endo et al. |
| 7,883,546 B2 | 2/2011 | Kazerooni et al. |
| 7,887,471 B2 | 2/2011 | McSorley |
| 7,897,168 B2 | 3/2011 | Chen et al. |
| 7,911,761 B2 | 3/2011 | Biggs et al. |
| 7,915,790 B2 | 3/2011 | Heim et al. |
| 7,918,808 B2 | 4/2011 | Simmons |
| 7,921,541 B2 | 4/2011 | Pei et al. |
| 7,923,064 B2 | 4/2011 | Pelrien et al. |
| 7,923,902 B2 | 4/2011 | Heim |
| 7,947,004 B2 | 5/2011 | Kazerooni et al. |
| 7,952,261 B2 | 5/2011 | Lipton et al. |
| 7,977,923 B2 | 7/2011 | Pelrine et al. |
| 7,981,508 B1 | 7/2011 | Sharma et al. |
| 7,985,193 B2 | 7/2011 | Thorsteinsson et al. |
| 7,990,022 B2 | 8/2011 | Heim |
| 7,998,040 B2 | 8/2011 | Kram et al. |
| 8,048,007 B2 | 11/2011 | Roy |
| 8,057,410 B2 | 11/2011 | Angold et al. |
| 8,058,861 B2 | 11/2011 | Pelrine et al. |
| 8,060,337 B2 | 11/2011 | Kulach et al. |
| 8,075,633 B2 | 12/2011 | Herr et al. |
| 8,083,644 B2 | 12/2011 | Purdy et al. |
| 8,096,965 B2 | 1/2012 | Goffer et al. |
| 8,114,034 B2 | 2/2012 | Ikeuchi et al. |
| 8,125,755 B2 | 2/2012 | Garcia et al. |
| 8,127,437 B2 | 3/2012 | Lipton et al. |
| 8,142,370 B2 | 3/2012 | Weinberg et al. |
| 8,147,436 B2 | 4/2012 | Agrawal et al. |
| 8,164,232 B2 | 4/2012 | Kornbluh et al. |
| 8,183,739 B2 | 5/2012 | Heim |
| 8,222,799 B2 | 7/2012 | Polyakov et al. |
| 8,231,687 B2 | 7/2012 | Bedard et al. |
| 8,235,869 B2 | 8/2012 | Rastegar et al. |
| 8,246,559 B2 | 8/2012 | Hoffman et al. |
| 8,248,750 B2 | 8/2012 | Biggs et al. |
| 8,274,244 B2 | 9/2012 | Horst et al. |
| 8,283,839 B2 | 10/2012 | Heim |
| 8,287,477 B1 | 10/2012 | Herr et al. |
| 8,292,836 B2 | 10/2012 | Matsuoka et al. |
| 8,299,634 B2 | 10/2012 | Donelan et al. |
| 8,311,623 B2 | 11/2012 | Sanger |
| 8,316,526 B2 | 11/2012 | Pei et al. |

(56) References Cited

U.S. PATENT DOCUMENTS

| | | |
|---|---|---|
| 8,316,719 B2 | 11/2012 | Majidi et al. |
| 8,323,355 B2 | 12/2012 | Latour |
| 8,325,458 B2 | 12/2012 | Prahlad et al. |
| 8,348,875 B2 | 1/2013 | Goffer et al. |
| 8,376,971 B1 | 2/2013 | Herr et al. |
| 8,409,117 B2 | 4/2013 | Cheng et al. |
| 8,436,508 B2 | 5/2013 | Kornbluh et al. |
| 8,438,757 B2 | 5/2013 | Roser |
| 8,460,001 B1 | 6/2013 | Chuang |
| 8,467,904 B2 | 6/2013 | Dariush |
| 8,488,295 B2 | 7/2013 | Garcia et al. |
| 8,508,109 B2 | 8/2013 | Pelrine et al. |
| 8,551,029 B1 | 10/2013 | Herr et al. |
| 8,551,184 B1 | 10/2013 | Herr |
| 8,562,691 B2 | 10/2013 | Endo et al. |
| 8,564,926 B2 | 10/2013 | Prahlad et al. |
| 8,573,982 B1 | 11/2013 | Chuang |
| 8,585,620 B2 | 11/2013 | McBean et al. |
| 8,597,369 B2 | 12/2013 | Hansen et al. |
| 8,608,479 B2 | 12/2013 | Liu |
| 8,608,674 B2 | 12/2013 | Krebs et al. |
| 8,622,938 B2 | 1/2014 | Sankai |
| 8,663,133 B2 | 3/2014 | Johnson et al. |
| 8,665,578 B2 | 3/2014 | Pelrine et al. |
| 8,679,575 B2 | 3/2014 | Biggs et al. |
| 8,715,208 B2 | 5/2014 | Hodgins et al. |
| 8,764,850 B2 | 7/2014 | Hansen et al. |
| 8,766,925 B2 | 7/2014 | Perlin et al. |
| 8,773,148 B2 | 7/2014 | Sankai et al. |
| 8,847,611 B2 | 9/2014 | Ulmen et al. |
| 8,905,955 B2 | 12/2014 | Goffer et al. |
| 8,920,517 B2 | 12/2014 | Smith et al. |
| 8,926,534 B2 | 1/2015 | McBean et al. |
| 8,938,289 B2 | 1/2015 | Einav et al. |
| 8,961,439 B2 | 2/2015 | Yang et al. |
| 8,975,888 B2 | 3/2015 | Pelrine et al. |
| 8,981,621 B2 | 3/2015 | Pelrine et al. |
| 8,986,233 B2 | 3/2015 | Aoki et al. |
| 9,044,346 B2 | 6/2015 | Langlois et al. |
| 9,072,941 B2 | 7/2015 | Duda et al. |
| 9,101,323 B2 | 8/2015 | Einarsson et al. |
| 9,144,528 B2 | 9/2015 | Agrawal et al. |
| 9,149,370 B2 | 10/2015 | Herr et al. |
| 9,195,794 B2 | 11/2015 | Dariush |
| 9,198,821 B2 | 12/2015 | Unluhisarcikli et al. |
| 9,221,177 B2 | 12/2015 | Herr et al. |
| 9,227,108 B1 | 1/2016 | Chuang |
| 9,228,822 B2 | 1/2016 | Majidi et al. |
| 9,231,186 B2 | 1/2016 | Büsgen et al. |
| 9,266,233 B2 | 2/2016 | Kornbluh et al. |
| 9,333,097 B2 | 5/2016 | Herr et al. |
| 9,351,900 B2 | 5/2016 | Walsh et al. |
| 9,387,096 B2 | 7/2016 | Sverrisson et al. |
| 9,403,272 B2 | 8/2016 | Kornbluh et al. |
| 9,427,864 B2 | 8/2016 | Kornbluh et al. |
| 10,028,881 B2 | 7/2018 | Yamamoto et al. |
| 10,115,319 B2 | 10/2018 | Walsh et al. |
| 10,278,883 B2 | 5/2019 | Walsh et al. |
| 10,427,293 B2 | 10/2019 | Asbeck et al. |
| 10,434,030 B2 | 10/2019 | Asbeck et al. |
| 2001/0007845 A1 | 7/2001 | Afanasenko et al. |
| 2003/0009120 A1 | 1/2003 | MacAllister |
| 2003/0030397 A1 | 2/2003 | Simmons |
| 2003/0064869 A1 | 4/2003 | Reinkensmeyer et al. |
| 2003/0092545 A1 | 5/2003 | Koscielny et al. |
| 2003/0096310 A1 | 5/2003 | Hansen et al. |
| 2003/0120183 A1 | 6/2003 | Simmons |
| 2003/0125781 A1 | 7/2003 | Dohno et al. |
| 2004/0043879 A1 | 3/2004 | Huang |
| 2004/0064195 A1 | 4/2004 | Herr |
| 2004/0087418 A1 | 5/2004 | Eldridge |
| 2004/0106881 A1 | 6/2004 | McBean et al. |
| 2004/0116260 A1 | 6/2004 | Drennan |
| 2004/0147378 A1 | 7/2004 | Conklin et al. |
| 2004/0191321 A1 | 9/2004 | Guan et al. |
| 2004/0204294 A2 | 10/2004 | Wilkinson et al. |
| 2005/0010150 A1 | 1/2005 | Firsov |
| 2005/0049865 A1 | 3/2005 | Yaxin et al. |
| 2005/0070834 A1 | 3/2005 | Herr et al. |
| 2005/0101448 A1 | 5/2005 | He et al. |
| 2005/0107725 A1 | 5/2005 | Wild et al. |
| 2005/0157893 A1 | 7/2005 | Pelrine et al. |
| 2005/0184878 A1 | 8/2005 | Grold et al. |
| 2005/0288157 A1 | 12/2005 | Santos-Munne et al. |
| 2006/0079817 A1 | 4/2006 | Dewald et al. |
| 2006/0108755 A1 | 5/2006 | Smyler et al. |
| 2006/0136206 A1 | 6/2006 | Ariu et al. |
| 2006/0192465 A1 | 8/2006 | Kornbluh et al. |
| 2006/0249315 A1 | 11/2006 | Herr et al. |
| 2007/0004570 A1 | 1/2007 | Afanasenko et al. |
| 2007/0004571 A1 | 1/2007 | Gonzalez |
| 2007/0066918 A1 | 3/2007 | Dewald et al. |
| 2007/0111868 A1 | 5/2007 | Fujii et al. |
| 2007/0123997 A1 | 5/2007 | Herr et al. |
| 2007/0135279 A1 | 6/2007 | Purdy et al. |
| 2007/0276270 A1 | 11/2007 | Tran |
| 2008/0000317 A1 | 1/2008 | Patton et al. |
| 2008/0039756 A1 | 2/2008 | Thorsteinsson et al. |
| 2008/0062589 A1 | 3/2008 | Drabing |
| 2008/0071386 A1 | 3/2008 | McBean et al. |
| 2008/0075930 A1 | 3/2008 | Kornbluh et al. |
| 2008/0097269 A1 | 4/2008 | Weinberg et al. |
| 2008/0156363 A1 | 7/2008 | Ikeuchi et al. |
| 2008/0173365 A1 | 7/2008 | Unger et al. |
| 2008/0218132 A1 | 9/2008 | Pelrine et al. |
| 2008/0224564 A1 | 9/2008 | Pelrine et al. |
| 2008/0255488 A1 | 10/2008 | Agrawal et al. |
| 2008/0289952 A1 | 11/2008 | Pelrine et al. |
| 2008/0294019 A1 | 11/2008 | Tran |
| 2008/0300118 A1 | 12/2008 | Wehrell |
| 2009/0042702 A1 | 2/2009 | Toronto et al. |
| 2009/0221928 A1 | 9/2009 | Einav et al. |
| 2009/0255531 A1 | 10/2009 | Johnson et al. |
| 2009/0256817 A1 | 10/2009 | Perlin et al. |
| 2009/0306548 A1 | 12/2009 | Bhugra et al. |
| 2009/0311190 A1* | 12/2009 | Gracias ............... A61B 6/032 424/9.3 |
| 2009/0319054 A1 | 12/2009 | Sankai |
| 2010/0000547 A1 | 1/2010 | Johnson et al. |
| 2010/0007240 A1 | 1/2010 | Kornbluh et al. |
| 2010/0024180 A1 | 2/2010 | Pei et al. |
| 2010/0026143 A1 | 2/2010 | Pelrine et al. |
| 2010/0030343 A1 | 2/2010 | Hansen et al. |
| 2010/0038983 A1 | 2/2010 | Bhugra et al. |
| 2010/0056966 A1 | 3/2010 | Toth |
| 2010/0144490 A1 | 6/2010 | Purdy et al. |
| 2010/0152630 A1 | 6/2010 | Matsuoka et al. |
| 2010/0185259 A1 | 7/2010 | Shiba et al. |
| 2010/0185301 A1 | 7/2010 | Hansen et al. |
| 2010/0204804 A1 | 8/2010 | Garrec |
| 2010/0271051 A1 | 10/2010 | Sankai et al. |
| 2010/0274364 A1 | 10/2010 | Pacanowsky et al. |
| 2010/0280628 A1 | 11/2010 | Sankai |
| 2010/0286796 A1 | 11/2010 | Clausen |
| 2010/0295417 A1* | 11/2010 | Wood ............... F03G 7/06 310/306 |
| 2010/0298834 A1 | 11/2010 | Hildebrandt |
| 2010/0319215 A1 | 12/2010 | Roser |
| 2010/0324698 A1 | 12/2010 | Sverrisson et al. |
| 2011/0004322 A1 | 1/2011 | Sankai |
| 2011/0009793 A1 | 1/2011 | Lucero et al. |
| 2011/0022349 A1 | 1/2011 | Kulach et al. |
| 2011/0025170 A1 | 2/2011 | Rosenthal et al. |
| 2011/0033835 A1 | 2/2011 | Endo et al. |
| 2011/0040216 A1 | 2/2011 | Herr et al. |
| 2011/0062948 A1 | 3/2011 | Arns, Jr. et al. |
| 2011/0071647 A1 | 3/2011 | Mahon |
| 2011/0093089 A1 | 4/2011 | Martin |
| 2011/0105966 A1 | 5/2011 | Kazerooni et al. |
| 2011/0150966 A1 | 6/2011 | Chen et al. |
| 2011/0152696 A1 | 6/2011 | Ryan |
| 2011/0154641 A1 | 6/2011 | Pelrine et al. |
| 2011/0155307 A1 | 6/2011 | Pelrine et al. |
| 2011/0174524 A1 | 7/2011 | Sharma et al. |

(56) References Cited

U.S. PATENT DOCUMENTS

| | | |
|---|---|---|
| 2011/0193362 A1 | 8/2011 | Prahlad et al. |
| 2011/0201978 A1 | 8/2011 | Jeon et al. |
| 2011/0209337 A1 | 9/2011 | Pei et al. |
| 2011/0245738 A1 | 10/2011 | Agrawal et al. |
| 2011/0282255 A1 | 11/2011 | Nace |
| 2011/0295384 A1 | 12/2011 | Herr et al. |
| 2011/0295385 A1 | 12/2011 | Herr et al. |
| 2011/0313331 A1 | 12/2011 | Dehez et al. |
| 2012/0019223 A1 | 1/2012 | Pelrine et al. |
| 2012/0023638 A1 | 2/2012 | Leicester |
| 2012/0056903 A1 | 3/2012 | Shinohara et al. |
| 2012/0071797 A1 | 3/2012 | Aoki et al. |
| 2012/0100286 A1 | 4/2012 | Sharma et al. |
| 2012/0109031 A1 | 5/2012 | Vollbrecht |
| 2012/0120544 A1 | 5/2012 | Pelrine et al. |
| 2012/0128960 A1 | 5/2012 | Busgen et al. |
| 2012/0165709 A1 | 6/2012 | Goffer et al. |
| 2012/0169184 A1 | 7/2012 | Pelrine et al. |
| 2012/0177934 A1 | 7/2012 | Vogel et al. |
| 2012/0179075 A1 | 7/2012 | Perry et al. |
| 2012/0181896 A1 | 7/2012 | Kornbluh et al. |
| 2012/0185052 A1 | 7/2012 | Lefeber |
| 2012/0209152 A1 | 8/2012 | Cordo |
| 2012/0216672 A1* | 8/2012 | Menon ............... B25J 9/142 92/90 |
| 2012/0238914 A1 | 9/2012 | Goldfield et al. |
| 2012/0248942 A1 | 10/2012 | Biggs et al. |
| 2012/0253234 A1 | 10/2012 | Yang et al. |
| 2012/0271207 A1 | 10/2012 | Schoen et al. |
| 2012/0279175 A1 | 11/2012 | Biggs et al. |
| 2012/0289870 A1 | 11/2012 | Hsiao-Wecksler et al. |
| 2012/0330198 A1 | 12/2012 | Patoglu |
| 2013/0013085 A1 | 1/2013 | Smith et al. |
| 2013/0019749 A1 | 1/2013 | Hufton et al. |
| 2013/0040783 A1 | 2/2013 | Duda et al. |
| 2013/0041617 A1 | 2/2013 | Pease et al. |
| 2013/0045530 A1 | 2/2013 | Gracias et al. |
| 2013/0058001 A1 | 3/2013 | Prahlad et al. |
| 2013/0079686 A1 | 3/2013 | Sessions |
| 2013/0093439 A1 | 4/2013 | Ulmen et al. |
| 2013/0102935 A1 | 4/2013 | Kazerooni et al. |
| 2013/0123672 A1 | 5/2013 | Goffer et al. |
| 2013/0130866 A1 | 5/2013 | Wehrell |
| 2013/0131555 A1 | 5/2013 | Hook |
| 2013/0158444 A1 | 6/2013 | Herr et al. |
| 2013/0165817 A1 | 6/2013 | Horst et al. |
| 2013/0179154 A1 | 7/2013 | Okuno |
| 2013/0186699 A1 | 7/2013 | Prahlad et al. |
| 2013/0211295 A1 | 8/2013 | Johnson et al. |
| 2013/0225371 A1 | 8/2013 | Harrer et al. |
| 2013/0226048 A1 | 8/2013 | Unluhisarcikli et al. |
| 2013/0230667 A1 | 9/2013 | Sharma et al. |
| 2013/0237884 A1 | 9/2013 | Kazerooni et al. |
| 2013/0245512 A1 | 9/2013 | Goffer et al. |
| 2013/0253385 A1 | 9/2013 | Goffer et al. |
| 2013/0261513 A1 | 10/2013 | Goffer et al. |
| 2013/0261766 A1 | 10/2013 | Langlois et al. |
| 2013/0268256 A1 | 10/2013 | Dariush |
| 2013/0274640 A1 | 10/2013 | Butters et al. |
| 2013/0288863 A1 | 10/2013 | Yamamoto et al. |
| 2013/0289452 A1 | 10/2013 | Smith et al. |
| 2013/0296746 A1 | 11/2013 | Herr et al. |
| 2013/0307370 A1 | 11/2013 | Jenninger et al. |
| 2013/0310979 A1 | 11/2013 | Herr et al. |
| 2013/0312541 A1 | 11/2013 | Majidi et al. |
| 2013/0328440 A1 | 12/2013 | Kornbluh et al. |
| 2014/0046455 A1 | 2/2014 | Herr et al. |
| 2014/0194781 A1 | 7/2014 | Einarsson et al. |
| 2014/0202628 A1* | 7/2014 | Sreetharan .......... B32B 37/0076 156/257 |
| 2014/0213951 A1 | 7/2014 | Pietrusinki et al. |
| 2014/0277739 A1 | 9/2014 | Kornbluh et al. |
| 2014/0358040 A1 | 12/2014 | Kim et al. |
| 2015/0099945 A1 | 4/2015 | Hawkins, III et al. |
| 2015/0142130 A1 | 5/2015 | Goldfarb et al. |
| 2015/0173993 A1 | 6/2015 | Walsh et al. |
| 2015/0266180 A1 | 9/2015 | Kornbluh et al. |
| 2015/0266181 A1 | 9/2015 | Kornbluh et al. |
| 2015/0297934 A1 | 10/2015 | Agrawal et al. |
| 2015/0298765 A1 | 10/2015 | Golden, Jr. |
| 2015/0321339 A1 | 11/2015 | Asbeck et al. |
| 2015/0321399 A1 | 11/2015 | Hong et al. |
| 2016/0346156 A1 | 1/2016 | Walsh et al. |
| 2016/0101516 A1 | 4/2016 | Kornbluh et al. |
| 2016/0101517 A1 | 4/2016 | Kornbluh et al. |
| 2016/0107309 A1 | 4/2016 | Walsh et al. |
| 2016/0220438 A1 | 8/2016 | Walsh et al. |
| 2016/0278948 A1 | 9/2016 | Piercy et al. |
| 2016/0284231 A1 | 9/2016 | Walsh et al. |
| 2017/0027735 A1 | 2/2017 | Walsh et al. |
| 2017/0163435 A1 | 6/2017 | Ehsani et al. |
| 2017/0176167 A1 | 6/2017 | Keller et al. |
| 2017/0202724 A1 | 7/2017 | De Rossi et al. |
| 2018/0008502 A1 | 1/2018 | Asbeck et al. |
| 2018/0056104 A1 | 3/2018 | Cromie et al. |
| 2018/0354120 A1* | 12/2018 | Diller ..................... H01F 1/083 |
| 2018/0370020 A1 | 12/2018 | Murakami et al. |
| 2019/0008714 A1 | 1/2019 | Murakami et al. |
| 2019/0021933 A1 | 1/2019 | Murakami et al. |
| 2019/0029912 A1 | 1/2019 | Murakami et al. |
| 2019/0060156 A1 | 2/2019 | Swift et al. |
| 2019/0060157 A1 | 2/2019 | Lamb et al. |
| 2019/0070062 A1 | 3/2019 | O'Donnell et al. |
| 2019/0077071 A1* | 3/2019 | Ware ..................... B29C 71/04 |
| 2019/0159662 A1* | 5/2019 | Papas ........................ A61B 1/07 |
| 2020/0079643 A1* | 3/2020 | Bartlett ............... B81C 1/00357 |
| 2020/0224784 A1* | 7/2020 | Hasan ..................... G02B 3/14 |

FOREIGN PATENT DOCUMENTS

| | | |
|---|---|---|
| CN | 101175456 A | 5/2008 |
| CN | 102327173 A | 1/2012 |
| CN | 202342034 U | 7/2012 |
| DE | 19944139 A1 | 4/2001 |
| EP | 0 016 268 A1 | 10/1980 |
| EP | 0 141 640 A1 | 5/1985 |
| EP | 0 302 148 A1 | 2/1989 |
| EP | 0 509 723 A1 | 10/1992 |
| EP | 1 260 201 A1 | 11/2002 |
| EP | 1 306 792 A2 | 5/2003 |
| EP | 1 324 403 A1 | 7/2003 |
| EP | 1 550 689 A1 | 7/2005 |
| EP | 1 589 059 A1 | 10/2005 |
| EP | 1 842 518 A1 | 10/2007 |
| EP | 2 226 053 A2 | 9/2010 |
| EP | 2 497 610 A1 | 9/2012 |
| EP | 2 548 543 A1 | 1/2013 |
| EP | 2 649 976 A1 | 10/2013 |
| JP | H07-163607 A | 6/1995 |
| JP | 2002-301124 A | 10/2002 |
| JP | 2005-000500 A | 1/2005 |
| JP | 2007-000391 A | 1/2007 |
| JP | 2008-067762 A | 3/2008 |
| JP | 4345025 B2 | 10/2009 |
| JP | 2010-042069 A | 2/2010 |
| JP | 2010-051416 A | 3/2010 |
| JP | 4424269 B2 | 3/2010 |
| JP | 2010-075656 A | 4/2010 |
| JP | 4582523 B2 | 11/2010 |
| JP | 2011-036375 A | 2/2011 |
| JP | 4848260 B2 | 12/2011 |
| JP | 2012-192013 A | 10/2012 |
| JP | 2013-146328 A | 8/2013 |
| JP | 2013-208397 A | 10/2013 |
| JP | 2014-018536 A | 2/2014 |
| WO | WO 00/12041 A2 | 3/2000 |
| WO | WO 2004/017890 A1 | 3/2004 |
| WO | WO 2004/039292 A2 | 5/2004 |
| WO | WO 2004/047928 A2 | 6/2004 |
| WO | WO 2005/102208 A2 | 11/2005 |
| WO | WO 2011/008934 A2 | 1/2011 |
| WO | WO 2011/026086 A1 | 3/2011 |
| WO | WO 2011/030641 A1 | 3/2011 |
| WO | WO 2011/126985 A2 | 10/2011 |

(56) References Cited

FOREIGN PATENT DOCUMENTS

| | | |
|---|---|---|
| WO | WO 2012/014164 A2 | 2/2012 |
| WO | WO 2012/050938 A2 | 4/2012 |
| WO | WO 2012/103073 A2 | 8/2012 |
| WO | WO 2012/124328 A1 | 9/2012 |
| WO | WO 2012/178171 A2 | 12/2012 |
| WO | WO 2013/019749 A1 | 2/2013 |
| WO | WO 2013/033669 A2 | 3/2013 |
| WO | WO 2013/044226 A2 | 3/2013 |
| WO | WO 2013/049658 A1 | 4/2013 |
| WO | WO 2013/146231 A1 | 10/2013 |
| WO | WO 2014/034145 A1 | 3/2014 |
| WO | WO 2014/109799 A1 | 7/2014 |
| WO | WO 2014/194257 A1 | 12/2014 |
| WO | WO 2015/074070 A1 | 5/2015 |
| WO | WO 2015/088863 A2 | 6/2015 |
| WO | WO 2015/120186 A1 | 8/2015 |
| WO | WO 2015/157731 A1 | 10/2015 |
| WO | WO 2016/044251 A1 | 3/2016 |
| WO | WO 2016/089466 A2 | 6/2016 |
| WO | WO 2017/040669 A1 | 3/2017 |
| WO | WO 2017/160751 A1 | 9/2017 |
| WO | WO 2018/017436 A1 | 1/2018 |

OTHER PUBLICATIONS

U.S. Appl. No. 15/097,744, filed Apr. 13, 2016, Asbeck et al.
U.S. Appl. No. 15/102,694, filed Mar. 31, 2017, De Rossi et al.
U.S. Appl. No. 14/893,934, filed Nov. 24, 2015, Walsh et al.
U.S. Appl. No. 16/538,746, filed Aug. 12, 2019, Asbeck et al.
U.S. Appl. No. 16/317,845, filed Jan. 15, 2019, Ding et al.
U.S. Appl. No. 15/302,347, filed Oct. 6, 2016, Walsh et al.
U.S. Appl. No. 16/084,377, filed Sep. 12, 2018, O'Donnell et al.
PCT/US2013/060225, May 27, 2014, International Search Report and Written Opinion.
PCT/US2019/033143, Oct. 9, 2019, International Search Report and Written Opinion.
PCT/US2014/068462, May 22, 2015, International Search Report and Written Opinion.
PCT/US2014/040340, Oct. 31, 2014, International Search Report and Written Opinion.
PCT/US2015/051107, Aug. 5, 2016, International Search Report and Written Opinion.
PCT/US2017/042286, Sep. 28, 2017, International Search Report and Written Opinion.
PCT/US2018/022494, Jun. 8, 2018, International Search Report and Written Opinion.
PCT/US2015/014672, Jul. 6, 2015, International Search Report and Written Opinion.
PCT/US2015/025472, Sep. 4, 2015, International Search Report and Written Opinion.
PCT/US2017/022150, Jun. 9, 2017, International Search Report and Written Opinion.
International Search Report for International Application No. PCT/EP2003/012123, dated Jun. 22, 2004.
International Search Report and Written Opinion in International Application No. PCT/US2016/049706, dated Nov. 29, 2016.
International Search Report and Written Opinion for International Application No. PCT/US2013/060225, dated May 27, 2014.
International Search Report and Written Opinion for International Application No. PCT/US2019/033143, dated Oct. 9, 2019.
International Search Report and Written Opinion for International Application No. PCT/US2014/068462, dated May 22, 2015.
International Search Report and Written Opinion for International Application No. PCT/US2014/040340, dated Oct. 31, 2014.
International Search Report and Written Opinion in International Application No. PCT/US2015/051107, dated Aug. 5, 2016.
International Search Report and Written Opinion for International Application No. PCT/US2017/042286, dated Sep. 28, 2017.
International Search Report and Written Opinion for International Application No. PCT/US2018/022494, dated Jun. 8, 2018.
International Search Report and Written Opinion for International Application No. PCT/US2015/014672, dated Jul. 6, 2015.
International Search Report and Written Opinion for International Application No. PCT/US2015/025472, dated Sep. 4, 2015.
International Search Report and Written Opinion in International Application No. PCT/US2017/022150, dated Jun. 9, 2017.
[No Author Listed], Development of a strategic Master Plan for the transformation of the traditional textile and clothing into a knowledge driven industrial sector by 2015; Report on Intelligent Textiles; State of the art. Clevertex. dated prior to Jul. 2014; 160 pages.
Bae et al, A Soft Exosuit for Patients with Stroke: Feasibility study with a mobile off-board actuation unit. 2015 IEEE International Conference on Rehabilitation Robotics (ICORR). Aug. 11, 2015 ; 131-8.
Banala et al., Active leg exoskeleton (alex) for gait rehabilitation of motor-impaired patients. Proc. In 2007 IEEE 10th Int. Conf. Rehabil. Robotics. Jun. 13, 2007; 401-7.
Browning et al., The effects of adding mass to the legs on the energetics and biomechanics of waling. Medicine and science in sports and exercise. Mar. 1, 2007; 39(3): 515-25.
Cho et al, Eds., Smart Clothing Technology and Applications. Human Factors and Ergonomics. CRC Press. 2010; 290 pages.
Chu et al., On the biomimetic design of the Berkeley lower extremity exoskeleton (BLEEX). In IEEE Int. Conf. Robotics and Automation (ICRA). Barcelona, Spain. Apr. 2005 ; 4345-52.
Collins et al., Efficient Bipedal Robots Based on Passive-Dynamic Walkers. Science, Feb. 2005; 307(5712): 1082-1085.
Cool, Biomechanics of orthoses for the subluxed shoulder. Prosthetics & Orthotics International. Jan. 1, 1989;13(2):90-6.
Da Silva et al., FBG Sensing Glove for Monitoring Hand Posture. Sensors Journal. Apr. 5, 2011; 11(10): 2442-8. [Online]. Available: http://ieeexplore.ieee.org/xpls/absall.jsp?arnumber=5742669.
De Rossi et al., Wearable technology for biomechanics: e-textile or micromechanical sensors? IEEE engineering in medicine and biology magazine. May-Jun. 2010; 29(3): 37-43. [Online]. Available:http://www.ncbi.nlm.nih.gov/pubmed/20659856.
Delp et al., OpenSim: open-source software to create and analyze dynamic simulations of movement. IEEE transactions on biomedical engineering. Oct. 22, 2007; 54(11): 1940-50. [Online]. Available: http://www.ncbi.nlm.nih.gov/pubmed/18018689.
Dollar et al., Lower extremity exoskeletons and active orthoses: Challenges and state-of-the-art. Robotics, IEEE Transactions on Robotics. Feb. 25, 2008; 24(1): 144-58.
Erk et al., Strain stiffening in synthetic and biopolymer networks. Biomacromolecules. Apr. 14, 2010; 11(5): 1358-63.
Farris et al., Human medial gastrocnemius force-velocity behavior shifts with locomotion speed and gait. Proc Natl Acad. Sci U S A. Jan. 17, 2012;109(3):977-982.
Ferris et al., A Physiologist's Perspective on Robotic Exoskeletons for Human Locomotion. Int J HR. Sep. 4, 2007 4(3): 507-28.
Ferris et al., Robotic lower limb exoskeletons using proportional myoelectric control. In EMBC 2009, Annual International Conference of the IEEE Engineering in Medicine and Biology Society. Sep. 3, 2009; 2119-24.
Fonseca, Validation of two types of textile electrodes for electrocardiography and electromyography measurement applications. Dissertation submitted to Faculdade de Engenharia da Universidade do Porto. Jul. 2012; 126 pages.
Ghodsi et al., De novo Likelihood-based measures for comparing genome assemblies. In: BMC Research Noles. Dec. 2013; 6(1):334.—online retrieved on Oct. 25, 2016.
Gibbs et al., Wearable Conductive Fiber Sensors for Multi-Axis Human Joint Angle Measurements. Journal of NeuroEngineering and Rehabilitation. Dec. 2005;2(1):7.
Goodvin, Development of a Real-time Spinal Motion Inertial Measurement System for Vestibular Disorder Application. Thesis submitted to University of Victoria. 2003; 155 pages.
Gregorczyk et al., The effects of a lower body exoskeleton load carriage assistive device on oxygen consumption and kinematics during walking with loads. In 25th Army Sci. Conf., Florida, USA. Nov. 1, 2006.

(56) References Cited

OTHER PUBLICATIONS

Hallemans et al., 3D joint dynamics of walking in toddlers. A cross-sectional study spanning the first rapid development phase of walking. Gait & Posture. Oct. 1, 2005; 22(2):107-118.

Kadaba et al., Measurement of lower extremity kinematics during level walking. Journal of orthopaedic research : official publication of the Orthopaedic Research Society. May 1990; 8(3): 383-92. [Online]. Available: http://www.ncbi.nlm.nih.gov/pubmed/2324857.

Kawamoto et al., Power assist method for HAL-3 using EMG-based feedback controller. in Systems, Man and Cybernetics, 2003. IEEE International Conference on Oct. 8, 2003; 2:1648-53.

Kim et al., Epidermal electronics. Science. Aug. 12, 2011; 333(6044): 838-43. [Online]. Available: http://www.sciencemag.org/cgi/doi/10.1126/science.1206157.

Kramer et al., Soft curvature sensors for joint angle proprioception. In 2011 IEEE/RSJ International Conference on Intelligent Robots and Systems. Sep. 25, 2011; 1919-26. [Online]. Available:http://ieeexplore.ieee.org/lpdocs/epic03/wrapper.htm?arnumber=6094701.

Kramer et al., Wearable tactile keypad with stretchable artificial skin. 2011 IEEE International Conference on Robotics and Automation. May 9, 2011; 1103-7. [Online]. Available:http://ieeexplore.ieee.org/lpdocs/epic03/wrapper.htm?arnumber=5980082.

Kulyukin, Ed., Advances in Human-Robot Interaction. In-Teh. Dec. 2009; 354 pages.

Laughton et al., Effect of Strike Pattern and Orthotic Intervention on Tibial Shock During Running. Journal of Applied Biomechanics. May 1, 2003; 19(2): 153-68.

Lee et al., Biomimetic Approach Enables Functional Movements of Hand Post Stroke: A Pilot Study. Gait and Clinical Movement Analysis Society. 2012; 2 pages.

Lenhart et al., Increasing Running Step Rate Reduces Patellofemoral Joint Forces. Medicine & Science in Sports & Exercise. Mar. 2014; 46(3): 557-64.

Lieberman et al., Effects of stride frequency and foot position in landing on braking force, hip torque, impact peak force and the metabolic cost of running in humans. Journal of Experimental Biology. Nov. 1, 2015; 218(21):3406-14.

Lipomi et al., Skin-like pressure and strain sensors based on transparent elastic films of carbon nanotubes. Nature nanotechnology. Dec. 2011; 6(12): 788-92. [Online]. Available: http://www.ncbi.nlm.nih.gov/pubmed/22020121.

Majidi et al., A non-differential elastomer curvature sensor for softer-than-skin electronics. Smart Materials and Structures. Aug. 31, 2011; 20(10): 105017. [Online]. Available: http://stacks.iop.org/0964-1726/20/i=10/a=105017?key=crossref.0cca7e97d6ad7110bcdcaf45f30f3b60.

Malcolm et al., Fast Exoskeleton Optimization. Science. Jun. 23, 2017; 356(6344): 1230-1.

Mattila, Ed., Intelligent textiles and clothing. Woodhead Publishing Limited. 2006; 525 pages.

Mcgeer, Passive Bipedal Running. Proceedings of the Royal Society of London. Series B, Biological Sciences. May 22, 1990; 240(1297): 107-134.

Newman et al., Astronauth Bio-Suit System to enable planetary exploration. In International Astronautical Conference. Vancouver, Canada. Oct. 2004.

Park et al., Active Modular Elastomer Sleeve for Soft Wearable Assistance Robots, 2012 IEEE/RSJ International Con. on Intelligent Robots and Systems. Vilamoura, Algarve, Portugal. Oct. 7, 2012; 1595-1602.

Park et al., Bio-inspired Active Soft Orthotic Device for Ankle Foot Pathologies. 2011 IEEE/RSJ International Conference on Intelligent Robots and Systems. San Francisco, CA, USA. Sep. 25, 2011; 4488-95.

Park et al., Design and Fabrication of Soft Artificial Skin Using Embedded Microchannels and Liquid Conductors. IEEE Sensors Journal. May 22, 2012; 12(8): 2711-8. [Online]. Available:http://ieeexplore.ieee.org/lpdocs/epic03/wrapper.htm?arnumber=6203551.

Park et al., Hyperelastic pressure sensing with a liquid-embedded elastomer. Journal of Micromechanics and Microengineering. Nov. 29, 2010; 20(12): 125029. [Online]. Available: http://stacks.iop.org/0960-1317/20/i=12/a=125029?key=crossref.84cffc44789-ba7bde0bdfd169e25af91.

Polonen et al., Automatic Intensity Quantification of Fluorescence Targets from microscope Images with Maximum Likelihood Estimation. 17th European Signal Processing Conference. Aug. 24, 2009; 1072-6.—retrieved online Oct. 25, 2016.

Pratt et al., The RoboKnee: An exoskeleton for enhancing strength and endurance during walking. in IEEE Int. Conf. Robotics and Automation (ICRA). New Orleans, USA. Apr. 26, 2004; 3: 2430-5.

Quintero et al., Control and Implementation of a Powered Lower Limb Orthosis to Aid Walking in Paraplegic Individuals. in IEEE International Conference on Rehabilitation Robotics. Jun. 29, 2011; 6 pages.

Ramuz et al., Transparent, Optical, Pressure-Sensitive Artificial Skin for Large-Area Stretchable Electronics. Advanced Materials. Jun. 26, 2012; 24(24):3223-7. [Online] Available:http://doi.wiley.com/10.1002/adma.201200523.

Reid et al., Biomechanical assessment of rucksack shoulder strap attachment location: effect on load distribution to the torso. RTO HFM Specialists Meeting on Soldier Mobility: Innovations in Load Carriage System Design and Evaluation. NATO-RTO Meeting Proceedings: MP-056 (Neuilly-sur Seine: NATO). Jun. 2000; 9 pages.

Royer et al., Manipulations of Leg Mass and Moment of Inertia: Effects on Energy Cost of Walking. Medicine & Science. in Sports & Exercise. Apr. 1, 2005; 37(4): 649-656.

Schiele, Ergonomics of Exoskeletons: Objective Performance Metrics. in Euro Haptics conference on Haptic Interfaces for Virtual Environmental Teleoperator Systems. Salt Lake City, UT, USA. Mar. 18, 2009: 103-8.

Scilingo et al., Strain-sensing fabrics for wearable kinaesthetic-like systems. IEEE Sensors Journal. Sep. 4, 2003; 3(4): 460-7. [Online]. Available: http://ieeexplore.ieee.org/lpdocs/epic03/wrapper.htm?arnumber=1226639.

Silva et al., Wireless Hydrotherapy Smart-Suit Network for Posture Monitoring. 2007 IEEE International Symposium on Industrial Electronics. Jun. 2007; 2713-7.

Sinclair et al., Determination of Gait Events Using an Externally Mounted Shank Accelerometer. Journal of Applied Biomechanics. Feb. 1, 2013; 29(1): 118-22.

Strauser et al., The development and testing of a human machine interface for a mobile medical exoskeleton. In IEEE Int Conf, Intelligent Robots and Systems. San. CA USA. Sep. 25, 2011 ; 4911-6.

Tesconi et al., Wearable sensorized system for analyzing the lower limb movement during rowing activity. 2007 IEEE International Symposium on Industrial Electronics. Jun. 4, 2007; 2793-6. [Online]. Available: http://ieeexplore.ieee.org/lpdocs/epic03/wrapper.htm?arnumber=4375052.

Tiwana et al., A review of tactile sensing technologies with applications in biomedical engineering. Sensors and Actuators A: Physical. Jun. 1, 2012; 179: 17-31. [Online]. Available:http://linkinghub.elsevier.com/retrieve/pii/S0924424712001641.

Vogt et al., Design and Characterization of a Soft Multi-Axis Force Sensor Using Embedded Microfluidic Channels. IEE Sensors Journal. Jul. 4, 2013; 13(10): 4056-64.

Walsh et al., Quasi-Passive Leg Exoskeleton for Load Carrying Augmentation. International Journal of Humanoid Robotics, Special Issue: Active Exoskeletons. Sep. 2007; 4(3): 487-506.

Wehner et al., Experimental characterization of components for active soft orthotics. in Submitted in Proc. IEEE Int. Conf. Biomed. Rob. Biomechatron. Roma, Italy. Jun. 24, 2012; 1586-92.

Wehner et al., Lower Extremity Exoskeleton Reduces Back Forces in Lifting. ASME Dynamic Systems and Control Conference. Hollywood, California, USA. Oct. 12, 2009; 49-56.

(56) References Cited

OTHER PUBLICATIONS

Wehner, Man to Machine, Applications in Electromyography. In: EMG Methods for Evaluation Muscle and Nerve Functions. Jan. 2012 Schwartz, Ed.. Chapter 22: 29 pages.

Woodman, An introduction to inertial navigation. University of Cambridge Computer Laboratory Technical Report UCAM-CL-TR-696. Aug. 2007; 37 pages.

Yamada et al., A stretchable carbon nanotube strain sensor for human-motion detection. Nature nanotechnology. May 2011; 6(5): 296-301. [Online] Available: http://www.ncbi.nlm.nih.gov/pubmed/21441912.

Zhang et al., Carbon nanotube polymer coatings for textile yarns with good strain sensing capability. Sensors and Actuators A: Physical. Jun. 2012; 179: 83-91. [Online]. Available:http://linkinghub.elsevier.com/retrieve/pii/S0924424712001938.

Zhang et al., Human-in-the-Loop Optimization of Exoskeleton Assistance During Walking. Science. Jun. 23, 2017; 356(6344): 1280-4.

Zoss et al., Biomechanical deign of the Berkeley lower extremity exoskeleton (BLEEX). Mechatronics, IEE/ASME Transactions on. Apr. 10, 2006; 11(2): 128-138.

\* cited by examiner

Pour and spin coat the elastomer on an SU8 patterned wafer

Thermal cure of the elastomer

Bonding of the GelPack-8 adhesive on the soft layer

Peel off the soft layer with the adhesive

Align and laser cut alignment holes and actuators shape

Oxygen plasma treatment

Oxygen plasma treatment on a laser cut layer without embossed features (blank)

Align and bond the soft layers with precision dowel pins

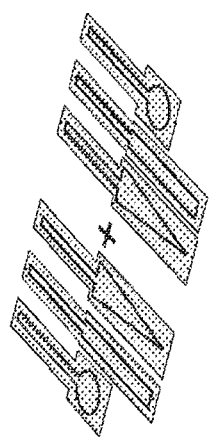
FIG. 1J Release of the actuators from the scrap material
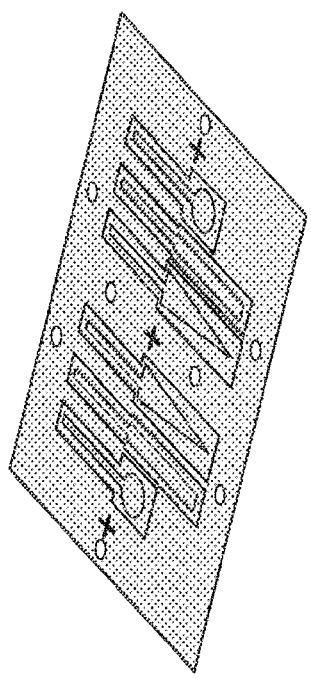
FIG. 1I Removal of GelPack adhesive support

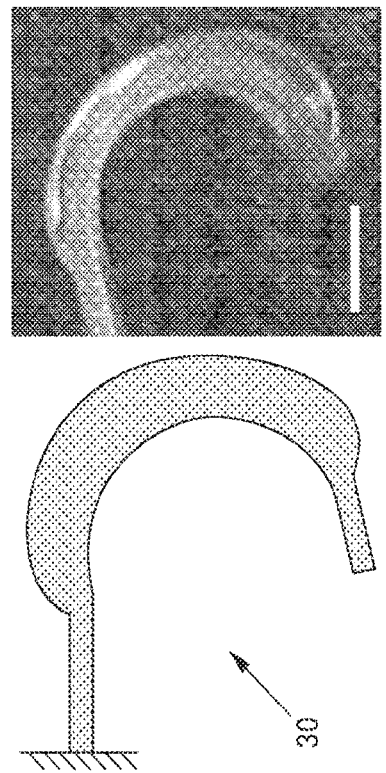
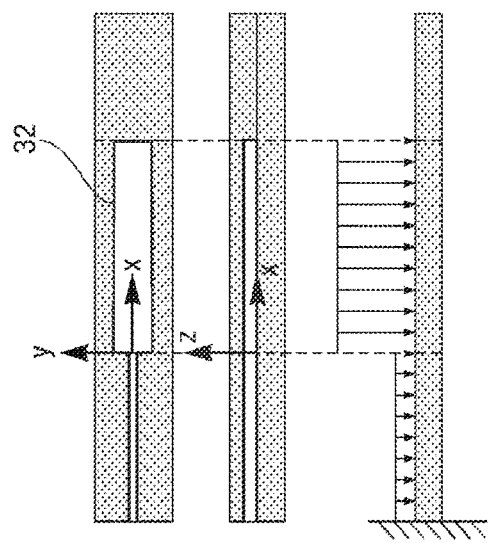
FIG. 2B
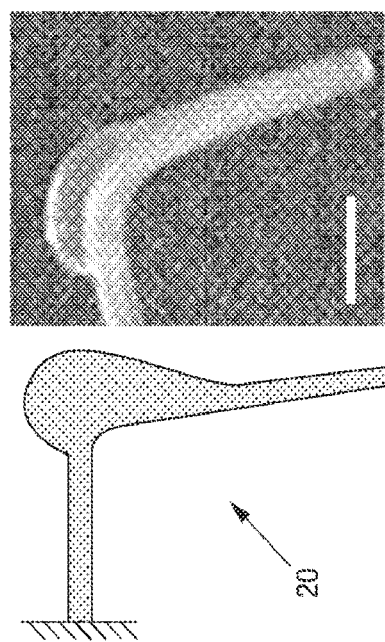
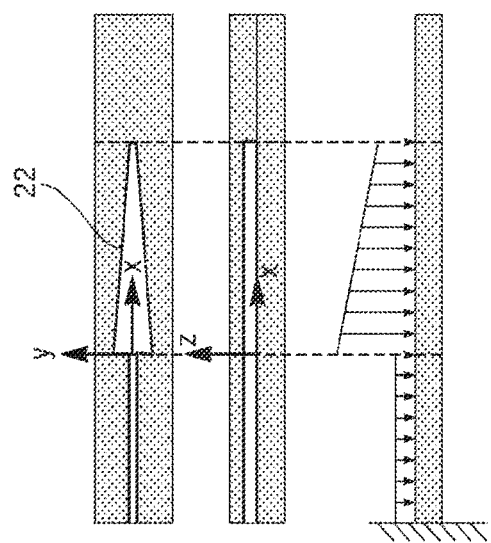
FIG. 2A

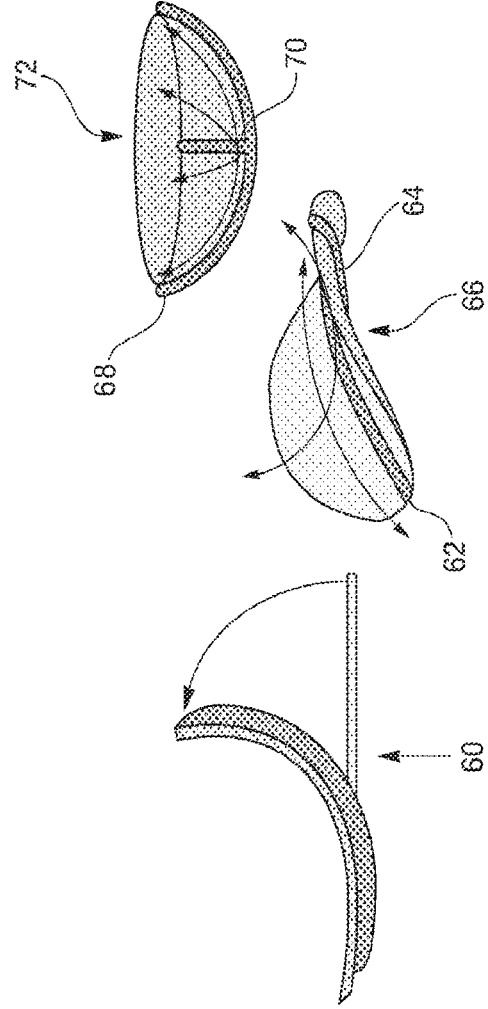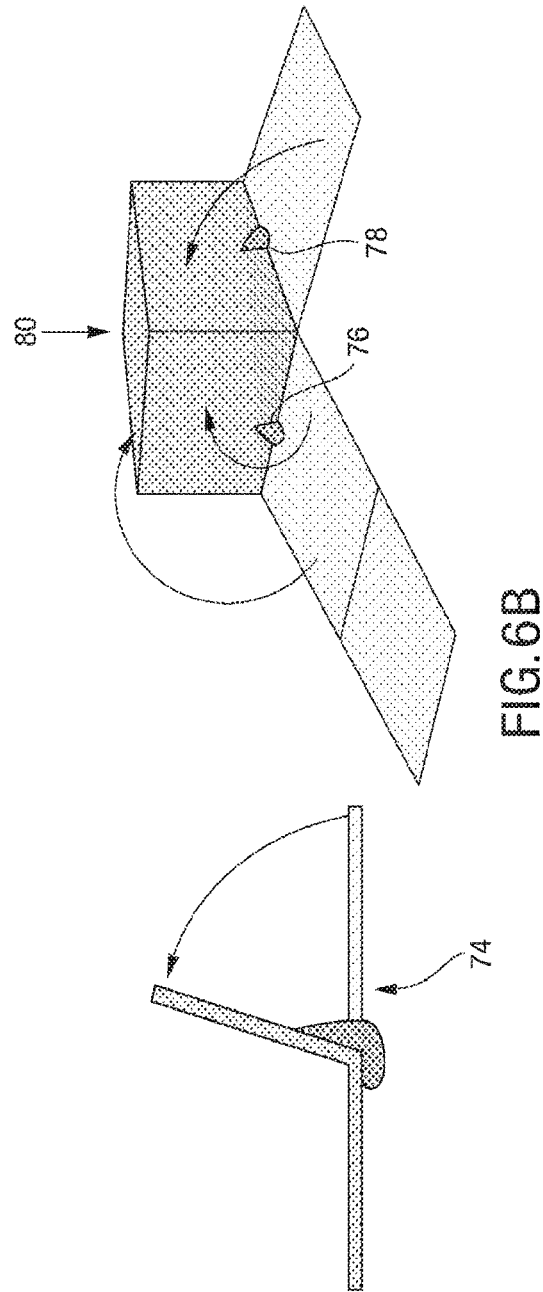
FIG.6A
FIG.6B

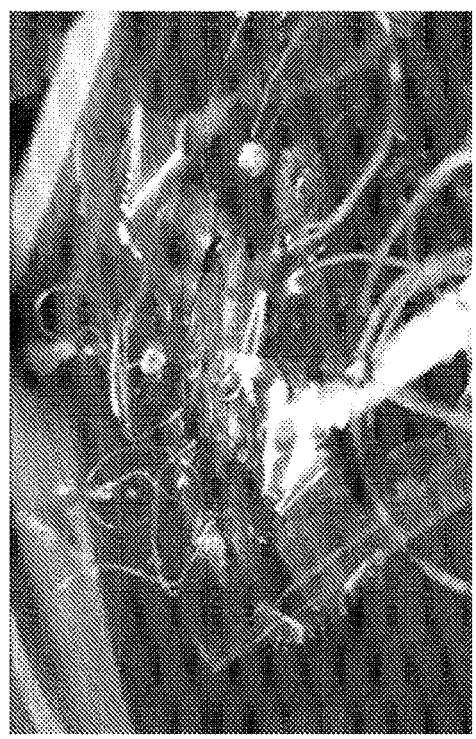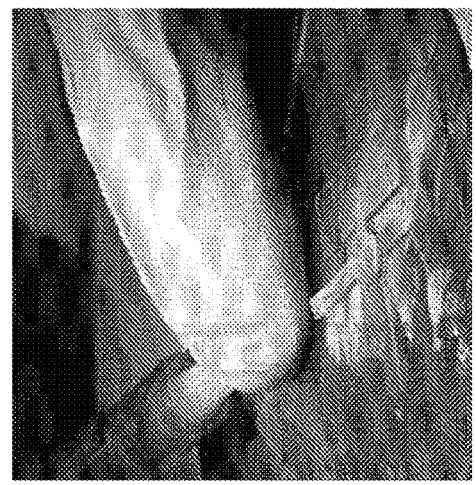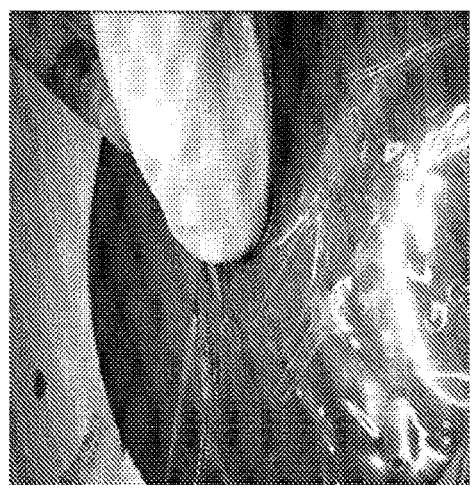
FIG. 14

FIG. 16

UV and temperature curable materials

| Fill Material | | | | | |
|---|---|---|---|---|---|
| Material | Density | Viscosity | Curing Process | Curing Details | Behavior (cured material) |
| Sartomer SR355 (90%) and Eascure KTO 46 (10%) | 1.01 g/cm3 (SR355) | 0.6 Pa s (SR355) | UV | 5000 – 1000 mJ/cm2 (2.5 – 5 seconds under small UV lamp) | Rigid, brittle |
| Dow Corning Sylgard 184 | 1.03 g/cm3 | 3.5 Pa s | Thermal | A few seconds on hotplate at 200°C | Solid, flexible |
| Wacker SilGel 613 | 0.97 g/cm3 | 0.15 Pa s | UV | | Sticky, tacky |
| Wacker Semicosil 912 | 0.97 g/cm3 | 1.00 Pa s | UV | | Sticky, tacky |

| Bulk Material | | | |
|---|---|---|---|
| Material | Young's modulus | Elongation at break | Durometer | Tensile strength |
| Dow Corning Sylgard 184 | ~2 MPa | 140% | 43 Shore A | 6.7 MPa |
| MED4-4220 | | 580% | 17 Shore A | 4.5 MPa |

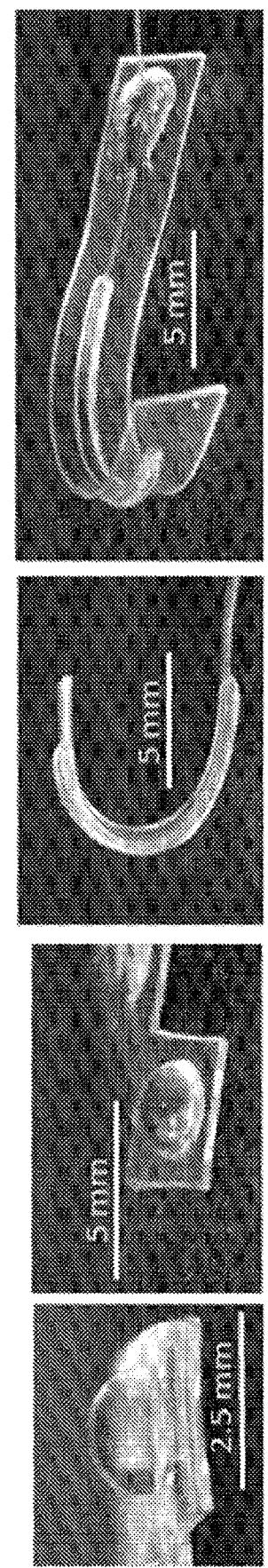

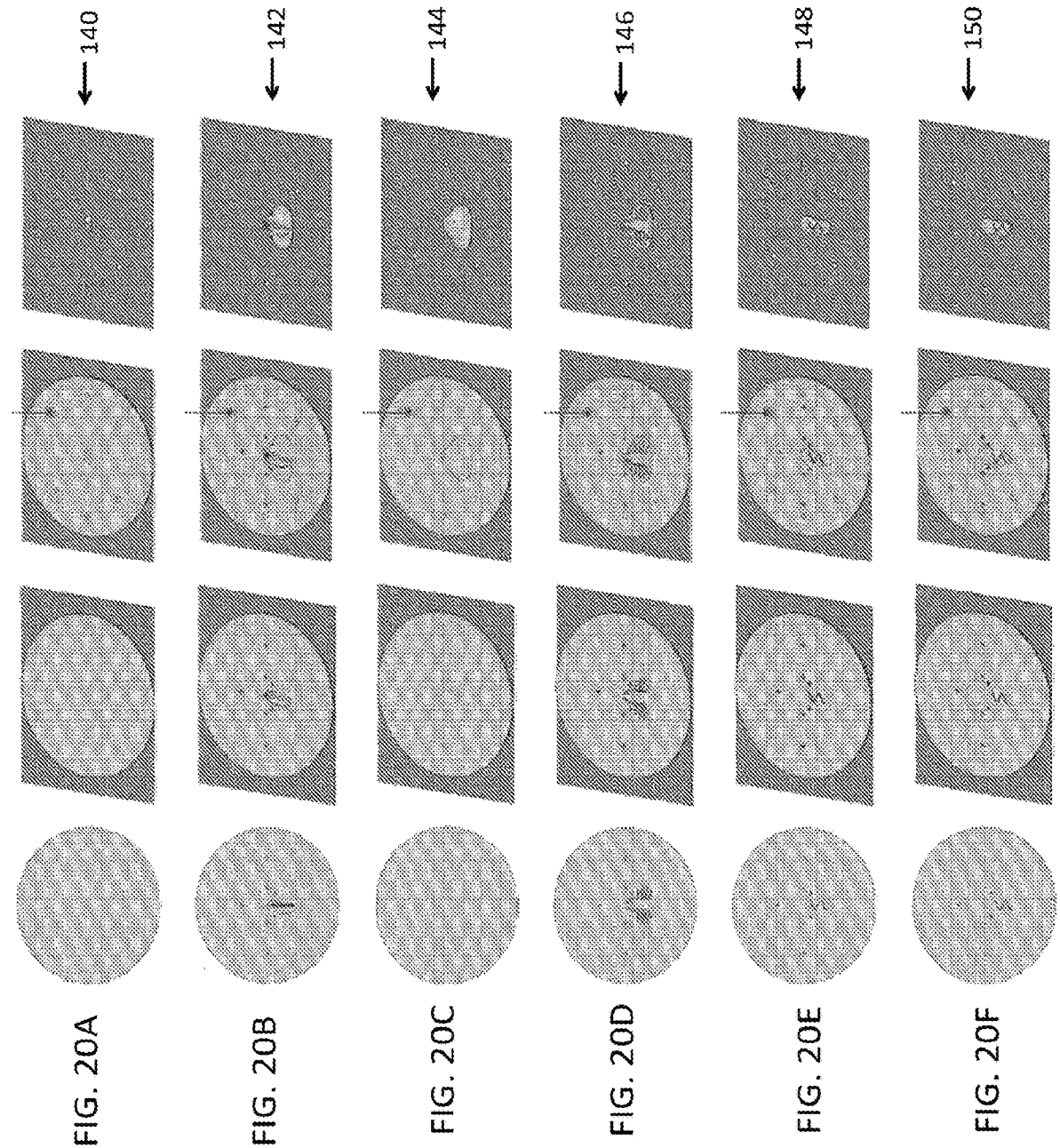

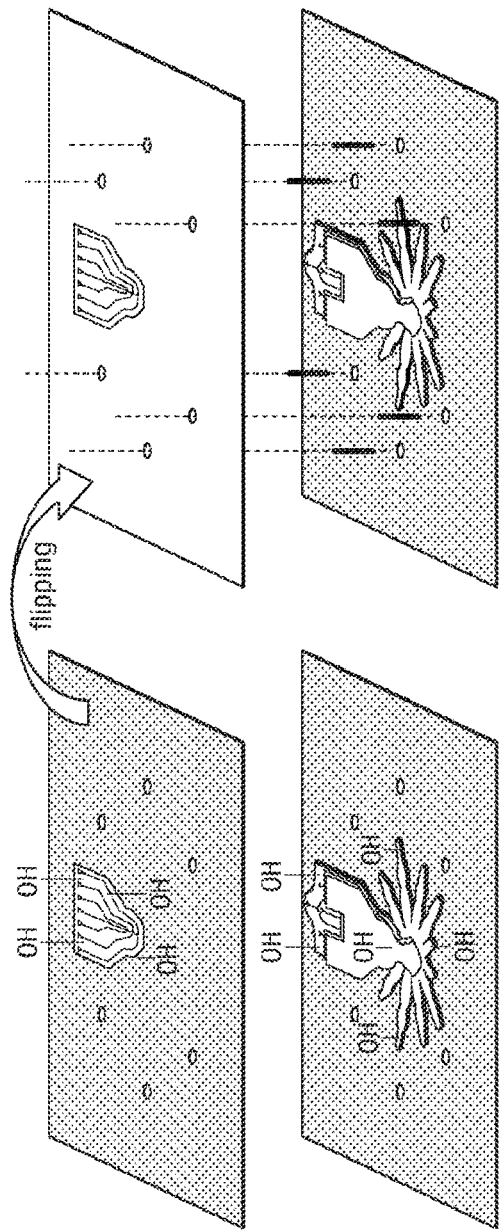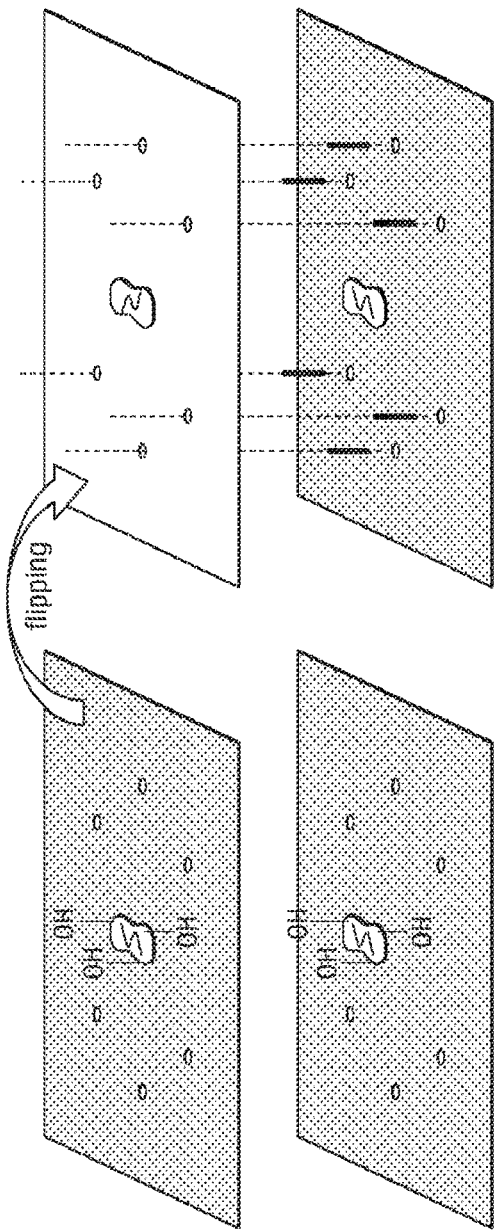

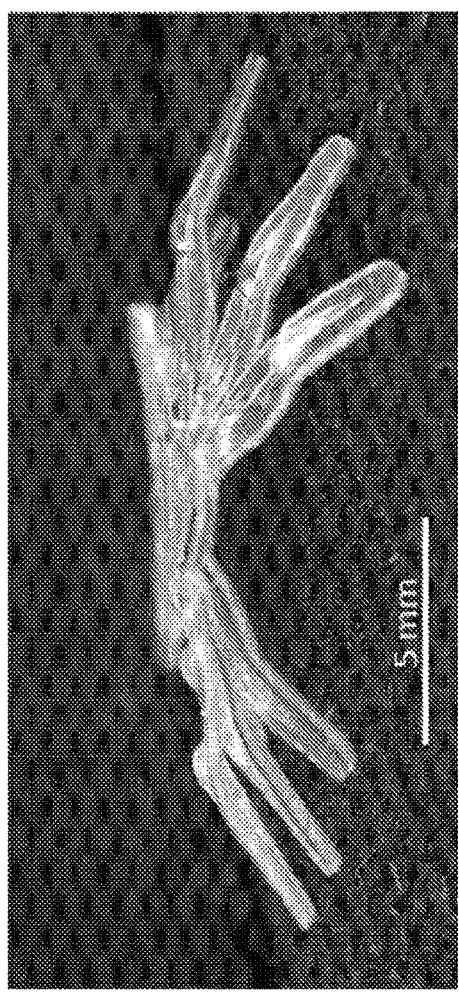
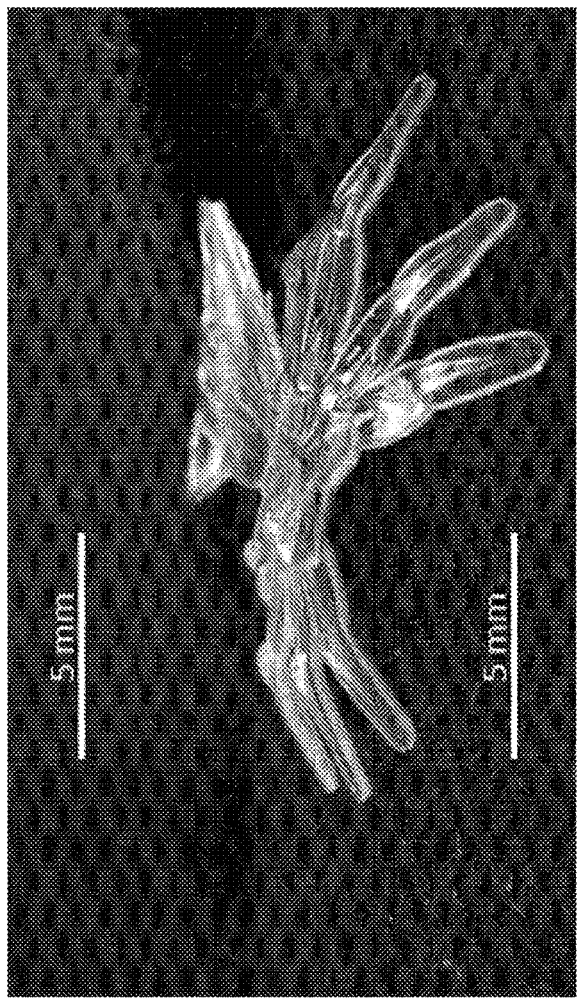
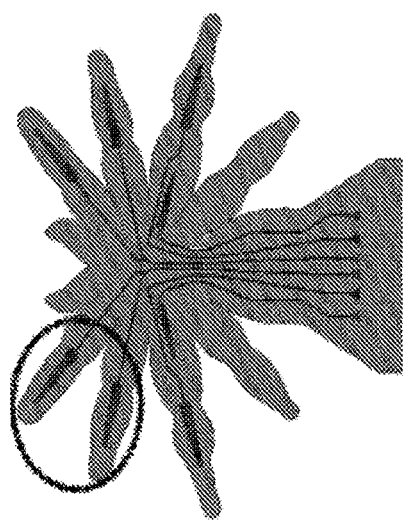
FIG. 26
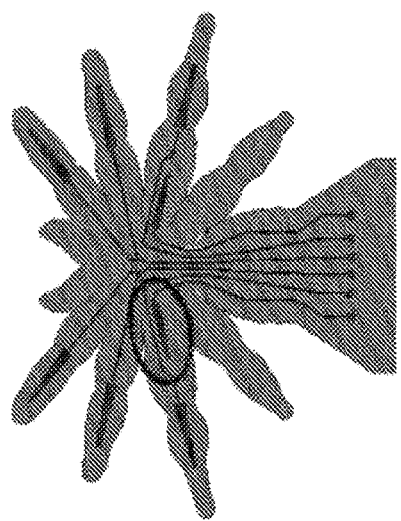
FIG. 27

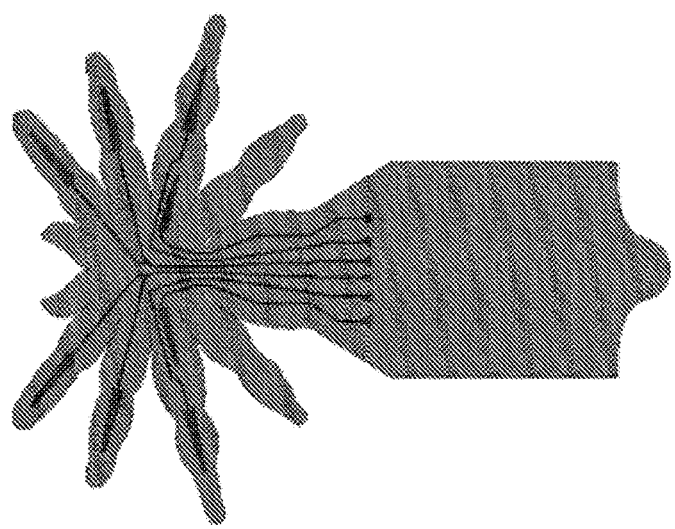
FIG. 29B
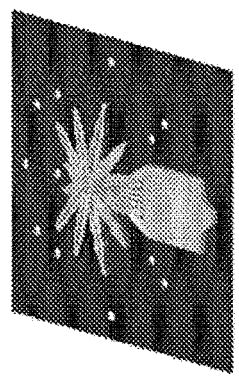
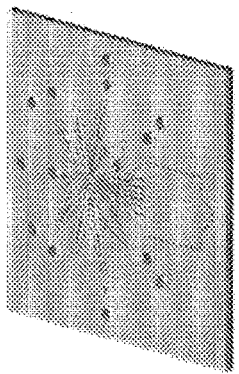
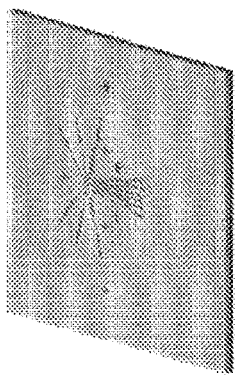
174
FIG. 29A

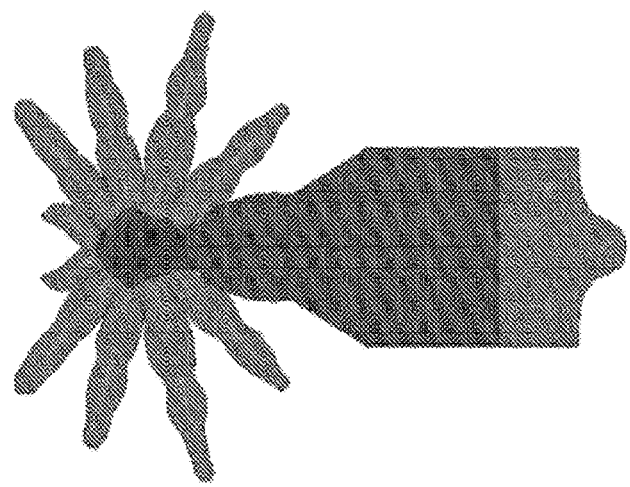
FIG. 34B
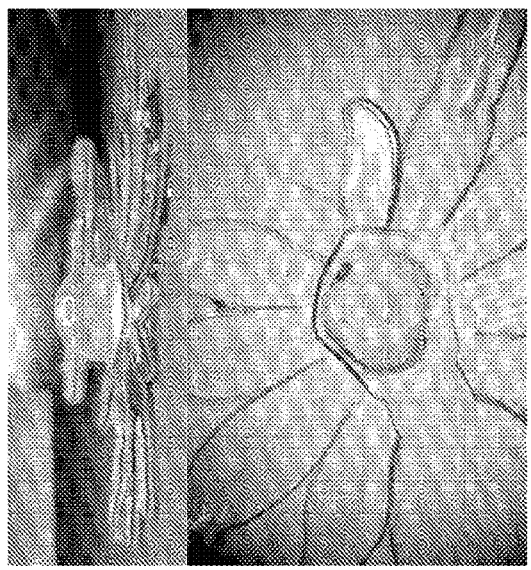
FIG. 33
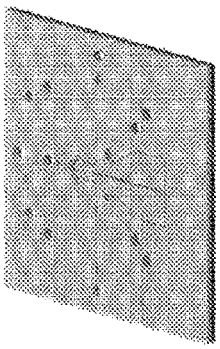
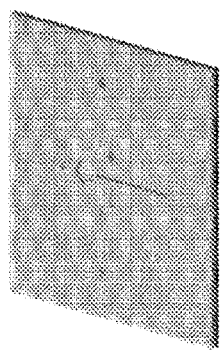
FIG. 34A

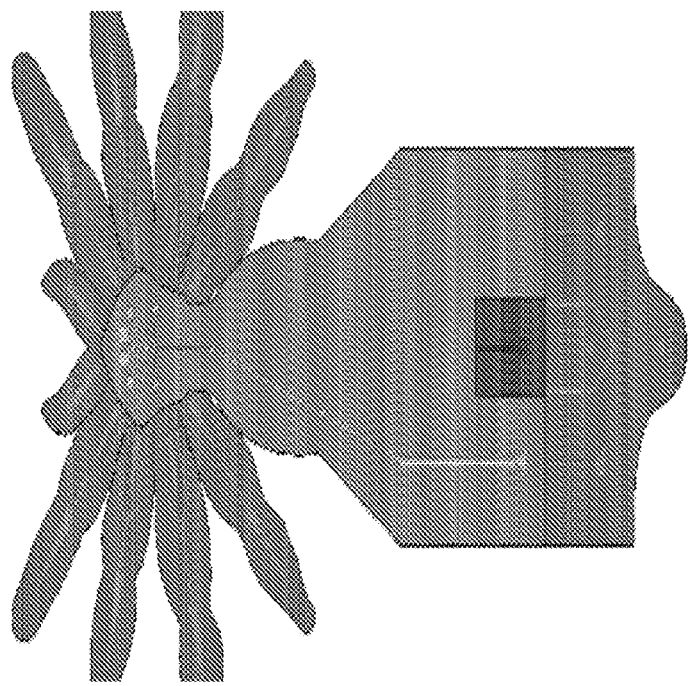
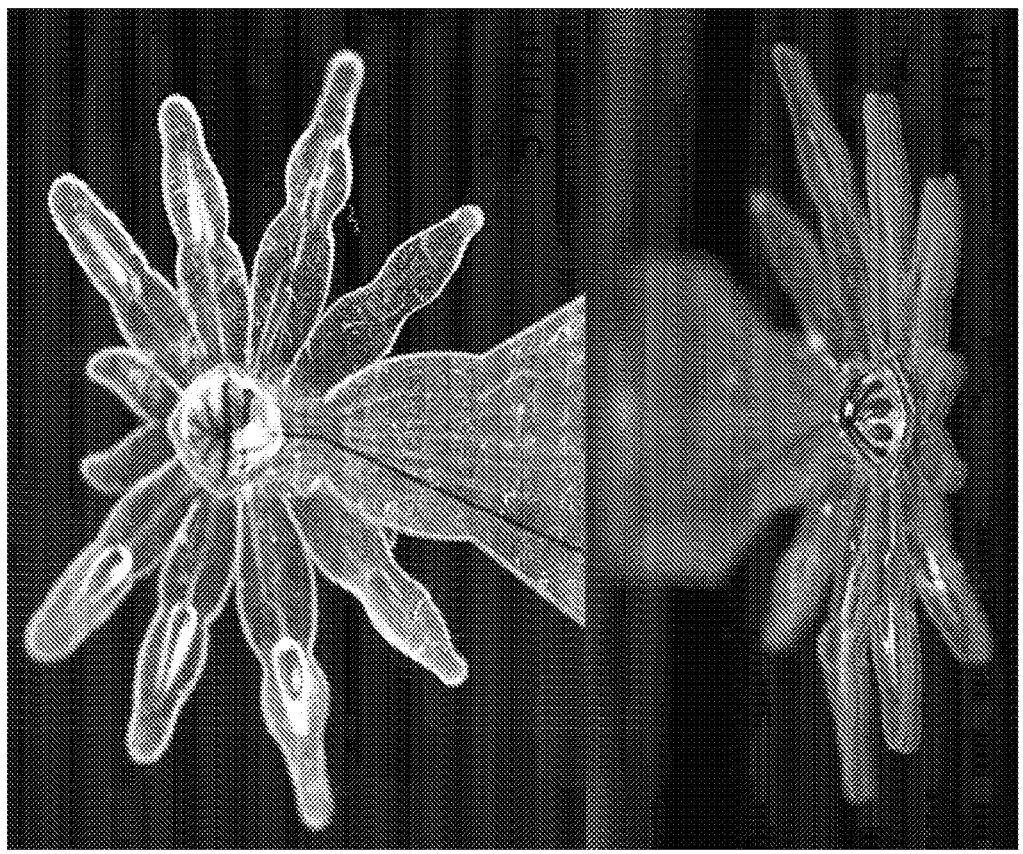
FIG. 36

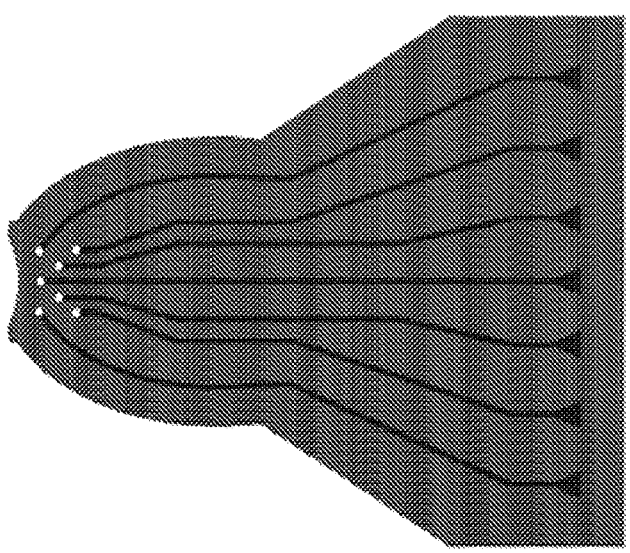
FIG. 39A
FIG. 39B

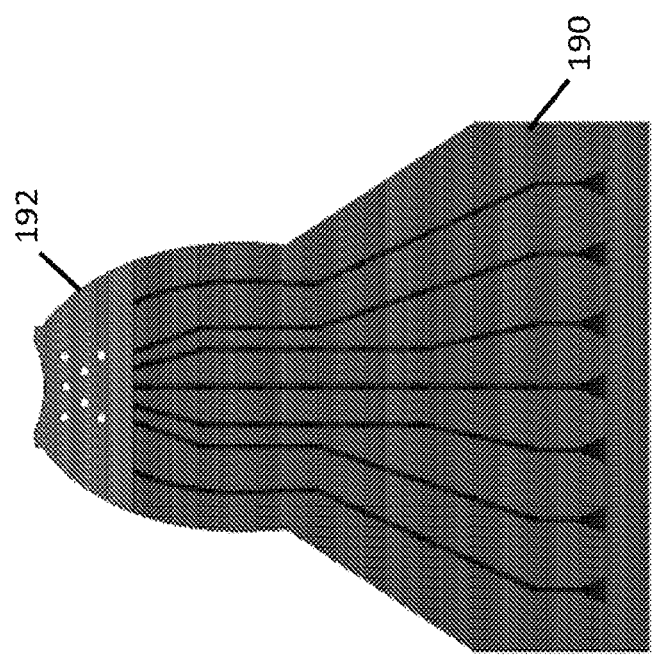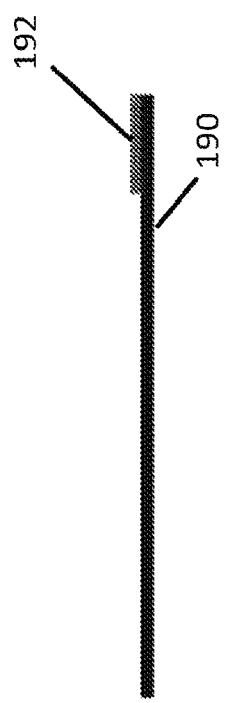
FIG. 40A
FIG. 40B

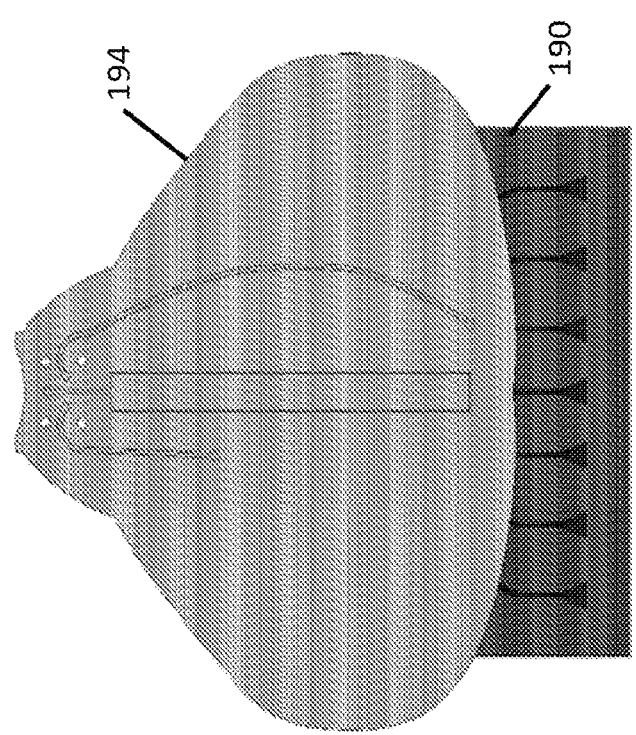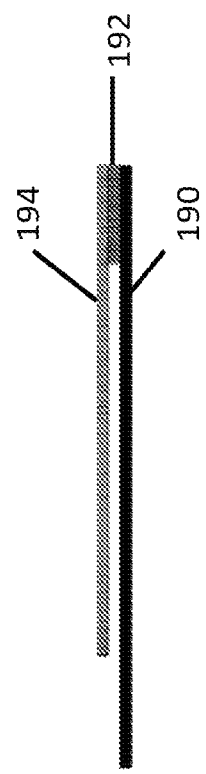
FIG. 41A
FIG. 41B

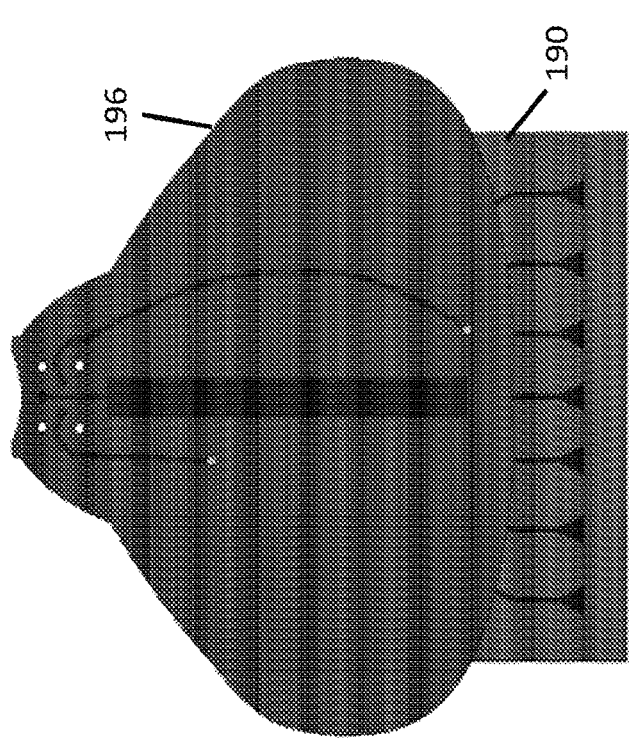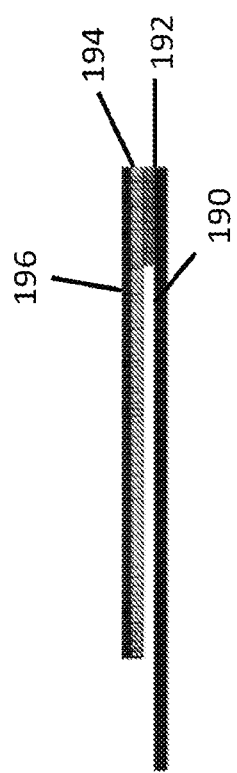
FIG. 42A
FIG. 42B

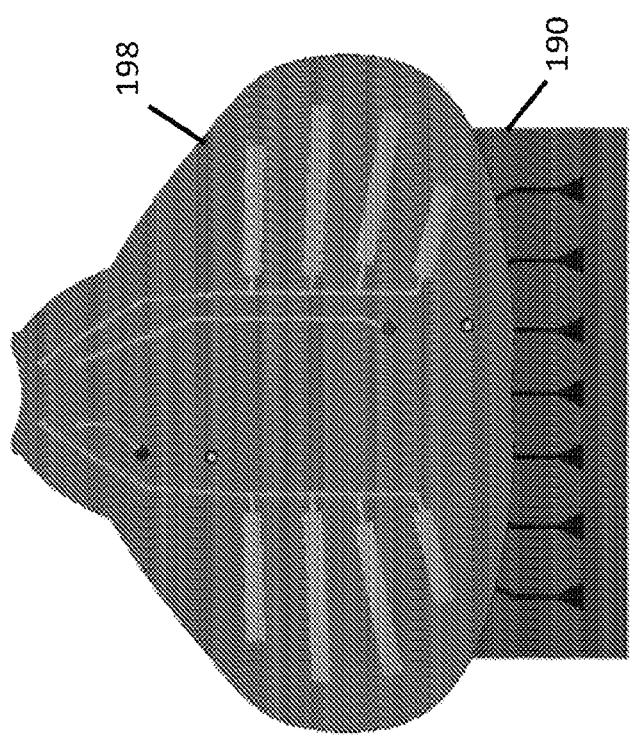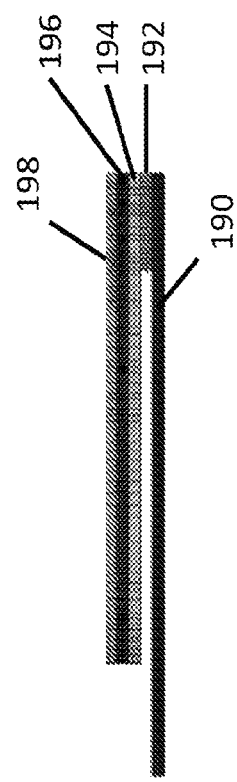
FIG. 43A
FIG. 43B

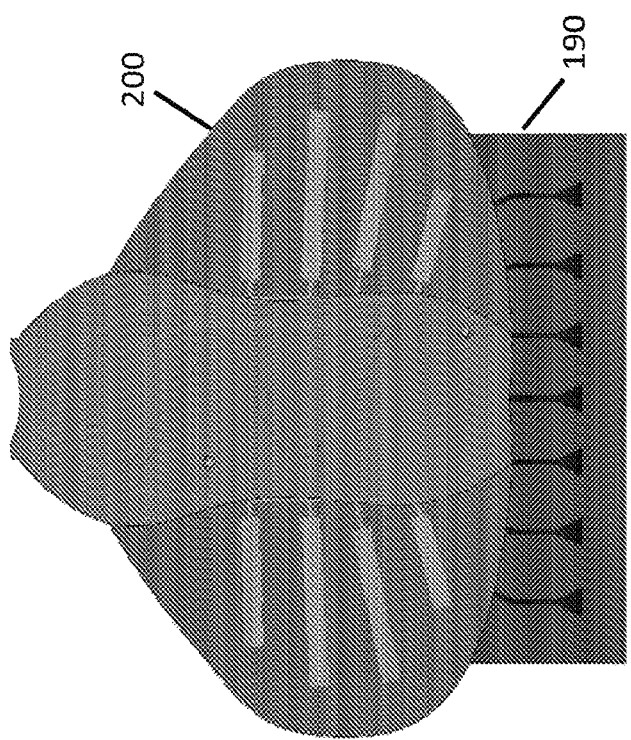
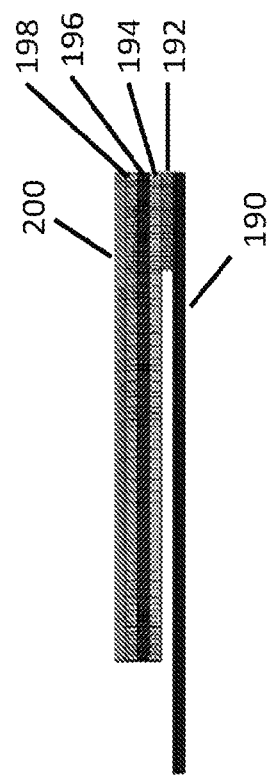
FIG. 44A
FIG. 44B

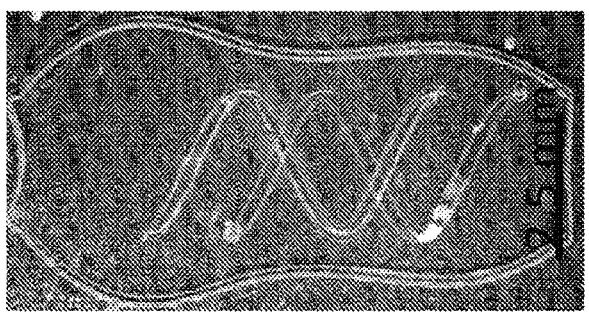
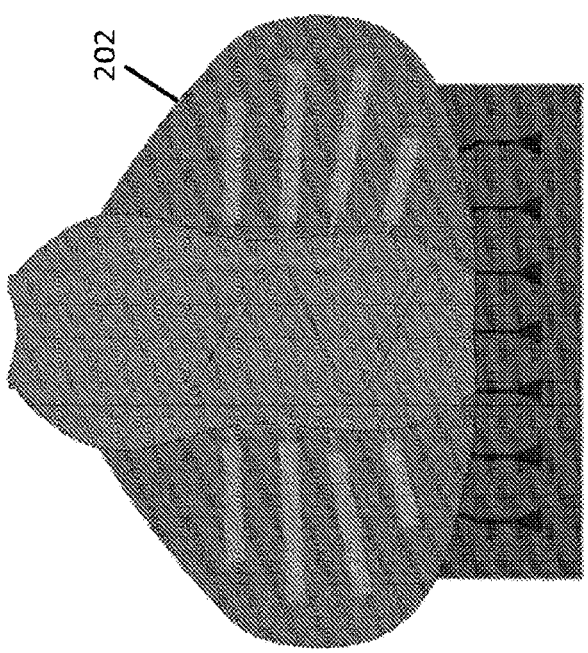
FIG. 45A
FIG. 45B

SYSTEMS AND METHODS FOR FABRICATING 3D SOFT MICROSTRUCTURES

RELATED APPLICATIONS

This application is a national stage filing under 35 U.S.C. § 371 of international PCT application, PCT/US2018/022494, filed Mar. 14, 2018, which claims priority to and the benefit of U.S. Provisional Patent Application No. 62/471,134, filed Mar. 14, 2017, the entirety of each are hereby incorporated by reference for all purposes.

STATEMENT OF GOVERNMENT SUPPORT

This invention was made with government support under FA8650-15-C-7548 awarded by the Department of Defense/Defense Advanced Research Projects Agency. The government has certain rights in the invention.

FIELD

The present disclosure relates to systems and methods for generating a 3D soft microstructure.

BACKGROUND

Molding is one of the most common techniques for manufacturing soft centimeter-scale devices. However, at smaller scales, the structural complexity that can be obtained is limited by the manufacturability of the mold, thus restricting the design mostly to single degree-of-freedom (DoF) continuum bending structures. 3D printing allows nearly arbitrary geometries, yet the paucity of compatible soft materials and limited resolution engenders mostly static devices below the mesoscale. 4D printing has been proposed to develop dynamically evolving structures exploiting time-dependent shape-shifting of 3D printed, stimuli-responsive materials. Planar manufacturing processes have also been used for fabricating soft devices across different scales, from meter sized soft robots, to millimeter scale soft microdevices. Among planar processes, soft lithography enables dense packing of extremely fine features, leading to devices capable of (fluidic) computation, as widely demonstrated in the field of microfluidics. However, with no means of altering the overall profile or shape, joints are undefinable and large motions are unattainable, relegating most soft lithographic devices to a purely two-dimensional existence. A number of manufacturing methods for developing innovative soft microdevices have also been proposed, such as hydrogel-based micropatterning, electrically assisted ionoprinting, and synthesis of materials responsive to light, temperature and magnetic fields for drug delivery systems.

Previous work has demonstrated the possibility of combining laser cutting and soft lithographic techniques to release simple soft microactuators from an elastomeric matrix, while templateless prototyping of polydimethylsiloxane microfluidic structures exploiting laser machining have also been proposed.

SUMMARY

Systems and methods for fabricating 3D soft microstructures are disclosed herein. A soft microstructure is provided that includes a plurality of elastomeric layers with fluidic networks formed between at least two of the elastomeric layers. At least one of the elastomeric layers comprises at least one structural actuator and at least one functional actuator. The structural actuator is configured to accept a phase-changing material to convert the structural actuator into a permanent structural element by self-folding a portion of the microstructure to form a three dimensional structure from a two dimensional structure. The at least one functional actuator is configured to accept an inert working fluid to allow for motion of the 3D structure formed by the at least one structural actuator.

In some embodiments, any of the plurality of elastomeric layers can contain at least one structural actuator or at least one functional actuator or both at least one structural actuator and the at least one functional actuator.

In some embodiments, the phase-changing material is a curable material that is configured to cause self-folding into a three dimensional structure as the curable material cures. In some embodiments, the phase-changing material is a functional material such that the three dimensional structure is responsive to a stimuli. For example, the stimuli can be ultraviolet light such that the phase-changing material is cured with the UV light, or the stimuli can be thermal energy such that the phase-changing material is cured with the thermal energy.

In some embodiments, a form of the three dimensional structure can be based on a number of the plurality of elastomeric layers. In some embodiments, a form of the three dimensional structure is based on a placement and size of the fluidic networks formed in the plurality of elastomeric layers.

A soft microstructure is provided that includes a plurality of elastomeric layers with fluidic networks formed between at least two of the elastomeric layers. Any of the elastomeric layers can comprise at least one structural actuator and at least one functional actuator. The at least one structural actuator is configured to accept a phase-changing material to convert the structural actuator into a permanent structural element by self-folding a portion of the microstructure to form a three dimensional structure from a two dimensional structure. The at least one functional actuator is configured to accept an inert working fluid to allow for motion of the 3D structure formed by the at least one structural actuator.

In some embodiments, the at least one structural actuator and the at least one functional actuator are formed in the same elastomeric layer. In some embodiments, the at least one structural actuator and the at least one functional actuator are formed in different ones of the plurality of elastomeric layers. In some embodiment, a form of the three dimensional structure is based on a number of the plurality of elastomeric layers. In some embodiments, a form of the three dimensional structure is based on a placement and size of the fluidic networks formed in the plurality of elastomeric layers.

A method of fabricating a soft microstructure is also provided, and comprises applying soft lithographic techniques to form a plurality of elastomeric layers, and forming one or more two dimensional patterns in at least one of plurality of elastomeric layers to form at least one actuator in at least one of the plurality of elastomeric layers. The plurality of elastomeric layers are aligned and the plurality of elastomeric layers are bonded to each other. The plurality of elastomeric layers can form a two dimensional soft microstructure capable of self-folding using one of the least one actuators to form a three dimensional structure.

In some embodiments, forming the one or more two dimensional patterns is achieved by laser cutting. In some embodiments, forming the one or more two dimensional patterns is achieved by a process selected from the group consisting of molding, 3D printing, and stamping.

BRIEF DESCRIPTION OF THE DRAWINGS

The present disclosure is further described in the detailed description which follows, in reference to the noted plurality of drawings by way of non-limiting examples of exemplary embodiments, in which like reference numerals represent similar parts throughout the several views of the drawings, and wherein:

FIG. 1A-FIG. 1J are embodiments of a fabrication workflow for fabricating a soft 2D microstructure that is configured to self-fold into a soft 3D microstructure;

FIG. 2A is an embodiment of a discrete bending actuator;

FIG. 2B is an embodiment of a continuous bending actuator;

FIG. 6A and FIG. 6B illustrate various embodiments of microstructures configured to self-fold into 3D microstructures;

FIG. 14 is an image of an embodiment of a 2D microstructure;

FIG. 16 is a table illustrating various types of curable materials;

FIG. 20A-FIG. 20F illustrates an embodiment of a fabrication process of a plurality of layers forming an abdomen sublaminate;

FIG. 21A-FIG. 21J illustrate an exemplary bonding sequence for the embodiment of a microstructure in the form of a spider;

FIG. 25, FIG. 26, FIG. 27, and FIG. 28 illustrate an embodiment of a microstructure in the form of the spider, the microstructure being self-folded into a 3D microstructure to illustrate a leg portion of the microstructure;

FIG. 29A, FIG. 29B, FIG. 30A, FIG. 30B, FIG. 31A and FIG. 31B illustrate an embodiment of various layers of a microstructure forming a leg portion of a microstructure in the form of a spider;

FIG. 33, FIG. 34A, FIG. 34B, FIG. 35A, FIG. 35B, and FIG. 36 illustrate an embodiment of various layers of a microstructure forming a head and eye portion of a microstructure in the form of a spider;

FIG. 39A, FIG. 39B, FIG. 40A, FIG. 40B, FIG. 41A, FIG. 41B, FIG. 42A, FIG. 42B, FIG. 43A, FIG. 43B, FIG. 44A, FIG. 44B, FIG. 45A and FIG. 45B illustrates an embodiment of various layers of a microstructure forming an abdomen portion of a microstructure in the form of a spider;

Figure 1A:
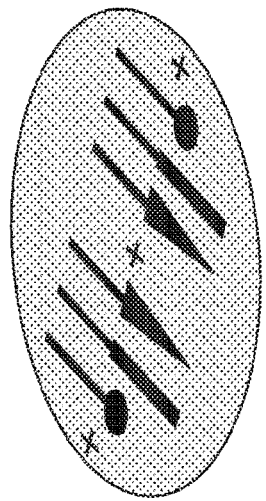

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. It will be understood that various changes may be made in the function and arrangement of elements without departing from the spirit and scope of the presently disclosed embodiments.

Specific details are given in the following description to provide a thorough understanding of the embodiments. However, it will be understood by one of ordinary skill in the art that the embodiments may be practiced without these specific details. For example, systems, processes, and other elements in the presently disclosed embodiments may be shown as components in block diagram form in order not to obscure the embodiments in unnecessary detail. In other instances, well-known processes, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but could have additional steps not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

Subject matter will now be described more fully with reference to the accompanying drawings, which form a part hereof, and which show, by way of illustration, specific example aspects and embodiments of the present disclosure. Subject matter may, however, be embodied in a variety of different forms and, therefore, covered or claimed subject matter is intended to be construed as not being limited to any example embodiments set forth herein; example embodiments are provided merely to be illustrative. The following detailed description is, therefore, not intended to be taken in a limiting sense.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

A method is provided to increase the structural and (consequently) functional complexity of soft microstructures. By merging multilayer soft lithography and bulk or precision layer micromachining, a fabrication techniques can create a new class of soft microstructures, for example "Microfluidic Origami for Reconfigurable Pneumatic/Hydraulic"(MORPH) systems. In some embodiments, lithographic techniques can be used to manufacture elastomeric layers with embossed features that can be modified by means of laser micromachining. It will be understood that various methods can be used to form 2D patterns in the elastomeric layers beyond laser micromachining, including but not limited to 3D printing, molding, and stamping. After precision alignment and bonding of individual layers, the result is a soft laminate with embedded microfluidic circuitry and a nearly arbitrarily complex profile. Upon pressurization, chambers within the microfluidic circuitry expand to actuate portions of the laminate through preprogrammed motions. Actuation with an inert working fluid (such as air or water) permits recovery of the initial configuration upon depressurization, while the use of a phase-changing material converts deformed actuators into permanent structural elements. Combining both actuation strategies enables the transformation of static 2D laminates into dynamic 3D structures.

A manufacturing process is provided that can enable a process for developing soft complex microstructures. The dimensionally of a soft microstructure can be increased. Starting from a 2D process, a 3D structure can be generated, and in one embodiment can be embedded with functional microfluidic circuitry. With current manufacturing methods, it is not possible to embed this level of complexity at this scale. It can also be possible to integrate multiscale features, from the centimeter to almost nanometer scale as the process combines the scalability of soft lithography and laser cutting. There can be various advantages of the fabrication process described herein, including the use of a purely 2D process, the combination of laser cutting and soft lithography, creating both constant curvature structures and flexure based mechanisms, providing multiple scale features, providing functional microfluidic circuits, and the use of multiple materials including functional materials for stimuli responsive structures.

There is a distinction between structural and functional complexity. In some embodiments, structural complexity is defined in terms of characteristics of the static system, such as the spatial dimensionality (i.e., whether 2D or 3D), the number and diversity of materials involved, and geometric considerations (e.g., shape and minimum feature size). Functional complexity encompasses the dynamic aspects of the system, such as the number of DoF, the achievable motions and deformations, and any embodied computation or intelligence. Previous research has demonstrated instances of functional complexity, for example microfluidic devices able to perform complex computational tasks. However, there are very few examples of soft microstructures that combine both structural and functional complexity. One example, the "Octobot", is a two DoF autonomous soft robot fabricated by exploiting a multi-step process combining embedded 3D printing and soft lithography. As this example illustrates, the functional complexity of soft microstructures is limited largely by the chosen fabrication methodology.

Leveraging 2D soft lithographic techniques combined with laser cutting, alignment, and lamination by oxygen plasma bonding, a 2D fabrication process can be used to generate complex 3D soft microstructures. In an embodiment, the process includes spinning coat layers of a soft elastomer casted on a SU-8 patterned silicon wafer, removing them from the wafer, aligning the pattern on a laser and cutting features and shapes. The process further includes selectively bonding multiple layers on top of each other to create a 3D network of predesigned channels, and injecting an uncured material into specific channels to actuate fabrication degrees of freedom. For example, a general workflow for the fabrication technique can include forming layers using soft lithography, aligning and laser cutting the layers, plasma bonding the layers with pin alignment, inflation with PDMS, and curing. Fabrication of multi-layer structures that can form complex 3D shapes can include origami-like folding and sealing of the emerged 3D structure, and complex curved surfaces by exploiting the deformation and/or stretchability of the structure or using continuous folds.

The injection of material into the channels and actuators leads to a change in weight of the device and thus there can be an effect due to gravity. This effect is less in the channels as they are very thin (for example, 40 μm thick), but this effect can be felt in the inflated actuators. Such effect will depend on a variety of factors, including but not limited to the mechanical properties of the material composing the device, the geometry of the structure, and the weight of the fluid injected in the actuators. The entity of the effect of gravity depends also on the structural properties of the injected fluid once cured. If the elastic modulus of the injected fluid, once cured, is larger than the bulk material composing the device the effect of gravity is negligible as the injected cured fluid can act as a sort of endoskeleton which can increase the structural stability of the device.

It is possible to stack multiple soft layers, embedding actuators designed for being injected with a phase-changing material, such as a curable material, as well as actuators for actively moving the structure that emerges after the injection and curing of the uncured material. These structural actuators and functional actuators can be formed in any of the elastomeric layers that make up a microstructure, and can be in separate layers and in the same layers, in any amount and in any combination. Microfluidic circuitry can be embedded in the layers. The use of soft layers allows for the creation of a variety of 3D shapes, from simple joint bending and domes to planes with positive and negative curvatures. Through the fabrication degrees of freedom, complex 3D microstructures analogous to a folding-based assembly of a pop-up MEMS can be generated, but are entirely soft. The actuation degrees of freedom can work in combination with the emerged structure to create soft micro-robots capable of locomotion and manipulation.

The process is inspired by the pop-up book MEMS fabrication process in the sense that it exploits a quasi 2-dimensional process to create 3-dimensional structures. In some embodiments, complex 3D structures can be based on the inflation of channels embedded in the 2D structure. The use of soft materials creates completely new opportunities and advantages: the stretchability of the material and the layers allows for continuous folding and the creation of various structures, for example, obtaining curved planes (for example, in the shape of saddle) out of flat surfaces, the networks of fluidic actuated structures can be embedded in the layers, and there is no need for adhesive as only chemical surface functionalization for bonding the layers is used.

This process addresses the challenge of manufacturing 3D soft microstructures, and the resulting soft microstructures can have a variety of uses. It can also be used to develop bioinspired platforms for replicating and studying biological systems. Devices manufactured with this process can be used for novel 3D microfluidic devices where we can exploit either structural and active degrees of freedom of the structure to obtain new flow control strategies. Microfluidic circuitry can be actuated to control, for example, the exposure of chemicals into the microfluidic channels by actuating the structure containing the channel to lift them up when needed. The process can be used for developing a new class of medical devices that can be deployed in the body and are able to adhere to body structures and release drugs locally.

Various other uses range from microfluidic devices to robotics. As some advantages to these devices include low cost, ease of processing, robustness, and impedance matching with humans and natural environments, opportunities present themselves in medicine, macro- and micro-manipulation, exploration, sensing, and biomimetics. In addition, soft microstructures can take the form of, including but not limited to, microfluidic devices to embody logic circuits, soft microstructures with intricate geometries, and soft microactuators that employ exotic materials and that can respond to diverse stimuli.

The fabrication process described herein can enable the fabrication of soft millimeter scale robots that deliver complex 3D structures out 2D manufacturing approach. Unlike molding and 3D printing technologies, the injection induces self-folding provides flexibility in material selection, and accuracy comparable to soft lithography. In some embodiments, the manufacturing process can be used to fabricate soft micro robots with applications in exploration of hard to reach areas.

As explained above, the fabrication method combines features of laser cutting with soft lithography techniques to allow for the creation of soft microstructures. The ideas of microfluidics and laser machining, which are both purely 2D processes, can be combined to allow for the creation of complex 3D soft structures that can include, in some embodiments, embedded working microfluidic circuitry. This manufacturing process could represent an enabling process for developing soft complex microstructures. With current manufacturing methods it is not possible to embed this level of complexity at this scale. It is also possible to integrate multiscale features, form the centimeter to almost nanometer scale since we are combining the scalability of soft lithography and laser cutting.

Figure 1B:
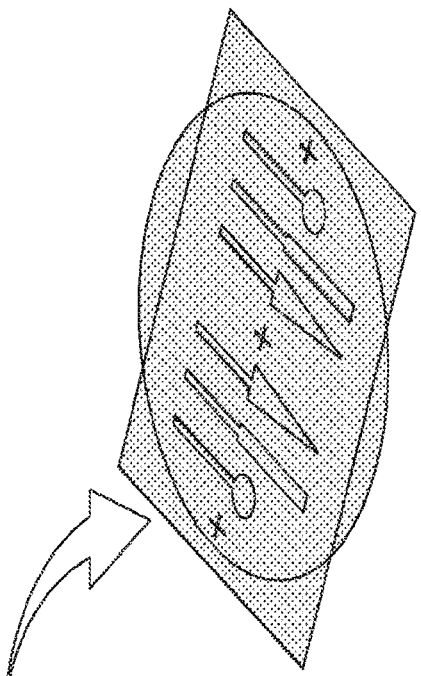
Figure 1C:
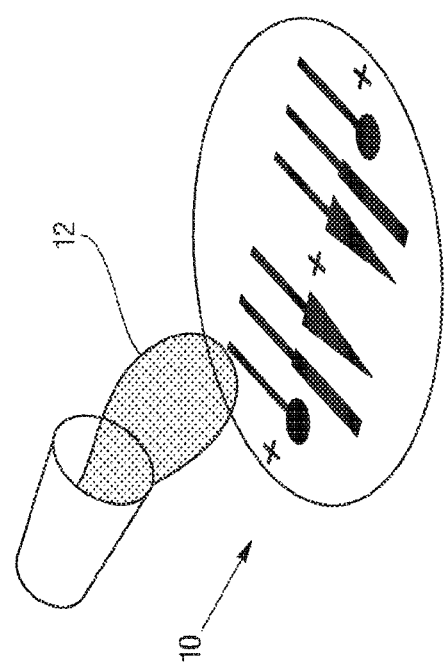
Figure 1D:
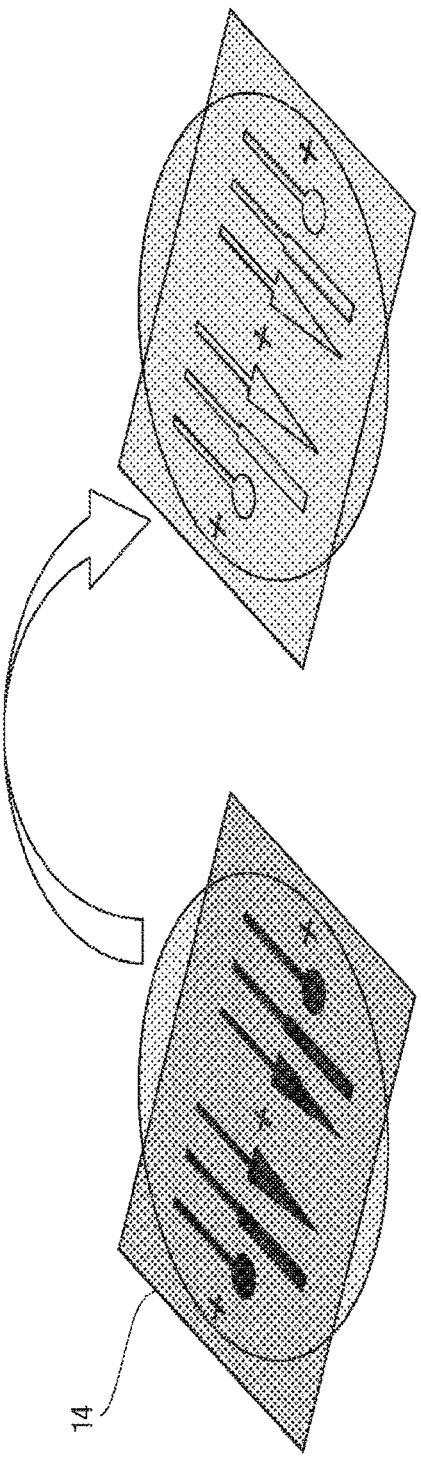
Figure 1E:
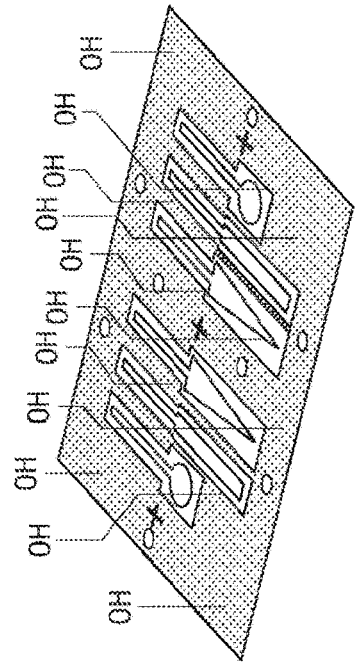
Figure 1F:
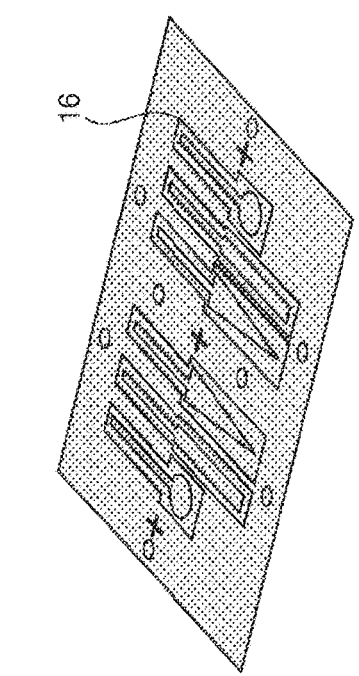
Figure 1G:
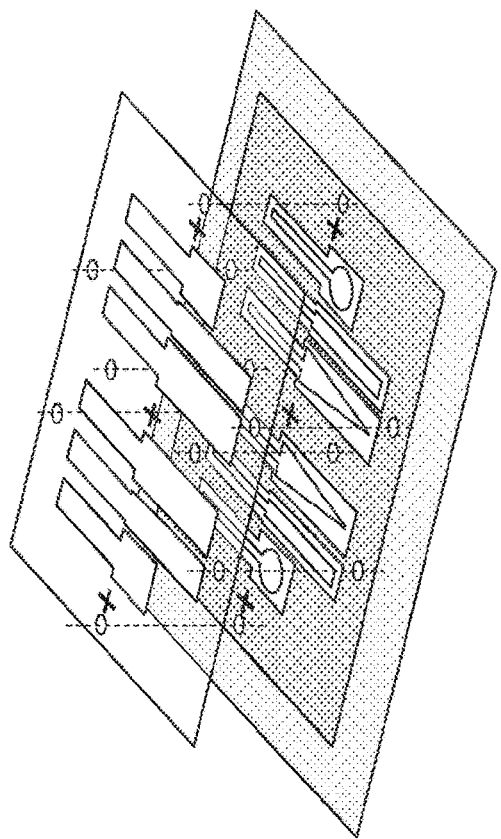
Figure 1H:
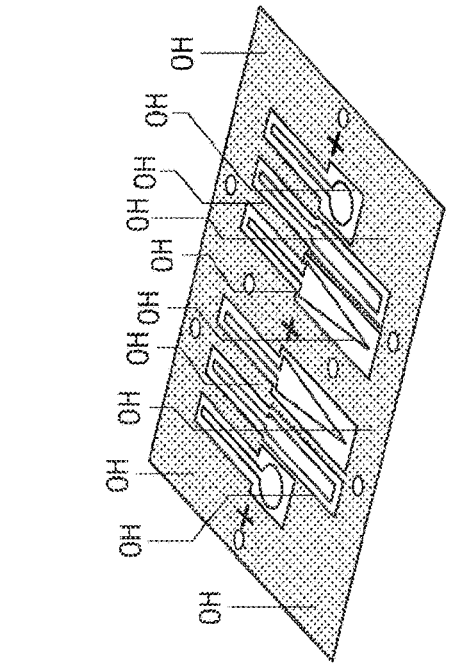

FIGS. 1A-1J illustrates an embodiment of a process for forming 3D soft microstructures. An elastomer 12 can be poured and spun coat on an SU8 patterned wafer 10, as shown in FIG. 1A, and the elastomer is thermally cured, as shown in FIG. 1B. An adhesive, such as GelPak-8 adhesive, is bonded on a soft layer 14, as shown in FIG. 1C, and the soft layer 14 is peeled off with the adhesive, as shown in FIG. 1D. The layers of the microstructure are aligned, and alignment holes 16 and actuator shapes are laser cut into the layers, as shown in FIG. 1E. In some embodiments, the alignment holes 16 cut into the layers allow the layers to be aligned with manual manipulation of the layers, as the alignment holes allow the layers to be aligned through the use of an alignment tool, such as alignment beams. An oxygen plasma treatment is applied to layers that include embossed features, as shown in FIG. 1F, and an oxygen plasma treatment is applied to blank layers, as shown in FIG. 1G. The soft layers are aligned and bonded with precision dowel pins, as shown in FIG. 1H. An adhesive support is removed, as shown in FIG. 1I, and the actuators are released, as shown in FIG. 1J.

Traditional soft actuators can deform in response to a stimulus, including but not limited to pressure change for fluidic actuators and electric field for electroactive materials, and remain in that deformed state for only as long as the input is applied. For instance, a typical bending fluidic actuator is one that is straight under atmospheric pressure, but bends when pressurized. When allowed to depressurize (i.e., when the input is removed), the actuator returns to its initial, undeformed state. In contrast, in some embodiments, elastomeric fluidic actuators can be structurally locked in their deformed states through injection-induced self-folding. Instead of using traditional working fluids such as water or air, phase-changing materials can be used to achieve this behavior. That is, an actuator can be pressurized with a normally fluid material, and then solidify that material, effectively locking the entire structure in its deformed state. For example, UV-curable resin can be used as the phase-changing material, or an uncured form of the bulk elastomer can be used. Using the elastomer precursor can result in a monolithic structure that is entirely soft, and also offers an alternative stimulus for structural locking (i.e., thermal curing rather than UV curing, see supplemental text for additional details). When total recovery of the initial configuration is required, simply using an incompressible fluid (such as water) and closing an input valve would be a viable alternative. While one could inject all microfluidic channels with a phase-changing material that is subsequently solidified, resulting in a 3D, yet entirely static, structure, in some embodiments a combination of working fluids, simultaneously locking some actuators into structural elements, while retaining other actuators to control motion.

There can be a plurality of types of soft micro-actuators. In some embodiments, there can be continuous bending actuators (CBAs), and discrete bending actuators (DBAs). CBAs 30 have a rectangular shaped chamber 32, thus upon pressurization the loading profile along the X direction can be uniform, leading to a continuous bending behavior, as shown in FIG. 2B. In order to obtain a discrete, joint-like bending, trapezoidal chambers 22 can be used to from DBAs 20. In this case, upon pressurizations, the load distribution will present a profile shown in FIG. 2A. The area of membrane under pressure will decrease going from the larger base to the smaller base of the trapezoid. Assuming that the pressure uniformly distributes in the chamber and considering that P=F/A, the force can be larger at the larger base. This can result in an anisotropic deformation of the actuator, presenting a discrete, joint-like bending behavior, as shown in FIG. 2A. DBAs are employed in the structural and actuation DoFs of the legs of the exemplary spider embodiment, as explained in more detail below, whereas the jaws and abdomen elevating and flexing actuators are CBAs.

Figure 3:
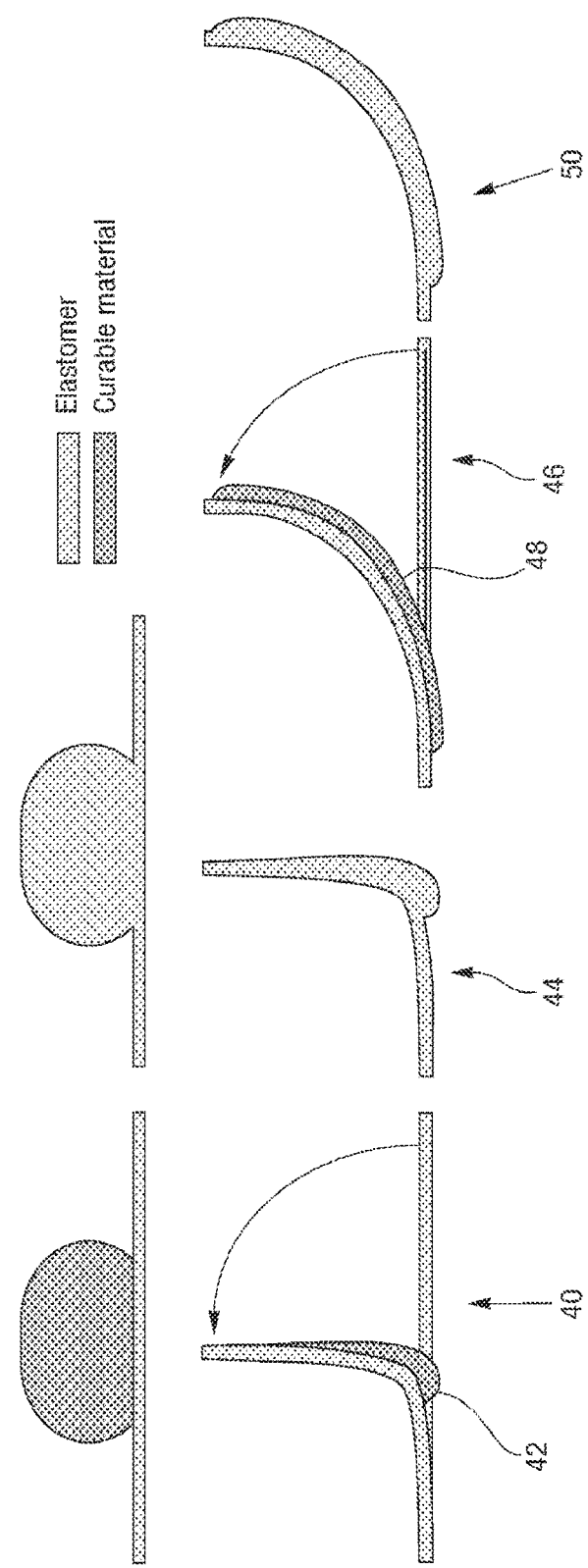
FIG. 3 is an embodiment of a microstructure configured to self-fold into a 3D microstructure.
Figure 4:
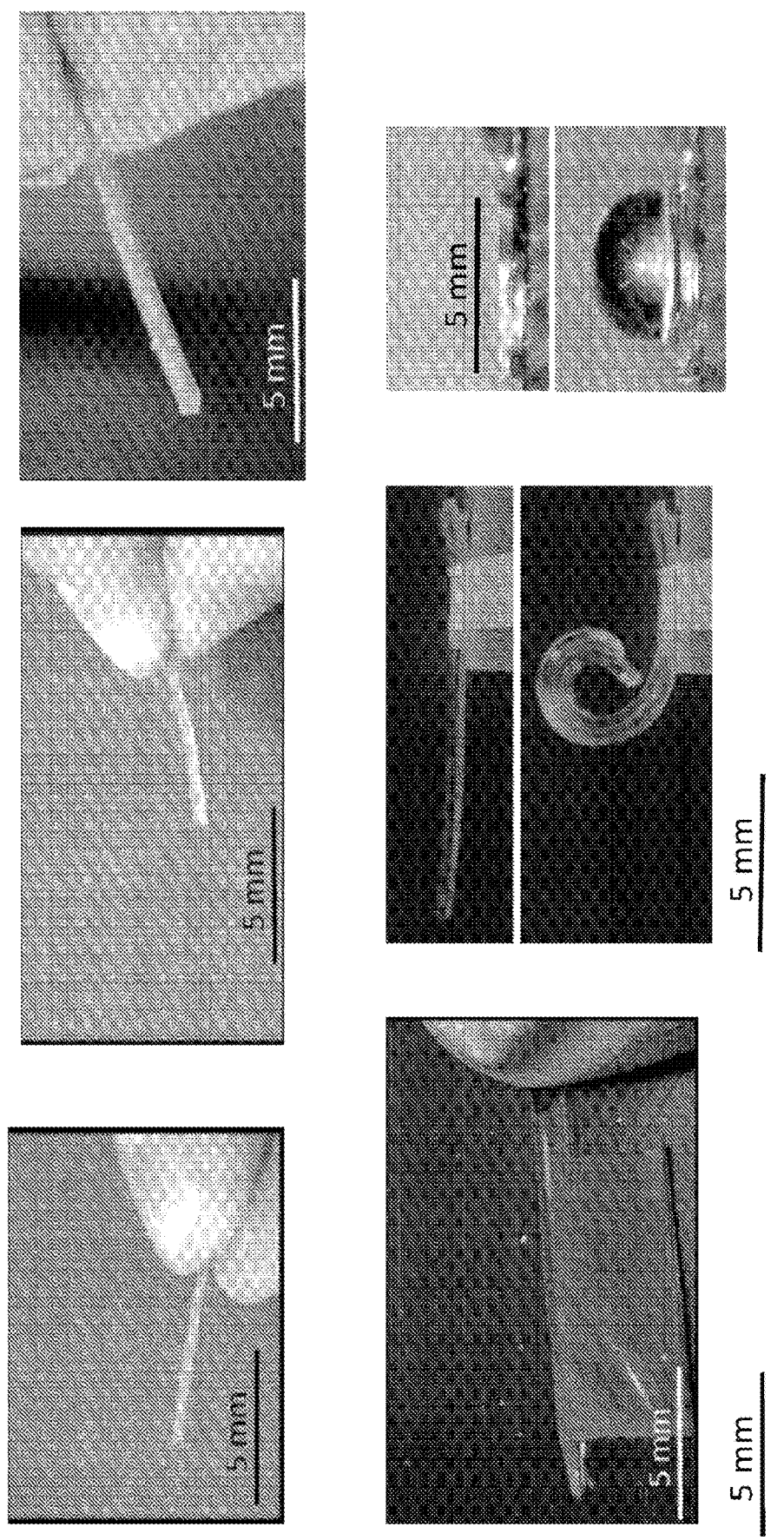
FIG. 4 is an image of an embodiment of a microstructure configured to self-fold into a 3D microstructure.
Figure 5:
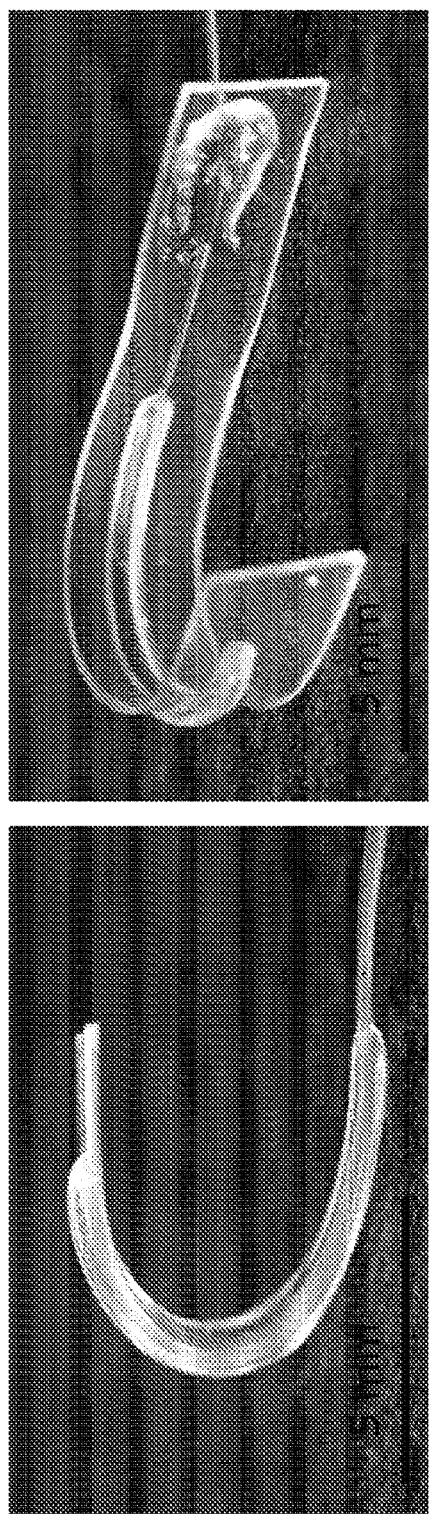
FIG. 5 is an image of an embodiment of a microstructure that is configured to self-fold into a 3D curved microstructure.
Figure 7:
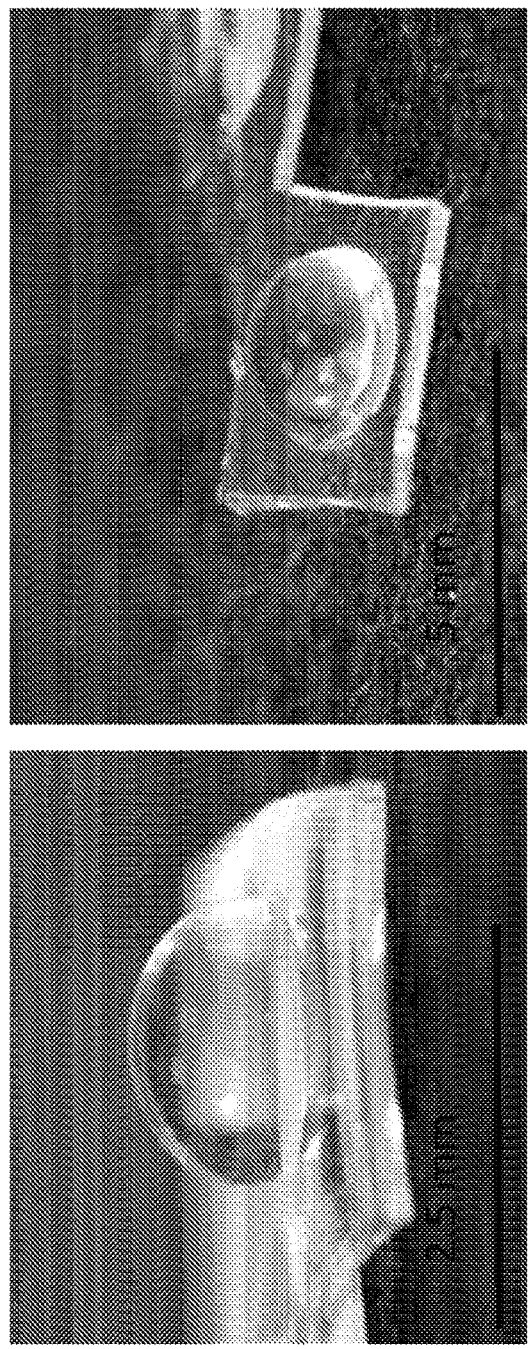
FIG. 7 is an image of an embodiment of a microstructure that is configured to self-fold into a 3D dome-shaped microstructure.

The microstructures can have a variety of configurations such that the microstructures can self-fold into a variety of structures, which can either self-fold into a temporary or permanent 3D structure depending on the fluid introduced therein. Increasing the dimensionality of soft microstructures is accomplished through injection induced self-folding. In some embodiments shown in FIG. 3 and FIG. 4, a flat 2D structure 40 can be injected with a curable material 42 such that the flat 2D structure 40 can self-fold such that the 2D structure can fold substantially in half into a 3D structure 44. In some embodiments, a flat 2D structure 46 or can be injected with a curable material 48 such that the 2D structure 46 can self-fold into a 3D structure 50 having a curvature (also shown in FIG. 5). In some embodiments, a flat structure can have more than one actuator to increase the dimensionality in more than one direction. For example, as shown in FIG. 6A, a 2D structure 60 can include first and second actuators 62, 64 such that the injection of material therein can self-fold the structure into a 3D structure 66 having a curvature in more than one plane, or first and second actuators 68, 70 can cause self-folding into a 3D structure in the form of a half-sphere 72. In some embodiments, as shown in FIG. 6B and FIG. 7, a flat 2D structure 74 can have a plurality of actuators 76, 78 (some actuators not shown) that are positioned such that the structure can self-fold into a cube 80.

Figure 8:
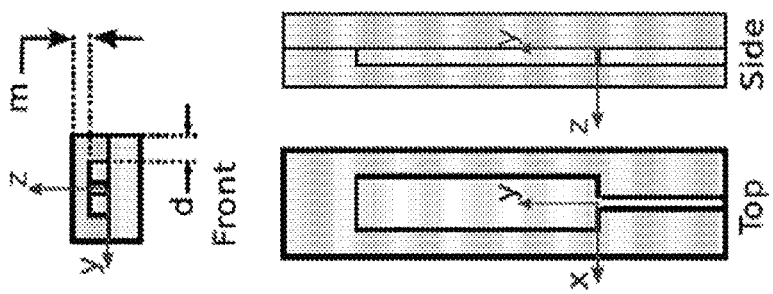
FIG. 8 is an embodiment of a coordinate system and variables of an actuator.

The tolerances of the manufacturing method in terms of minimum achievable cut distance and distortions introduced during the process can be analyzed, and demonstrated minimum cutting distances of 40 μm and misalignment errors down to 4 μm/mm. Thus, there is the possibility of using the laser cut path to define the motion of actuatable sections of the structure (i.e. a soft actuator). The motion of a typical bending actuator is defined by the relative bending stiffnesses of the portions of the actuator above and below the neutral axis. Referring to FIG. 8, and noting that the actuators in this case are monolithic (i.e., all of the same material, and thus all of the same elastic modulus), the bending motion is defined by the relative thicknesses of the material above and below the bladder. With the membrane thickness m being the smallest dimension (i.e., smaller than the adjacent wall thickness d), a typical actuator can bend about the y-axis. This can be referred to as out-of-plane bending, as the actuator bends out of the plane of its defining geometry. This behavior remains dominant until the minimum cut distance d becomes similar in magnitude to the membrane thickness m. When d≈m, the bending axis begins to rotate, as m is no longer the actuator's smallest dimension. Further decreasing the minimum cut distance below the membrane thickness causes the bending axis to rotate further, until d is appreciably smaller than m and the bending axis is fully about the z-axis (normal to the plane defining the actuator geometry). This can be referred to as in-plane bending, as the bending deformation is entirely within the plane of the actuator. To quantify this behavior, visual tracking of multiple actuators can be performed, varying the minimum cut distance.

Figure 9:
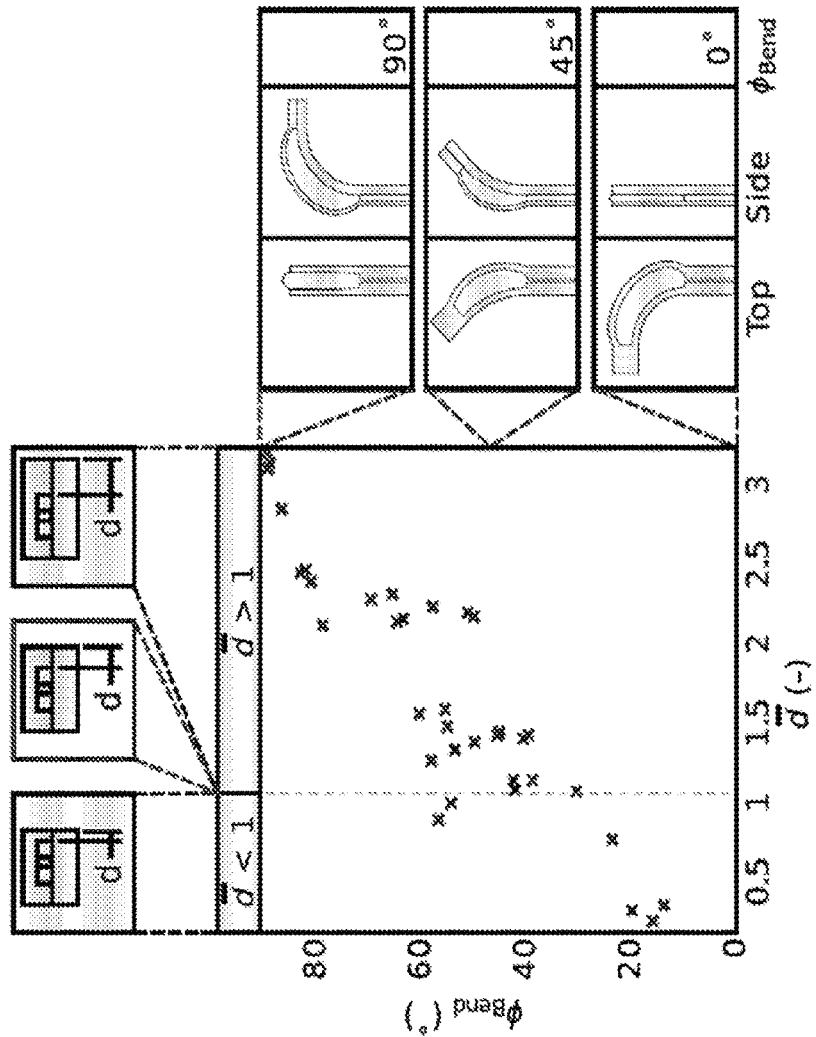
FIG. 9 illustrates a plot of bend angle as a function of cut distance relating to a transition from out-of-plane bending to in-plane-bending.

FIG. 9 shows a transition from out-of-plane bending to in-plane-bending as the minimum cut distance approaches and subsequently passes below the membrane thickness. Thus, 3D actuator motion can be programmed by the choice of the 2D layer geometries.

To quantify this behavior, visual tracking of various actuators can be performed. The actuators can be manufactured using the same procedure as for the soft layers, for example, that compose the spider, as described in more detail below. Actuators can be fabricated with minimum cut distances ranging from three times the membrane thickness down to the smallest distance that can be fabricated successfully, determined in part by thermal damage effects. The final bend angle is defined as the inverse tangent of the deflection along the z-axis with respect to deflection along the y-axis (FIG. 9). As such, a typical out-of-plane bending actuator (i.e., one that bends entirely about the y-axis) would have a bend angle of 90 degrees. Similarly, an actuator that demonstrates fully in-plane bending (i.e., one that bends entirely about the z-axis) would have a bend angle of 0 degrees. The data in FIG. 9 shows that there is a transition from out-of-plane bending to in-plane bending as the minimum cut distance approaches and subsequently passes below the membrane thickness.

The data is quite spread out within the transition region from out-of-plane to in-plane bending. This can occur, in addition to material irregularities and manufacturing imperfections, due to the hyperelastic nature of the material. As the actuator is pressurized, the thinnest portion (whether that is the membrane defined lithographically or the sidewall defined by laser cutting) can expand to a much larger degree than the rest of the actuator. When the minimum cut path distance is of similar magnitude to the membrane thickness, complex, hybrid motions can be observed in which an actuator can transition from one bending mode to another throughout the course of a single inflation. This behavior can be due to a strain stiffening effect, where the elastic modulus increases with deformation. As such, it is not only the geometry of the actuator but also the time-varying mechanical properties of the material that influences bending motion.

Figure 10:
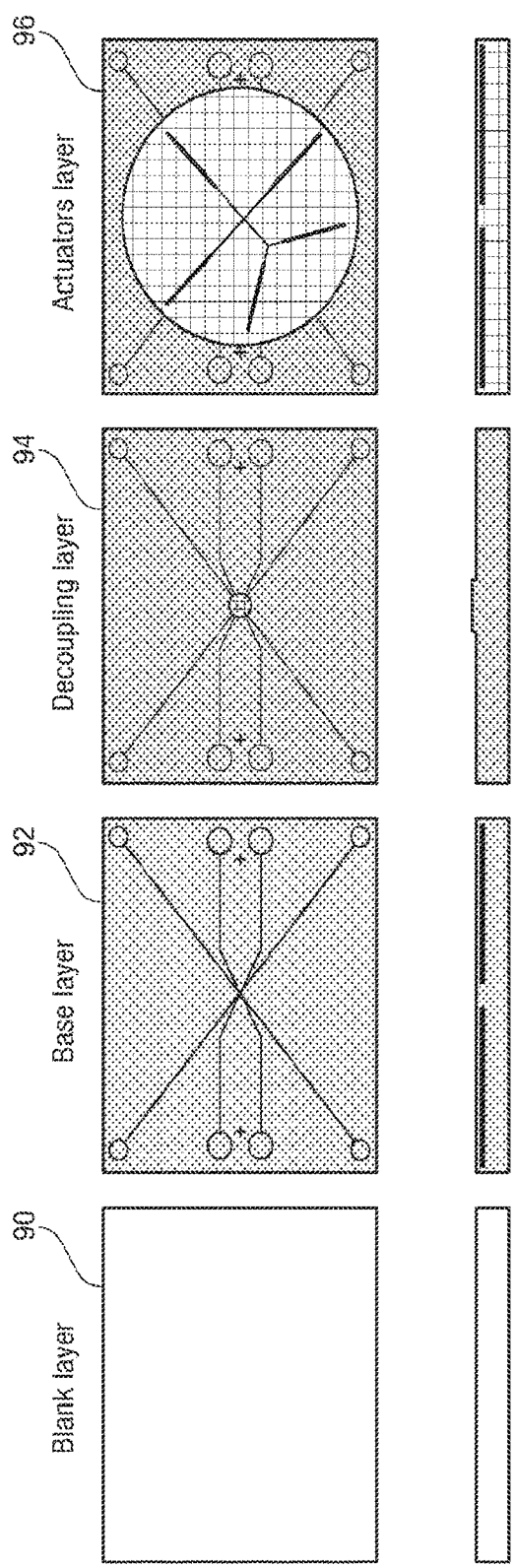
FIG. 10, FIG. 11, FIG. 12, and FIG. 13 illustrate an embodiment of a process for building a 2D microstructure that can self-fold into a 3D microstructure.
Figure 11:
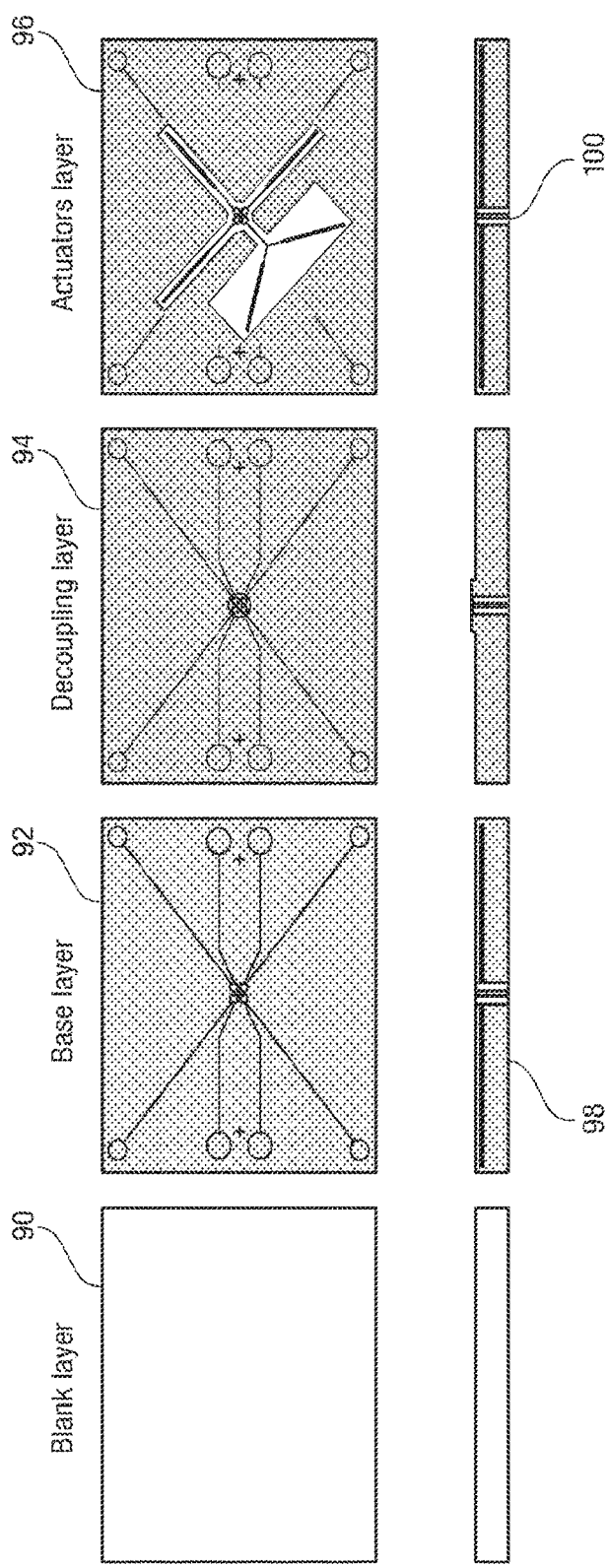
Figure 12:
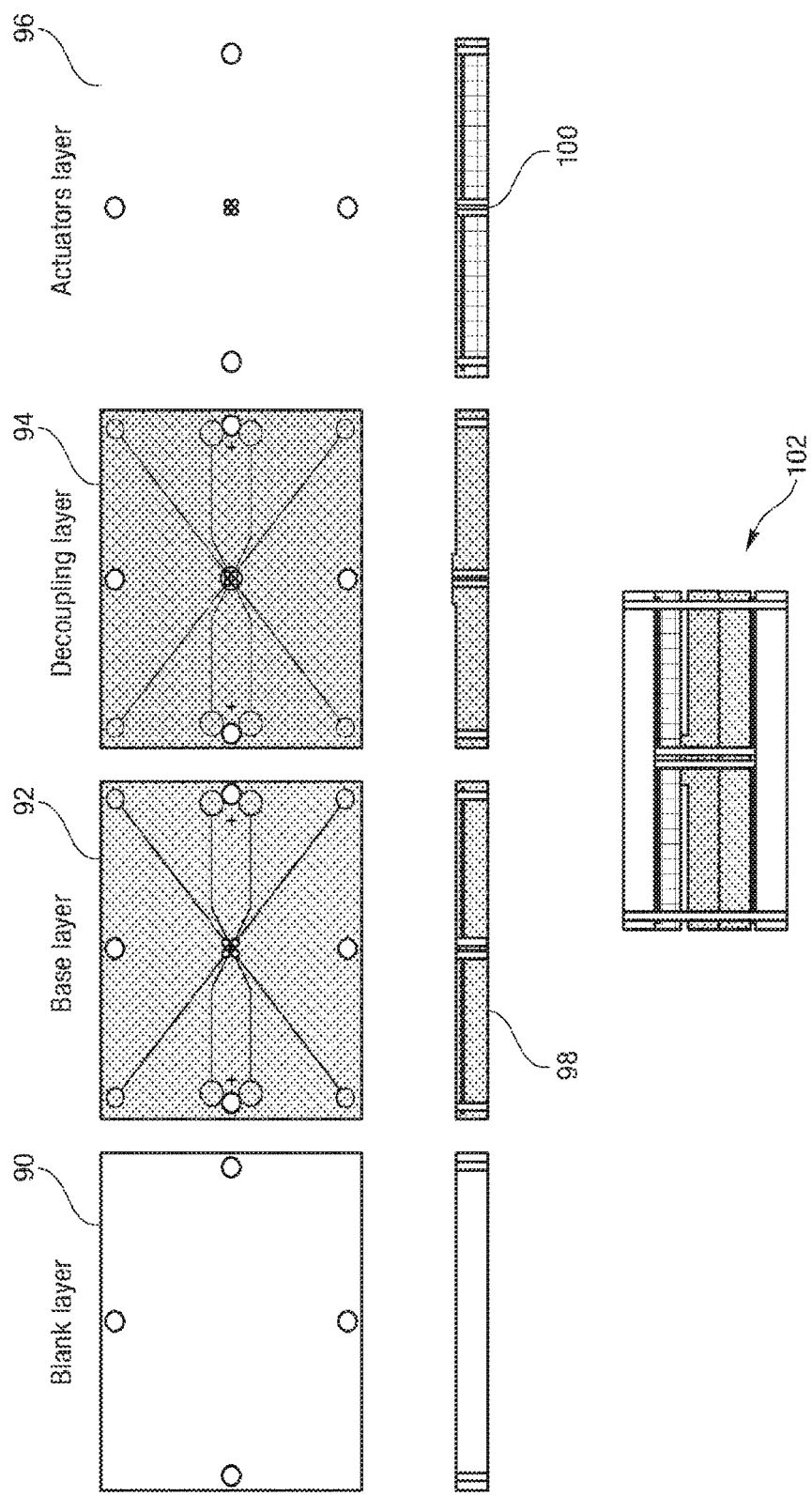
Figure 13:
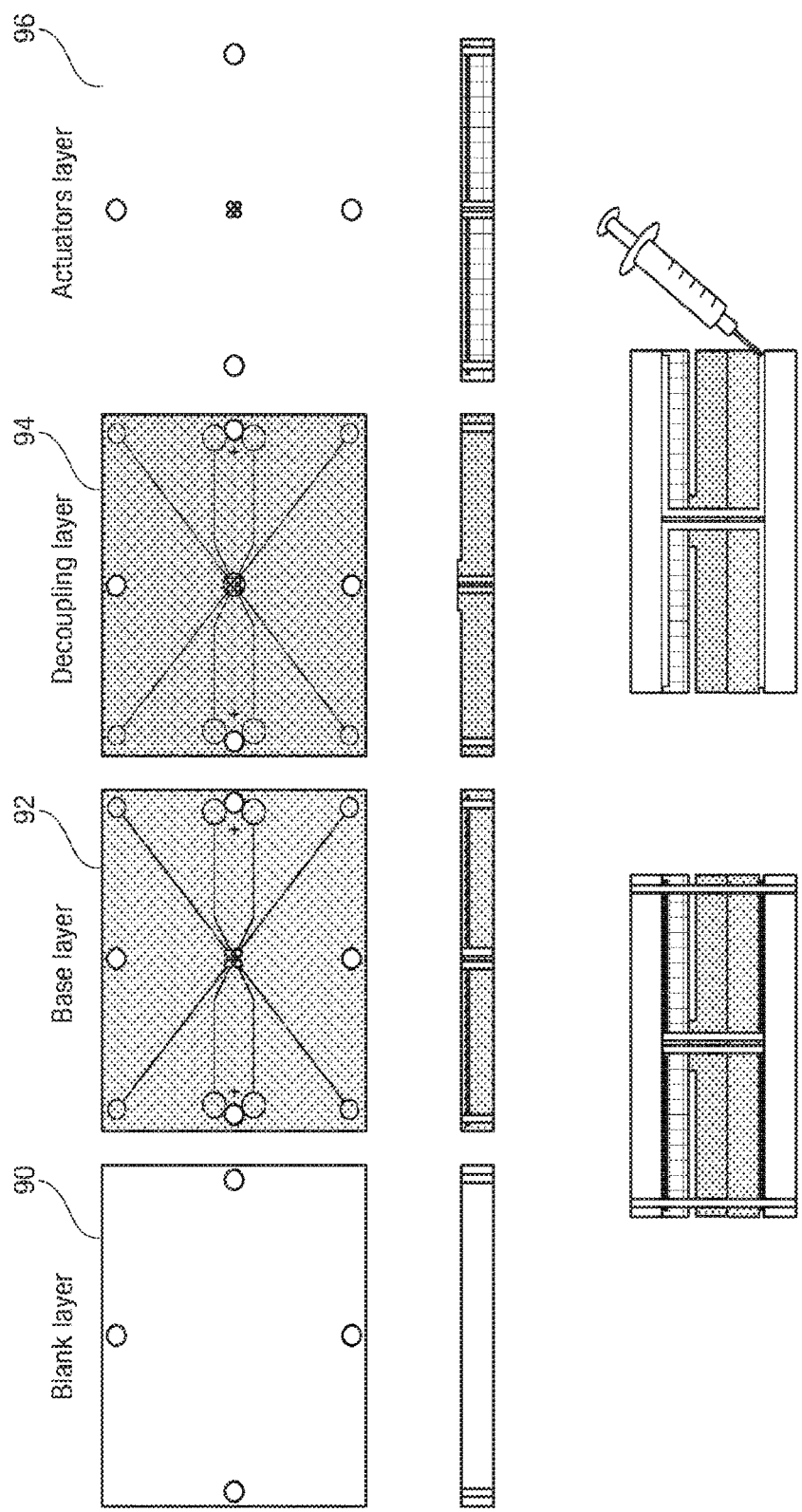
Figure 15:
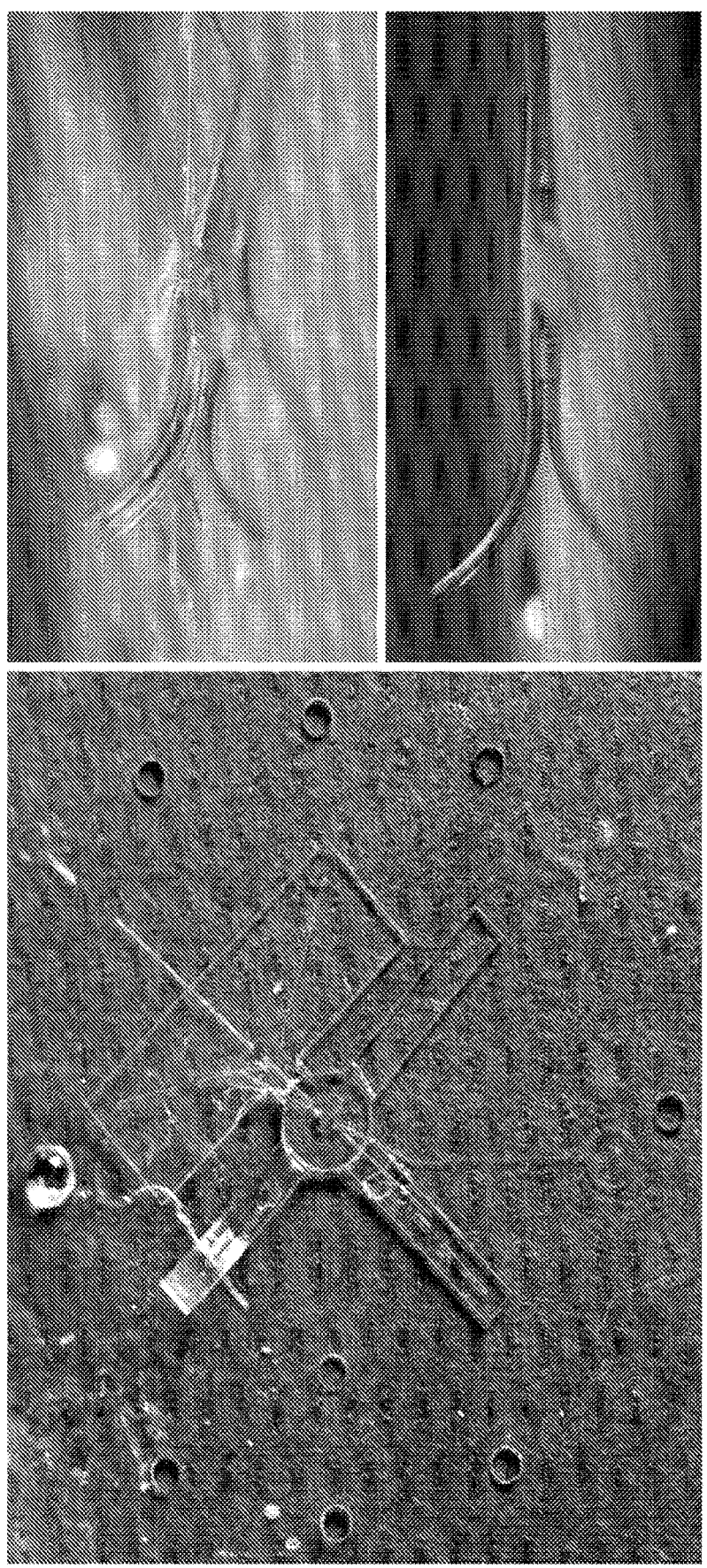
FIG. 15 is an image of an embodiment of a microstructure that is configured to self-fold into a 3D curved microstructure.

The 2D structures can be built in a variety of ways. FIG. 10, FIG. 11, FIG. 12, and FIG. 13 illustrate an embodiment of a process for building the 2D structure. As shown in FIG. 10, the device includes a blank layer 90, one or more base layers 92, a decoupling layer 94, and one or more actuator layers 96. The decoupling layer 94 is provided to decouple the base layer 92 from the actuator layer 96 so any fluid delivered to one of those layers is separated from the other. FIG. 11 and FIG. 12 illustrate the formation of channels 98, 100 in the base layer 92 and the actuator layer 96 (seen in both the top view and the cross-sectional view of the layers). The connections between the layers and channels can be seen in the side view of the layered 2D structure 102 shown in FIG. 12. FIG. 13 illustrates the injection of a fluid, such as a curable material into the base layer of the structure. FIG. 14 illustrates an exemplary embodiment of the built 2D structure, and FIG. 15 illustrates the 2D structure after being injected such that the structure self-folds into a 3D structure.

The dimensionality of the soft microstructures can be increased through the injection of a material to induce self-folding of the microstructure. Various materials can be injected, including but not limited to phase-changing materials, such as a curable material. Exemplary materials are shown in FIG. 16, and include but are not limited to silicone gel and elastomers. The injected material can be a functional material to have stimuli responsive structures.

Figure 17:
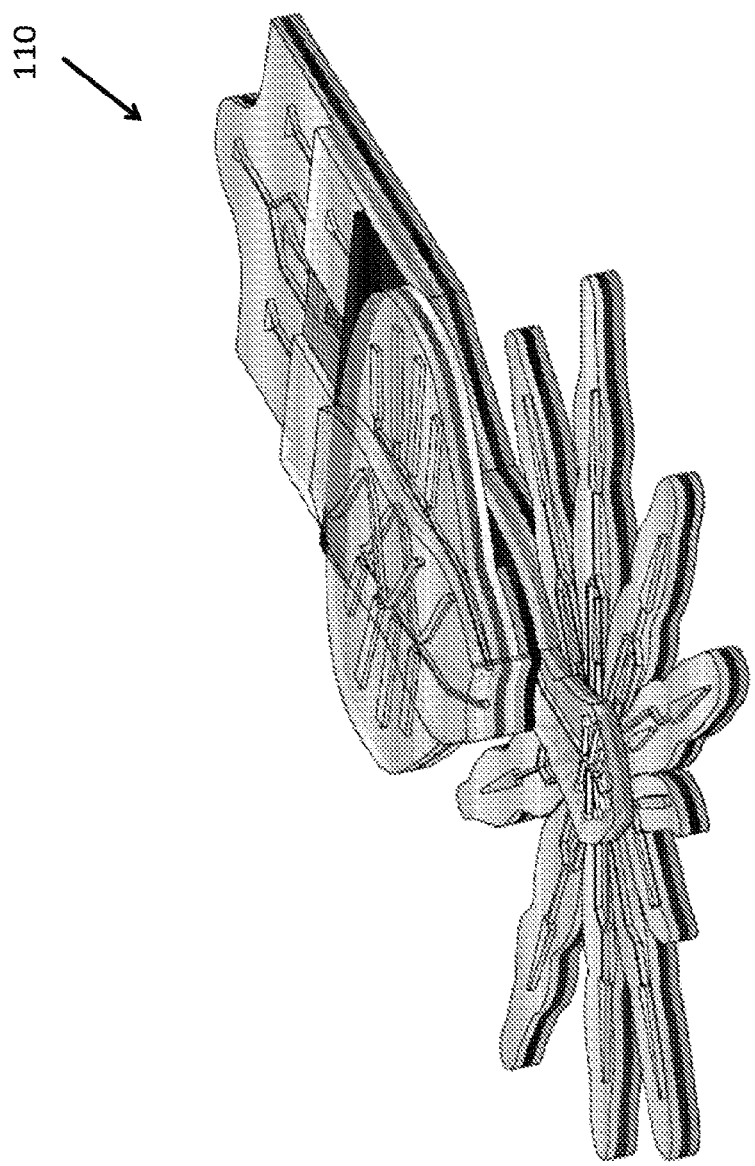
FIG. 17 is an exemplary embodiment of a soft microstructure in the form of a spider.
Figure 18:
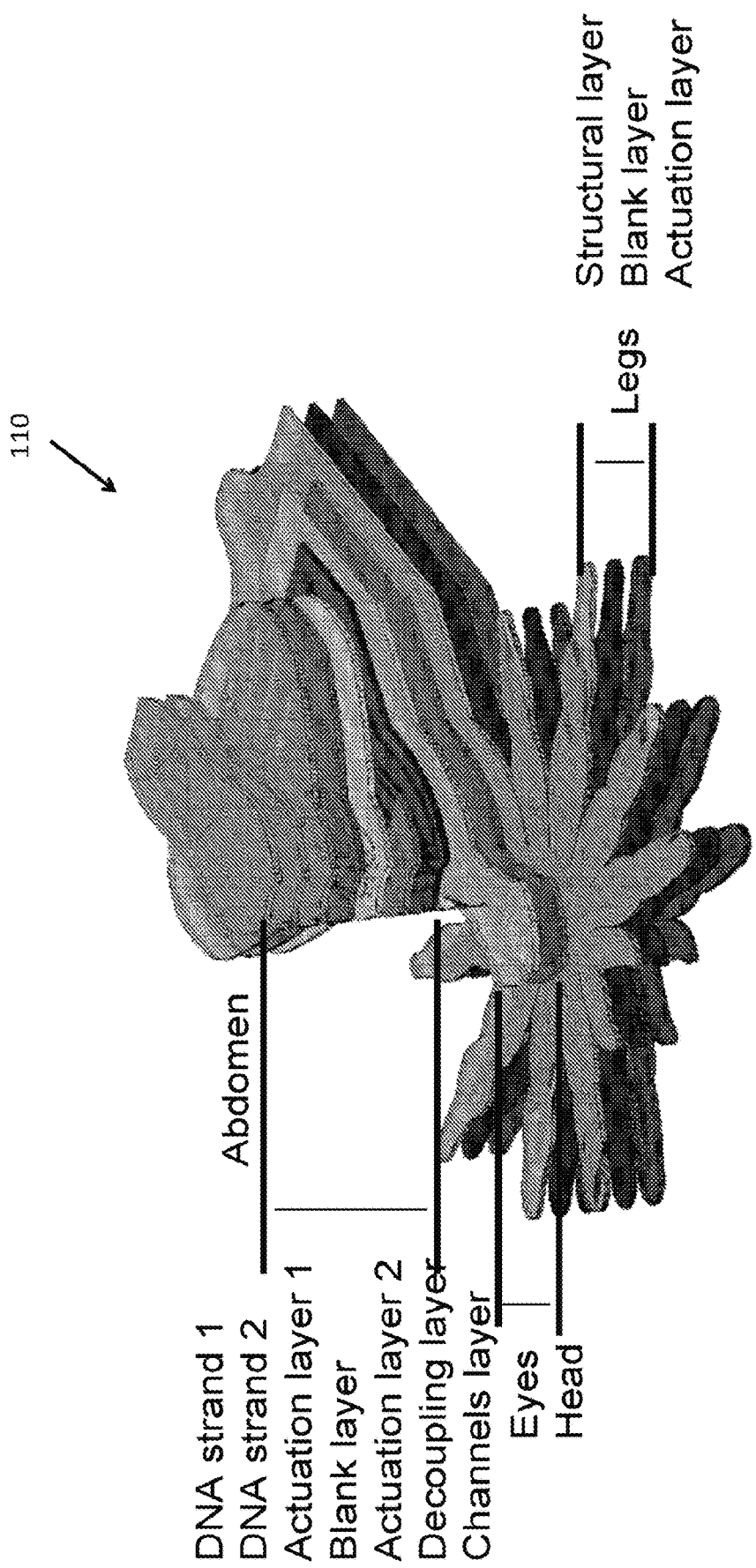
FIG. 18 is an exploded view of layers of the soft microstructure shown in FIG. 17.

The form and actuation capability of the microstructures can vary widely based on a variety of factors, including but not limited to the number of base and actuator layers, the location and size of the channels formed in the layers, and the complexity of the shape of the structure. In an embodiment shown in FIG. 17, an exemplary microstructure 110 in the form of a spider is shown, and various components of the spider can illustrate various capabilities of the fabrication method of forming a microstructure, such as the spider. FIG. 18 illustrates an exploded view of the various layers of the microstructure 110 that form the spider.

Figures 19A, 19B, 19C, 19D, 19E, 19F:
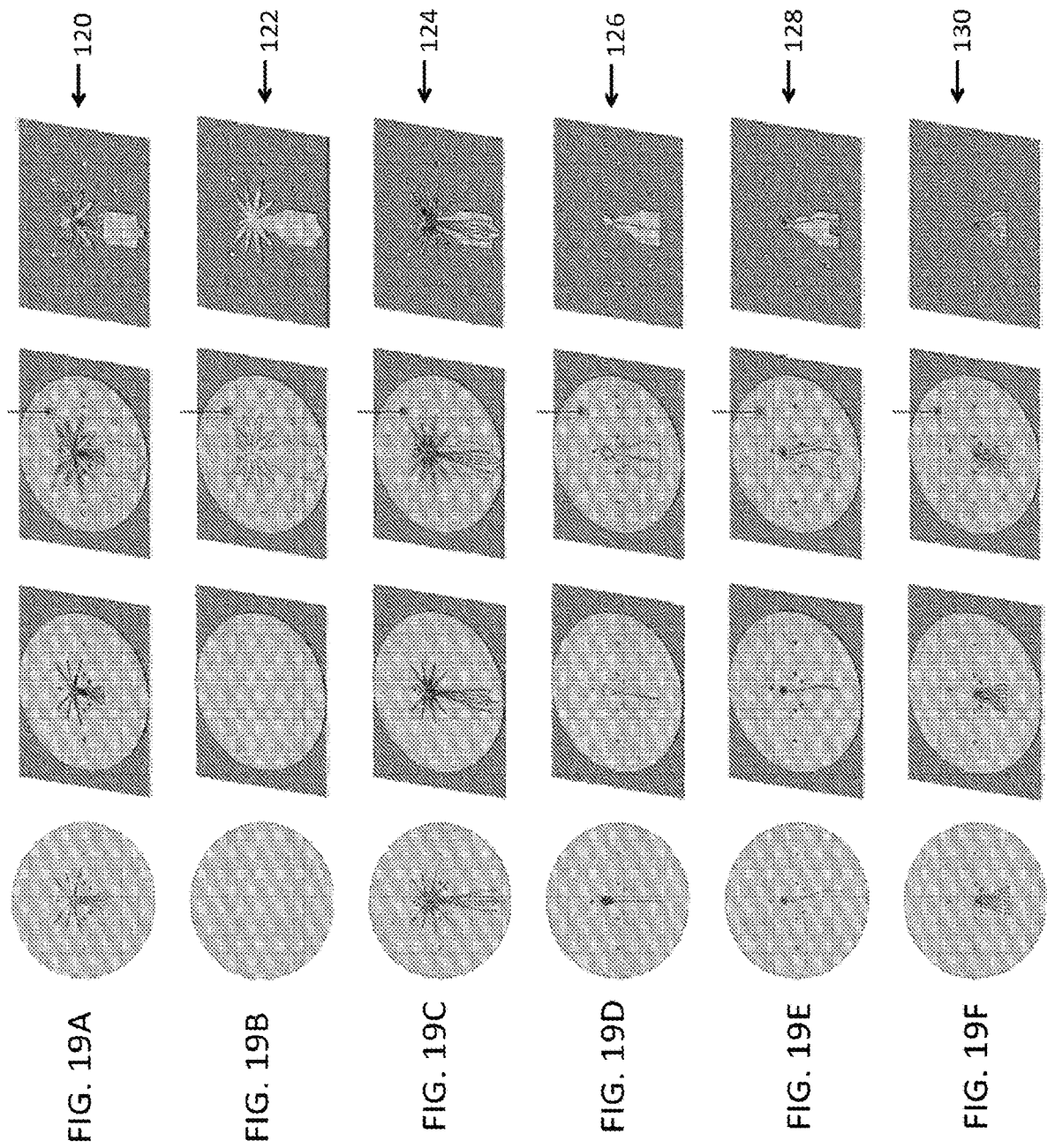
FIG. 19A-FIG. 19F illustrates an embodiment of a fabrication process of a plurality of layers forming a body sublaminate, composed of the legs sublaminate and head and eyes.

The embodiment of a peacock spider-inspired MORPH system is composed of 12 soft layers. There are two sublaminates (each composed of six soft layers). A first sublaminate is the body sublaminate as shown in FIG. 19A-19F, composed of the legs sublaminate and head and eyes. The fabrication process of the soft layers for the spider body sublaminate include a structural layer 120 for the legs (FIG. 19A), a blank layer 122 for the legs (FIG. 19B), an actuation layer 124 for the legs (FIG. 19C), a layer 126 for the head (FIG. 19D), a layer 128 for the eyes (FIG. 19E), and piping layer 130 (FIG. 19F). The second sublaminate is the abdomen sublaminate as shown in FIG. 20A-20F. The fabrication process of the soft layers for the spider abdomen sublaminate include a decoupling layer 140 (FIG. 20A), an abdomen layer 142 for an elevating actuator (FIG. 20B), a blank layer 144 for the abdomen (FIG. 20C), a flexing actuator layer 146 for the abdomen (FIG. 20D), DNA strand 1 layer 148 (FIG. 20E), and DNA strand 2 layer 150 (FIG. 20F). In some embodiments, each soft layer is individually manufactured using soft lithography and the thermally cured silicone elastomer is peeled off from the SU-8 patterned silicon wafer using an adhesive substrate or carrier. The substrate consists of a Gel-Pak 8 film, Gel-Pak, a flexible but not stretchable substrate material with a tacky surface to hold the layers during processing and/or assembly. Each layer is then covered with a transparent layer of polyester film (3.6 μm Mylar, Chemplex Industries, Inc.) to preserve cleanliness during laser machining and protect the silicone elastomer for storage. Subsequently, the elastomer is cut using a precision laser micromachining system according to a specific design pattern after alignment to fiducials defined during soft lithography. Alignment holes are laser cut through the carrier to be used for future pin alignment. The protective polyester film is removed right before the plasma treatment phase to expose the soft layer, achieve chemical surface functionalization, and bonding. Layers are realigned and bonded together using O2 plasma (35 W for 30 s) treatment (Pico BR PCCE 7", Diener electronic GmbH+Co. KG).

Figure 21A:
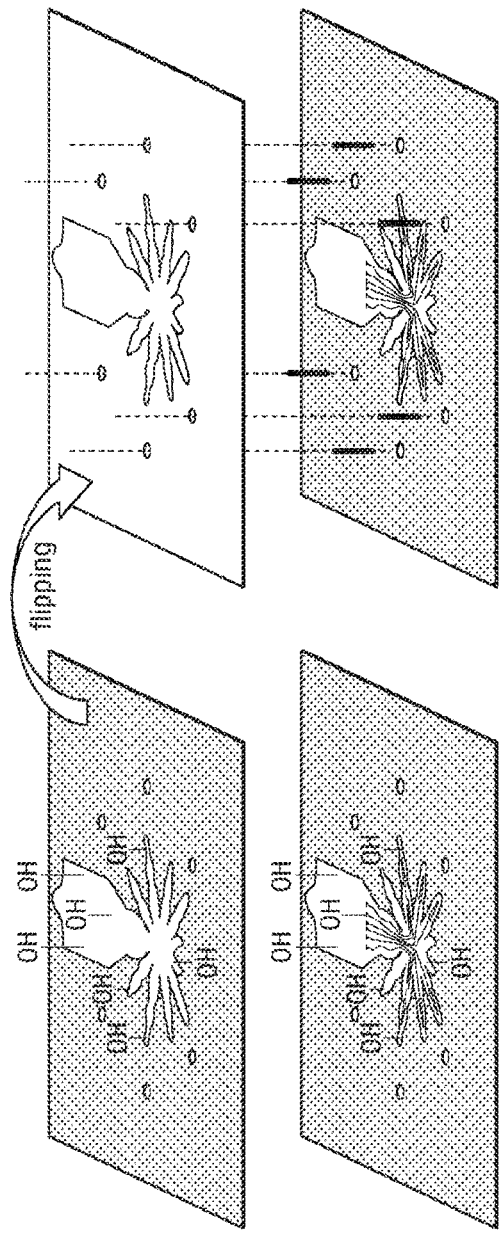
Figure 21B:
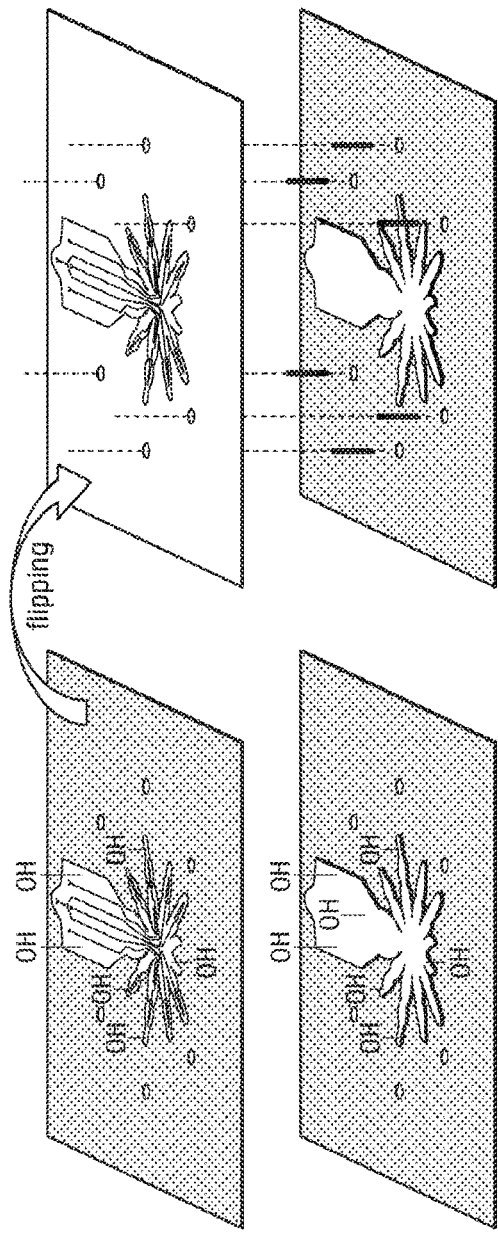
Figure 21C:
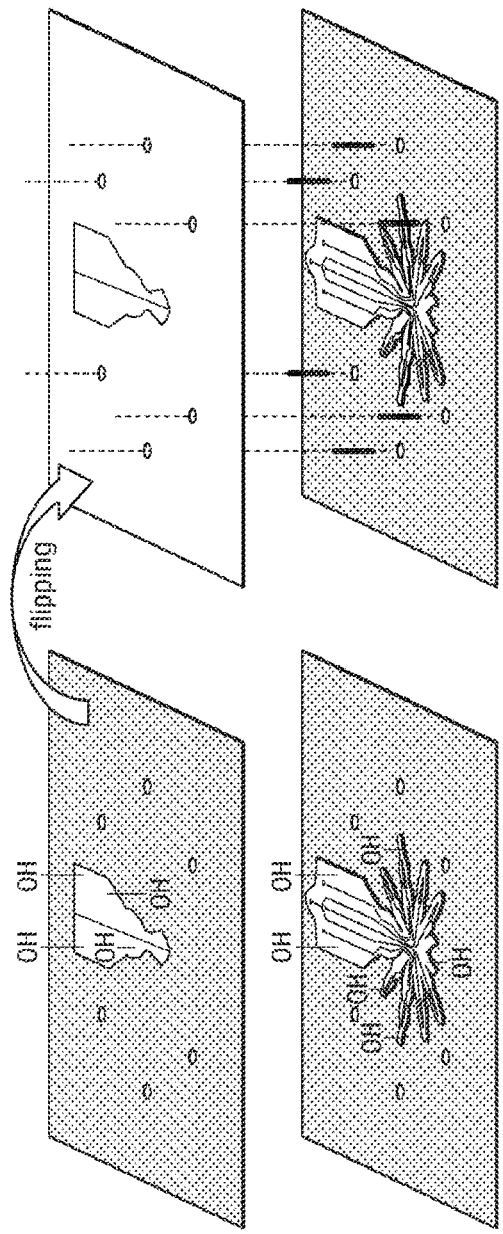
Figure 21D:
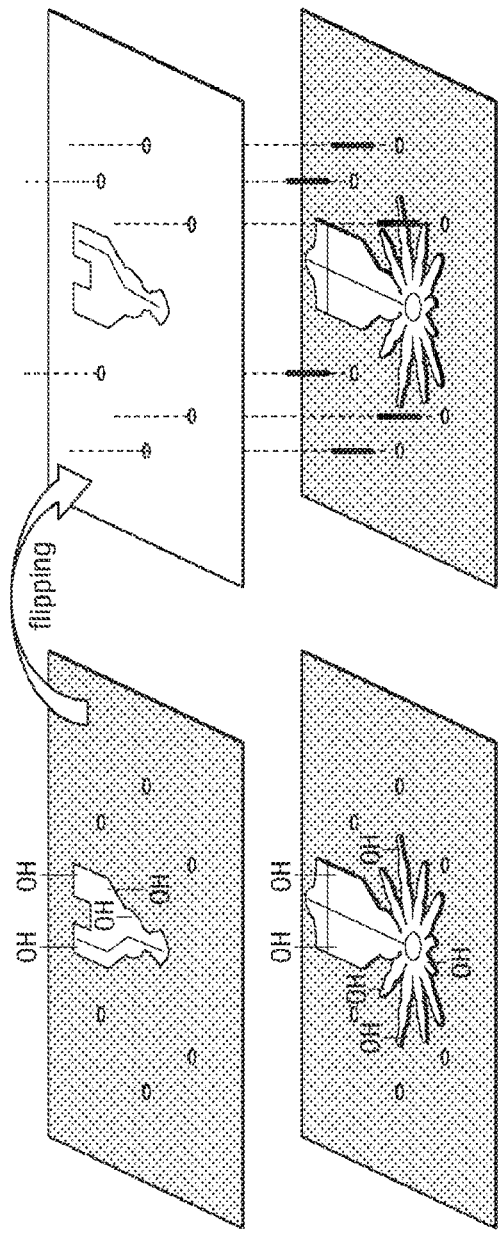
Figure 21G:
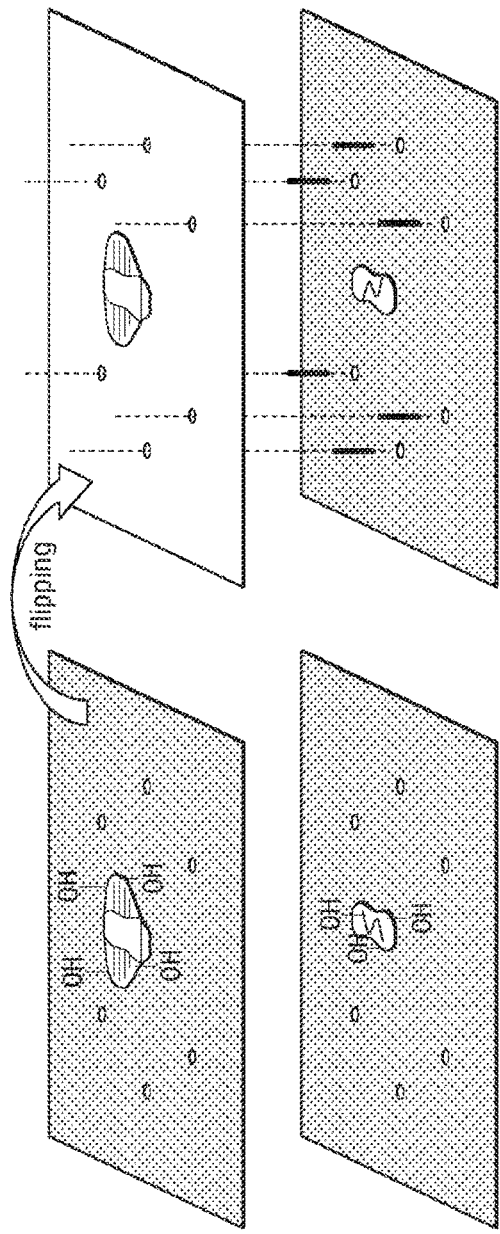
Figure 21H:
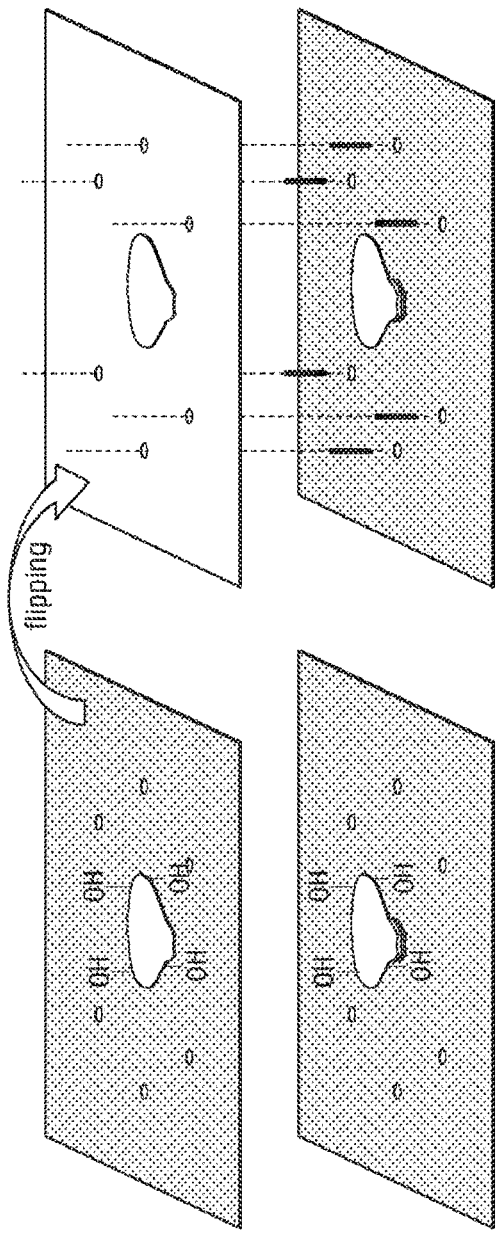
Figure 21I:
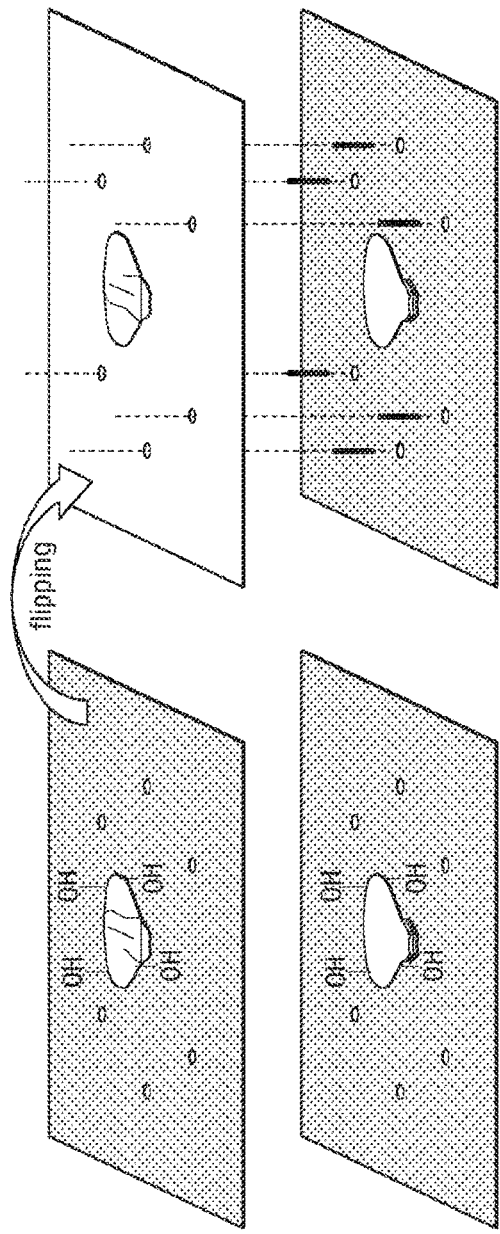
Figure 21J:
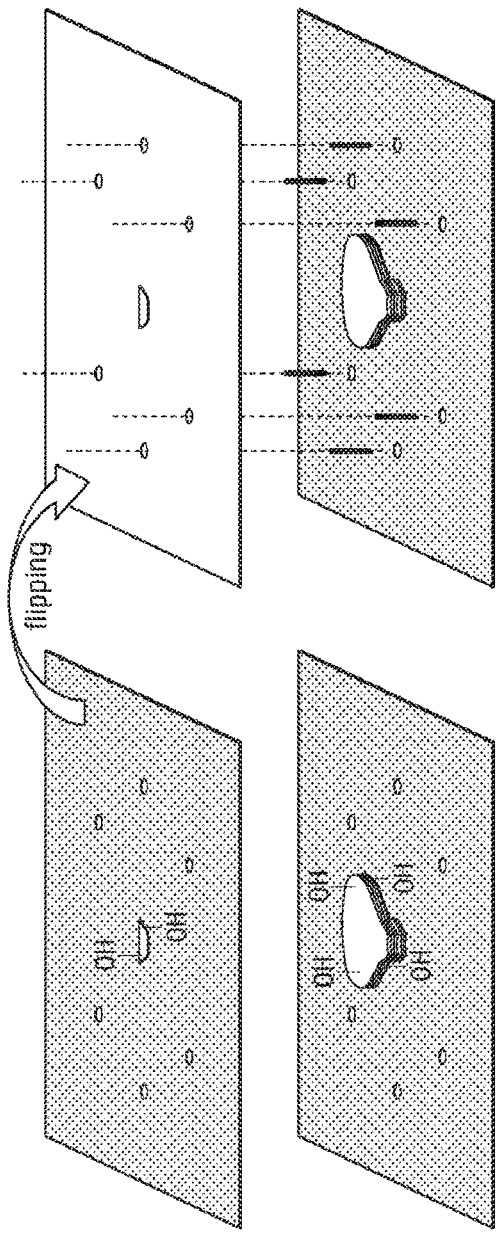
Figure 22:
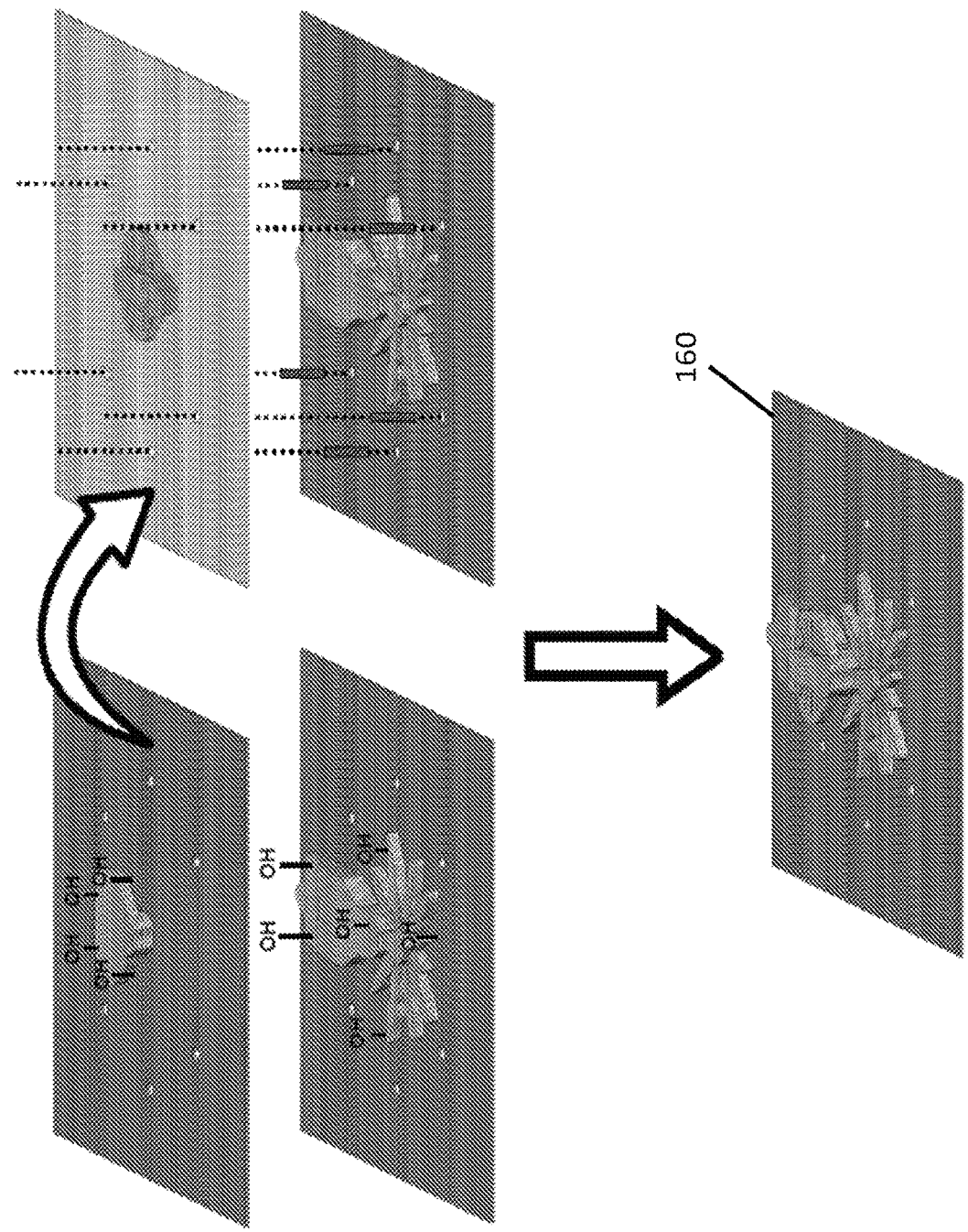
FIG. 22 is an embodiment of the assembly of the sublaminates to form a microstructure using oxygen plasma treatment.

The bonding sequence for the peacock spider is illustrated in FIG. 21A-FIG. 21J. For the body of the spider (FIG. 21A-21E), the bottommost is the actuation layer for the legs that is assembled together with the legs blank layer (FIG. 21A). Subsequently, a structural layer for the legs (FIG. 21B), head (FIG. 21C), eyes (FIG. 21D), and piping layers (FIG. 21E) follow. As regards to the abdomen layers (FIG. 21F-21J), the topmost is the DNA strand layer that is assembled together with another DNA strand layer (FIG. 21F) to form a double DNA helix (for example, that is merely decorative, and can be any image, logo, etc., and can be an optional decorative layer to the microstructure). Subsequently, abdomen flexing actuator (FIG. 21G), abdomen blank (FIG. 21H), abdomen elevating actuator (FIG. 21I), and decoupling layers (FIG. 21J) will follow. As a last step, the body and abdomen sublaminates are assembled together to form a soft microstructure 160 following the same procedure described above (FIG. 22). The microstructure such as the spider can be designed with a modular approach so that the various sublaminates can be assembled separately and then bonded together at the end to ease the fabrication process and guarantee a higher manufacturing yield.

Figure 23:
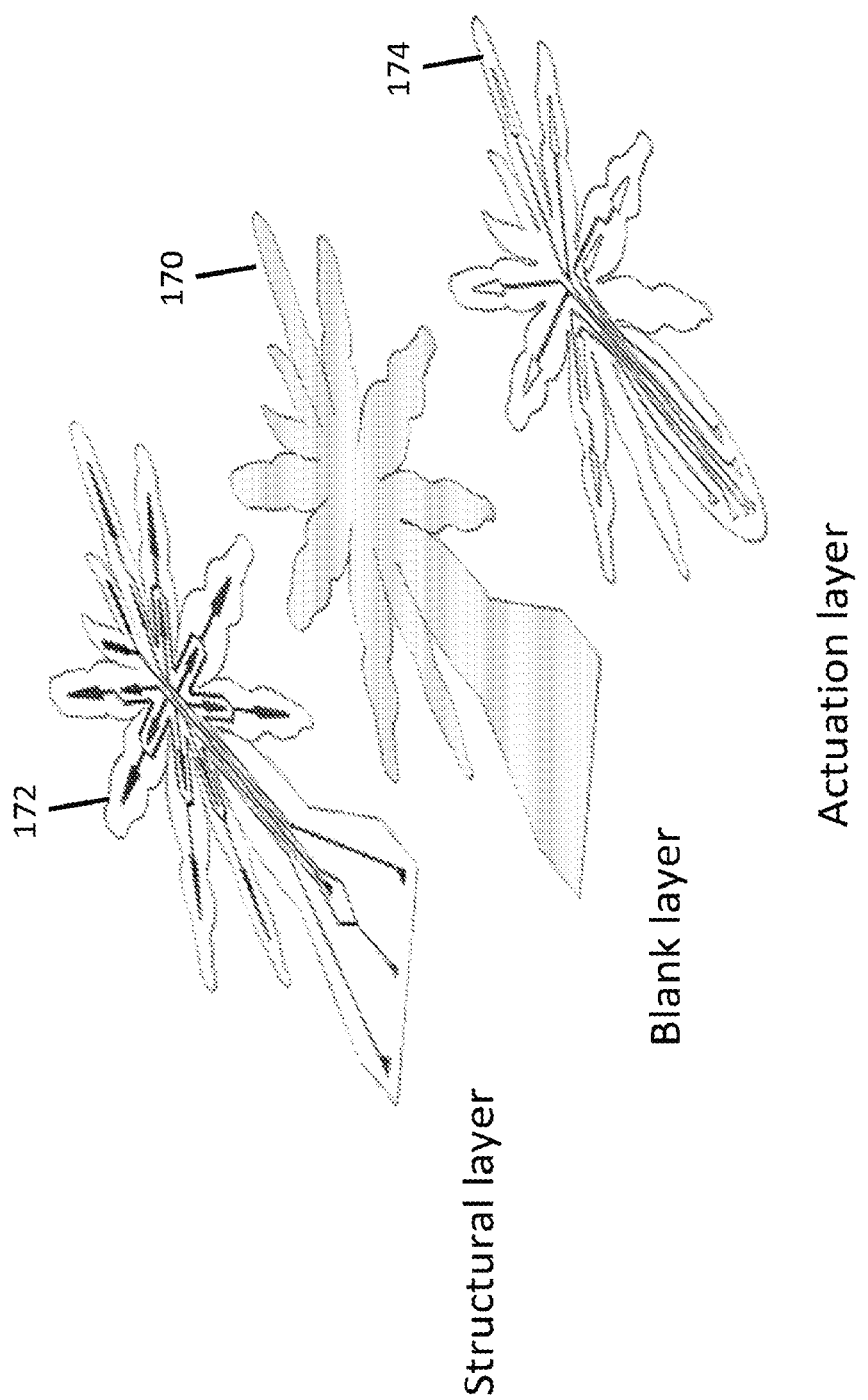
FIG. 23 and FIG. 24 illustrate an embodiment of various layers of a microstructure forming a leg portion of a microstructure in the form of a spider.
Figure 24:
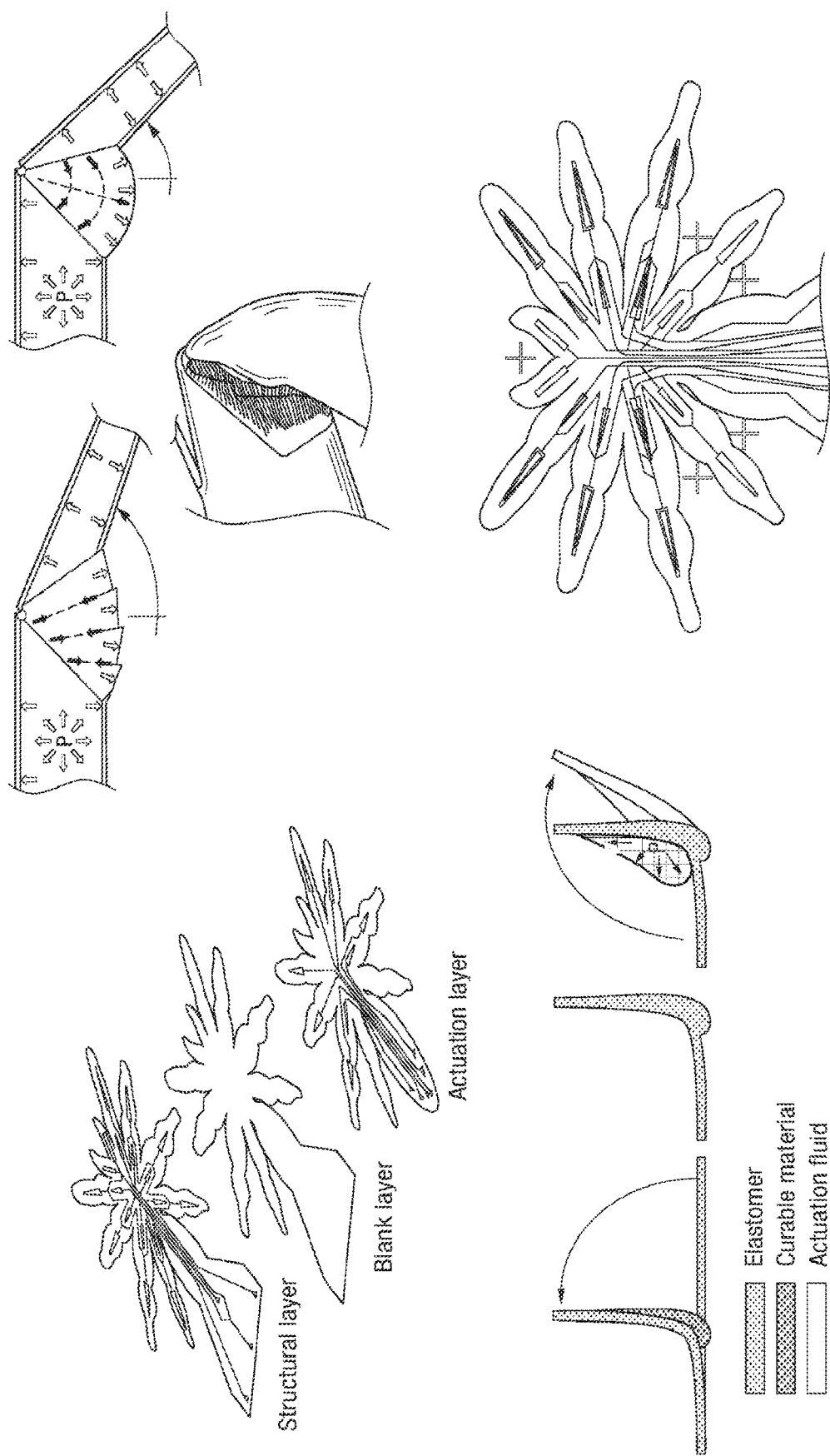
Figure 25:
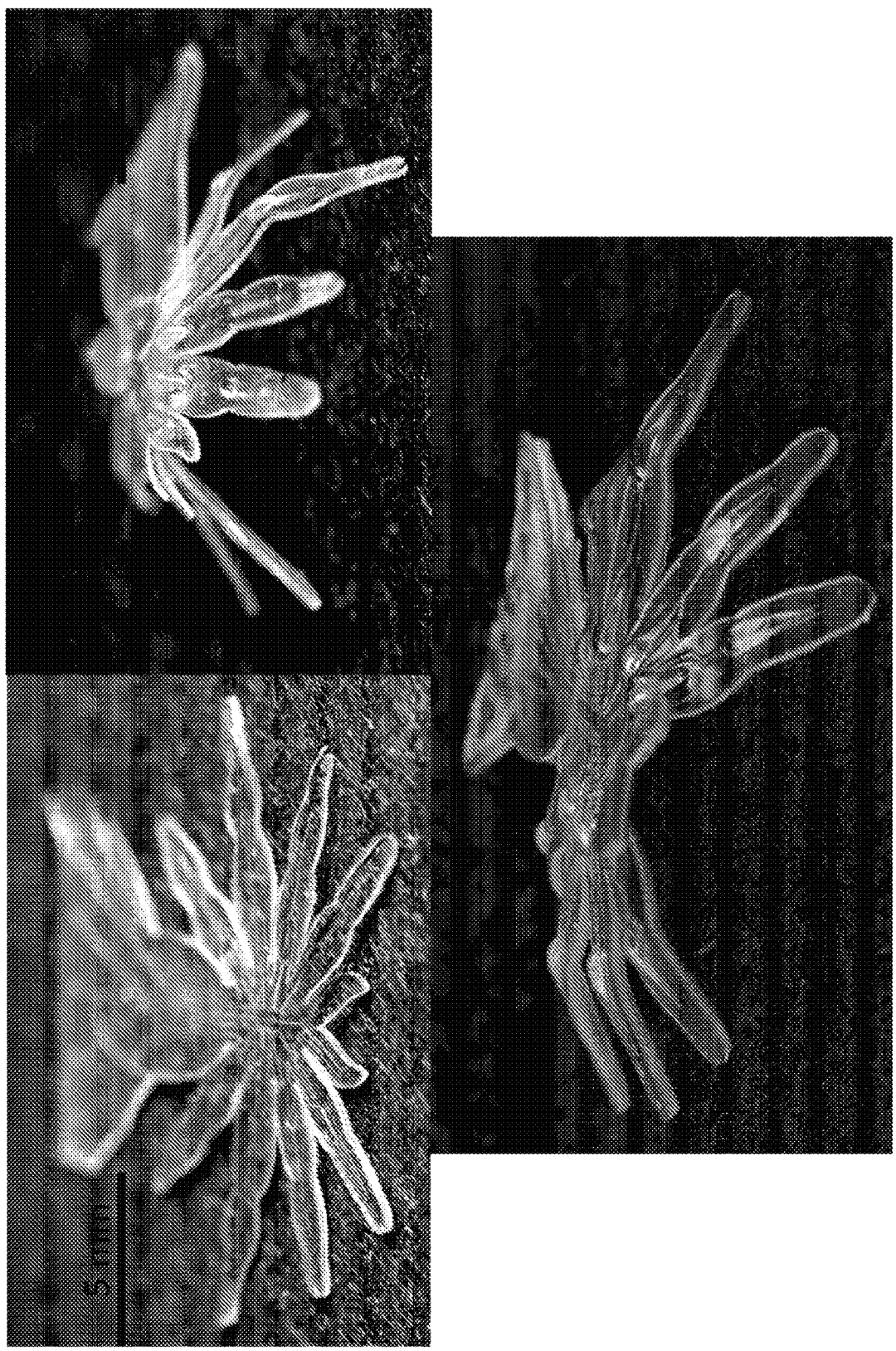
Figure 28:
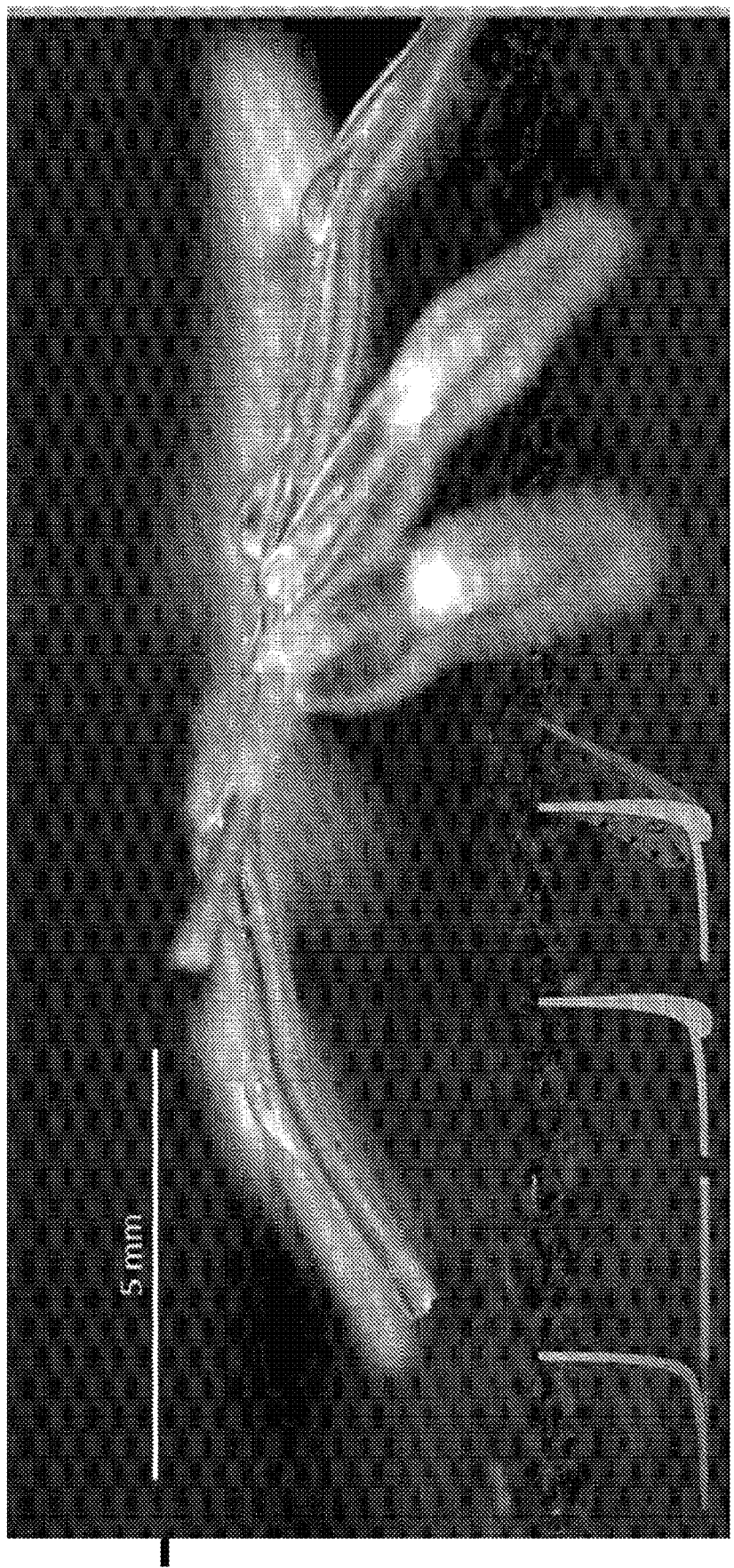
Figure 30B:
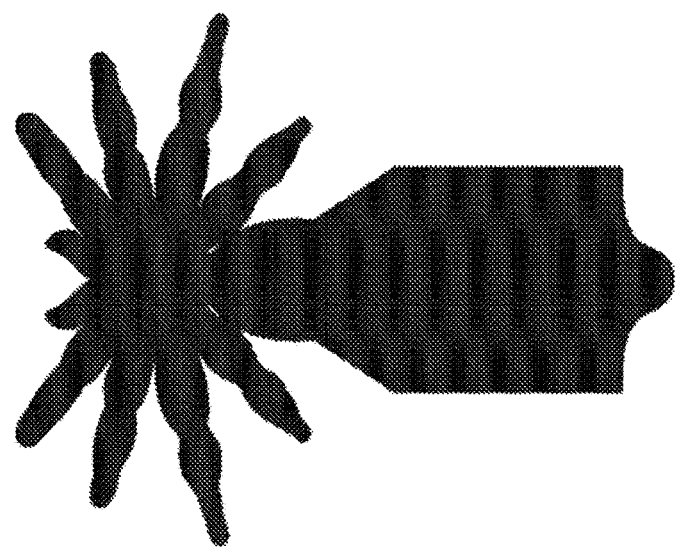
Figure 30A:
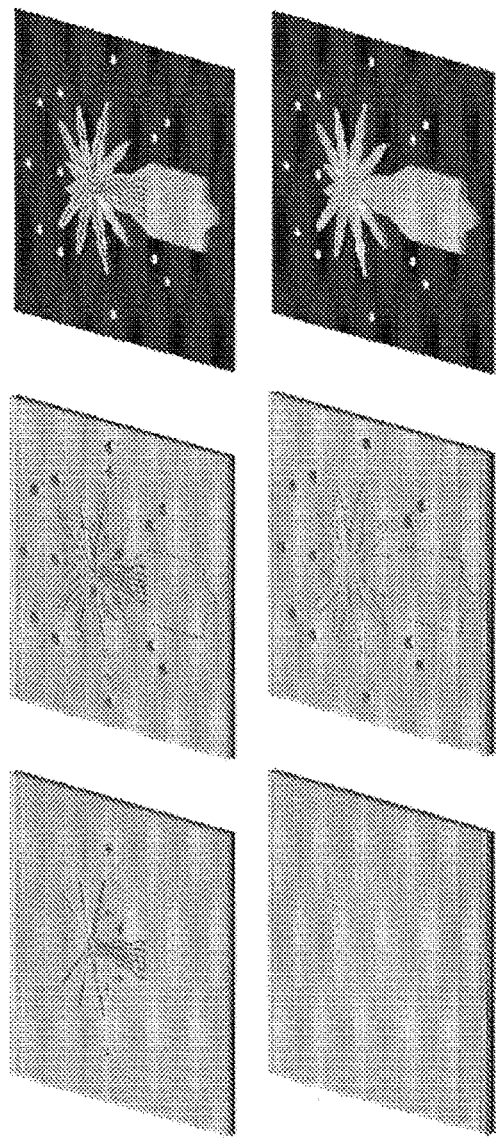
Figure 31B:
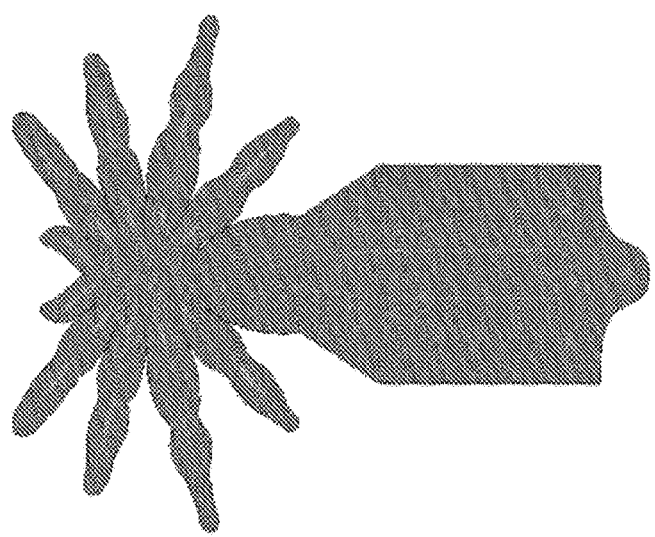
Figure 31A:
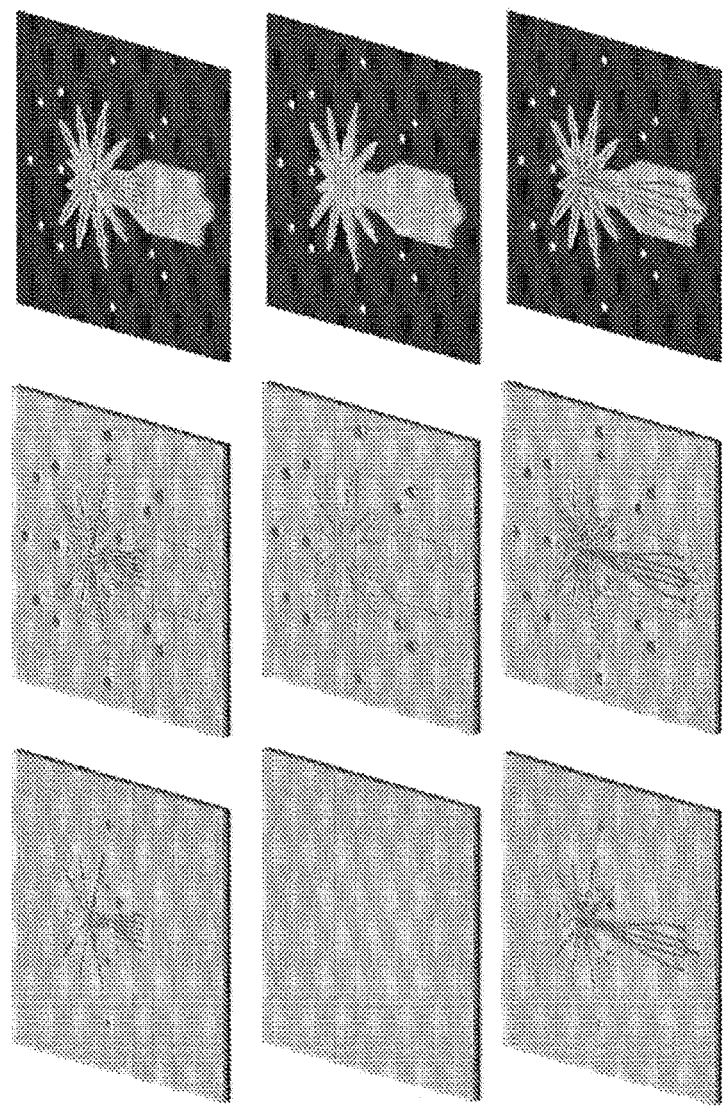

The layers of the microstructure that form the leg portion are shown in more detail in FIG. 23 and FIG. 24, which illustrates a structural layer 172, a blank layer 170, and an actuation layer 174 of the microstructure 160. FIG. 24 illustrates movement of a "leg" of the microstructure 160 using curable material to self-fold the 2D structure into a 3D structure, and an actuation fluid to actuate the 3D structure to provide movement to the "leg" of the microstructure. The "legs" of the microstructure include a plurality of channel therein in both the structural layer and the actuation layer. The channels formed in the structural layer are configured to receive a fluid, such as a curable material, to allow the microstructure to self-fold into a 3D microstructure. FIG. 25, FIG. 26, FIG. 27, and FIG. 28 illustrate a variety of views of the microstructure in 2D and in 3D after the structural layer has been injected with a material to fold the microstructure into its 3D form. The channels formed in the actuation layer are configured to receive an actuation fluid that is used to move the "leg" of the 3D microstructure. The actuation fluid can be any fluid that can be injected into the channel, including but not limited to water. A more detailed view of fabrication of the layers of the "legs" of the microstructure as shown in FIG. 19A-19F are shown in FIGS. 29A-B, FIGS. 30A-B, and FIGS. 31A-B. FIG. 29A illustrates the fabrication workflow of the actuation layer 174, and includes channels formed there for receiving a fluid to actuate the 3D microstructure. FIG. 29B illustrates a top view of the actuation layer of FIG. 29A. FIG. 26 and FIG. 27 illustrate exemplary views of the 3D microstructure as fluid is injected into the actuation layer to allow the microstructure to move. Injecting actuation fluid into different channels in the actuation layer allows control and movement of different portions of the microstructure, for example, different "legs" thereof. FIG. 30A illustrates the fabrication workflow of the decoupling layer positioned between the actuation layer 174 and the structural layer 172, and includes an outline of the shape formed in the actuation layer. FIG. 30B illustrates a top view of the decoupling layer of FIG. 30A. FIG. 31A illustrates the fabrication workflow of the structural layer 172, and includes channels formed therein for receiving the injected fluid, such as the curable material, to allow the microstructure to self-fold into a 3D microstructure. FIG. 31B illustrates a top view of the structural layer of FIG. 31A.

Figure 32A:
FIG. 32A is an exemplary embodiment of "legs" of a microstructure after injection of the structural actuators and functional actuators.

FIGS. 32A-32D illustrate another embodiment of the leg sublaminate, which is a three-layer laminate with two sets of actuators: one embedded on the top and one on the bottom layer. Due to their relative positions, the actuators on the first and third layers act antagonistically. For example, actuators on the first layer bend the legs up, while actuators on the third layer bend the legs down. The third layer can be injected with phase-changing material, permanently deforming the legs into a bent configuration. By actuating the first layer, pressurized fluid at the joints forces the legs into a straight configuration (FIG. 32A). When the pressure is relieved, the legs return to the bent configuration. This actuation strategy can mimic the biomechanics of an actual spider, whose legs are bent when not actively being straightened by internal turgor pressure, as is the case for the curled legs of a dead spider.

Figure 35B:
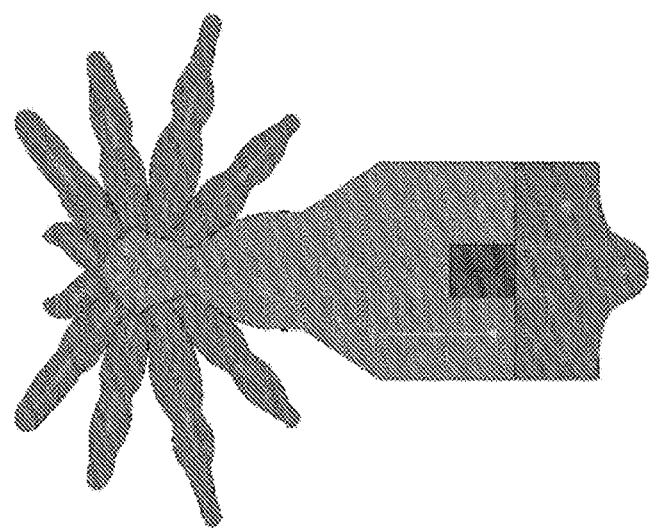
Figure 35A:
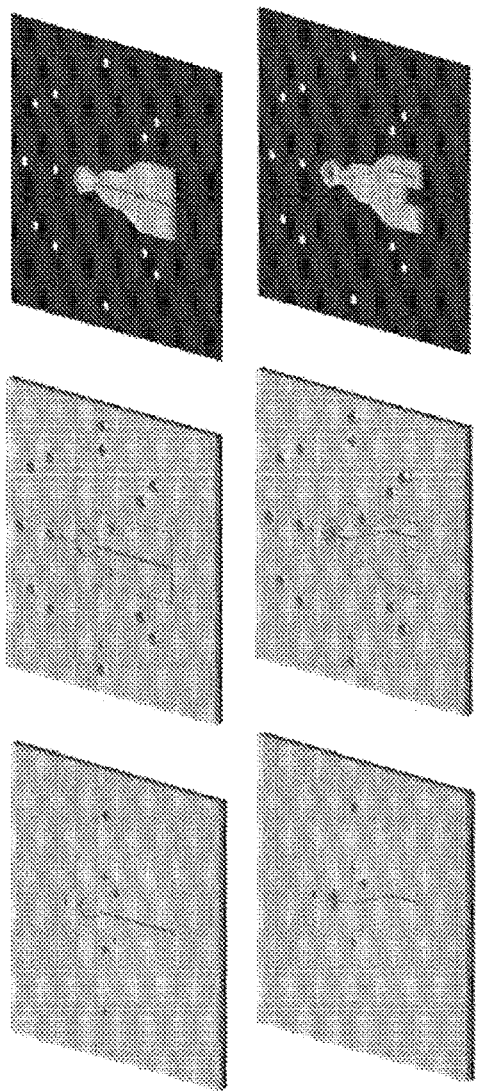

The layers of the microstructure that form the head and eye portion as shown in FIG. 19A-19F are shown in FIG. 33, FIG. 34A, FIG. 34B, FIG. 35A, and FIG. 35B, which illustrate a structural layer and a blank layer of the microstructure. FIG. 33 illustrates an embodiment of the microstructure of the head and eyes after the use of curable material to self-fold the 2D structure into a 3D structure. FIG. 34A illustrates a structural layer of the head portion of the microstructure, and includes a channel formed therein for receiving a material, such as the curable material, to fold the microstructure into a 3D form. FIG. 34B illustrates a top view of the structural layer in FIG. 34A. FIG. 35A illustrates the structural layer of the head portion of the microstructure, and a second structural layer of the eye portion of the microstructure that includes a plurality of channels formed therein relating to the "eyes" of the microstructure. Curable material injected into the "head" structural layer self-folds the microstructure such that the head forms a dome shape, as shown in FIG. 36. FIG. 35B is a top view of the layers in FIG. 35A. This change in structure of the "head" from a flat 2D structure to a 3D dome causes a change in the dimension of the channel in the "eye" structural layer due to the deformation of the "head" structural layer. Thus, a first layer of the microstructure can self-fold into a 3D structure, which can cause a change in the shape and thus the resistance in channel formed in other structural or actuation layers of the microstructure. This allows the self-folding of the microstructure to controllably change the resistance in the channels formed in various layers of a microstructure.

Figure 32B:
FIG. 32B is an exemplary embodiment of the "head" and "eyes" of a microstructure.

As explained above, the middle sublaminate contains the head and eyes. These layers collectively demonstrate the ability to achieve hierarchical structures, as the eyes are further deformations on an already deformed head. The deformation induced in the head layer leads to a change in the geometry of the channels laying on top of it (FIG. 32B).

Figure 32C:
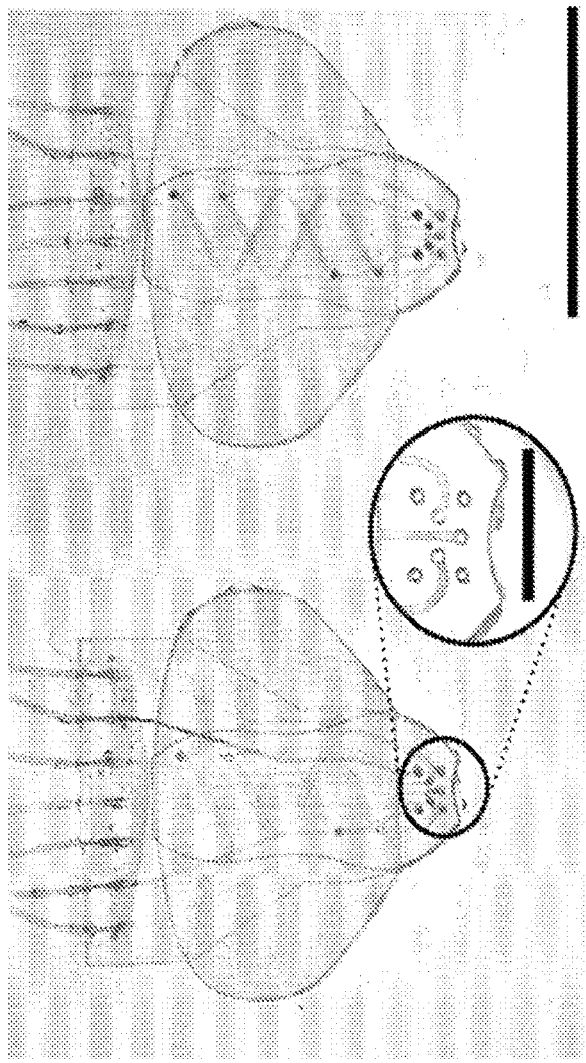
FIG. 32C is an exemplary embodiment of the "abdomen" of a microstructure.
Figure 37:
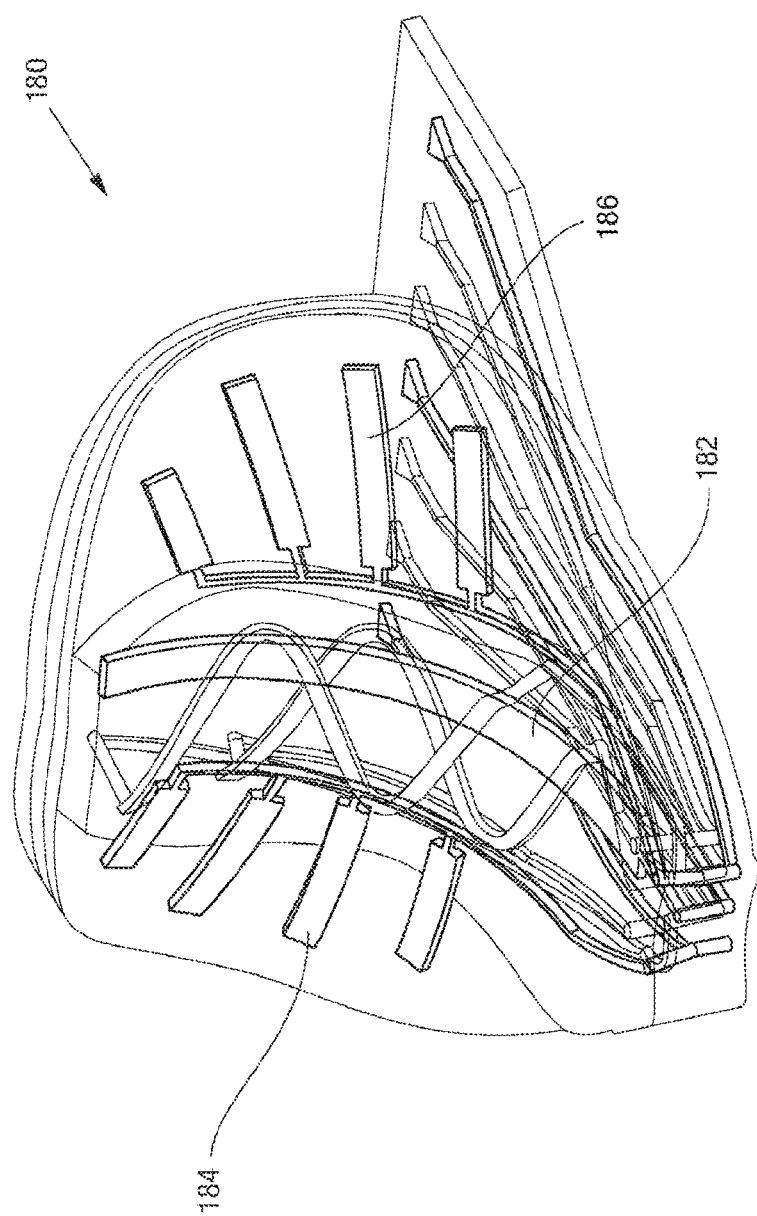
FIG. 37 is an exemplary embodiment of actuation in an "abdomen" of a spider microstructure.
Figure 38:
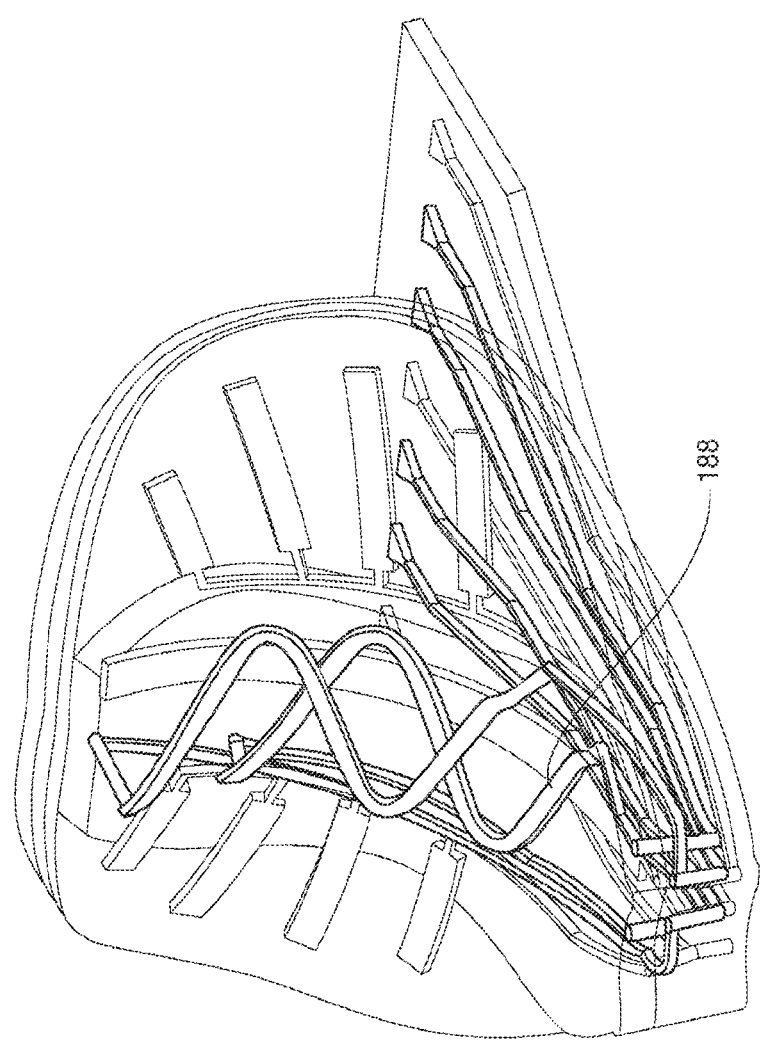
FIG. 38 is an exemplary embodiment of use of a microfluidic circuit in a spider microstructure.

The topmost sublaminate is the abdomen. This sublaminate highlights multiple functionalities, including multilayer fluid handling of a microfluidic circuit, different colored fluid patterns, and coordinated bending actuation that results in a structure with negative Gaussian curvature. In this structure, the use of laser cutting on top of channels embossed in the soft layers can be used to allow flow across the laminate. Mimicking the behavior of the peacock spider, three sets of independent actuators are responsible for the abdomen movement. As shown in FIG. 37, one elevating actuator 182 raises the abdomen 180 from a flat to a lifted configuration, and two flexing actuators 184, 186 bend the abdomen 180 outwards. To demonstrate colored fluid patterns and imitate the colorful abdomen of the animal, a DNA double helix (as shown in FIG. 32C) is integrated on top of this sublaminate and colored fluid is injected through the 3D network of channels 188 created by the combination of laser cut vias and microfluidic channels (FIG. 38). The circuit is designed to be open and double-ended, to demonstrate the possibility of continuously exchanging colors. As explained above, this is merely an optional decorative addition to the microstructure, and can in the form of an image that can be created by the channels.

Figure 46:
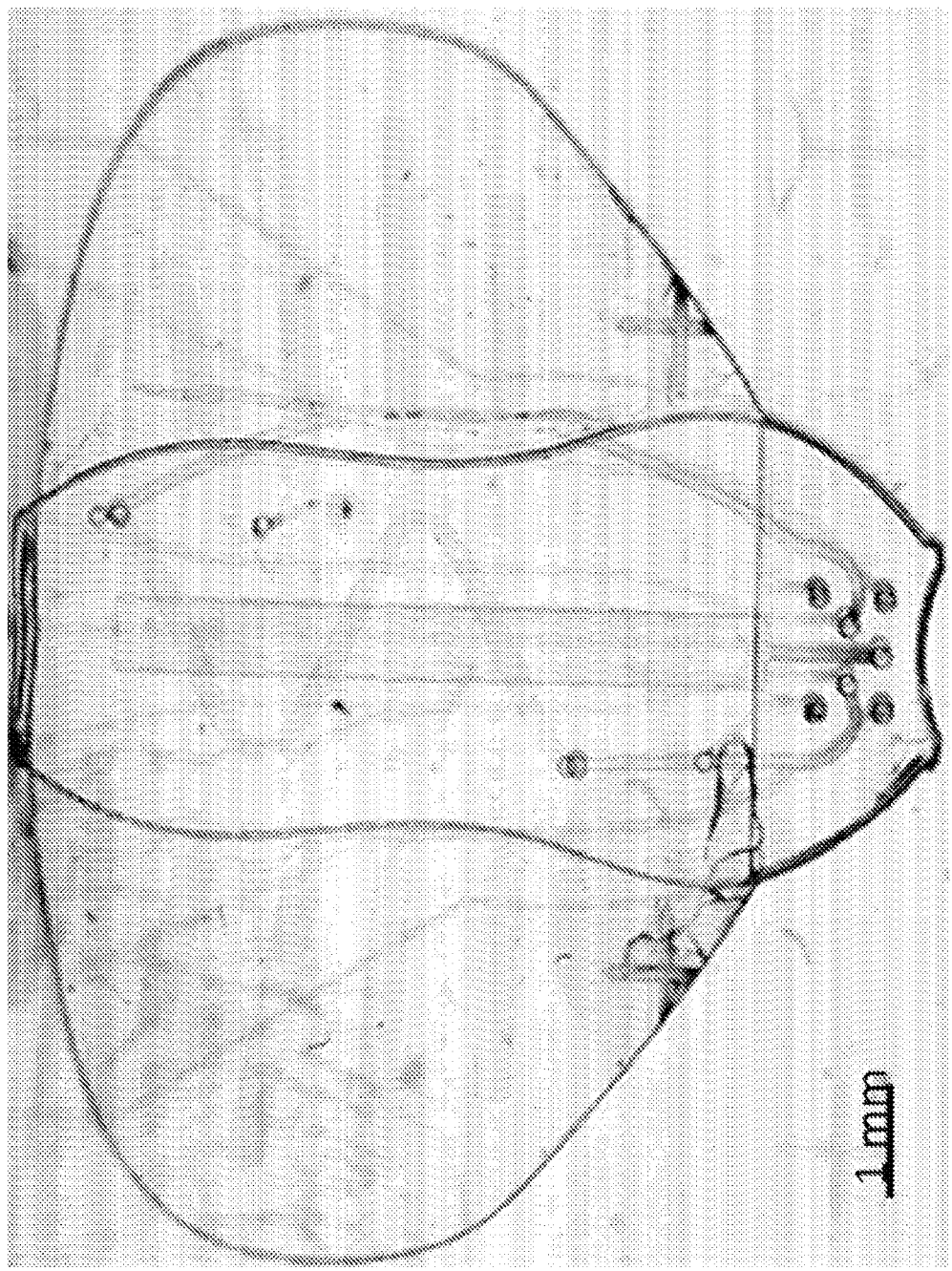
FIG. 46, FIG. 47, and FIG. 48 illustrate an embodiment of a microstructure in the form of a spider.
Figure 47:
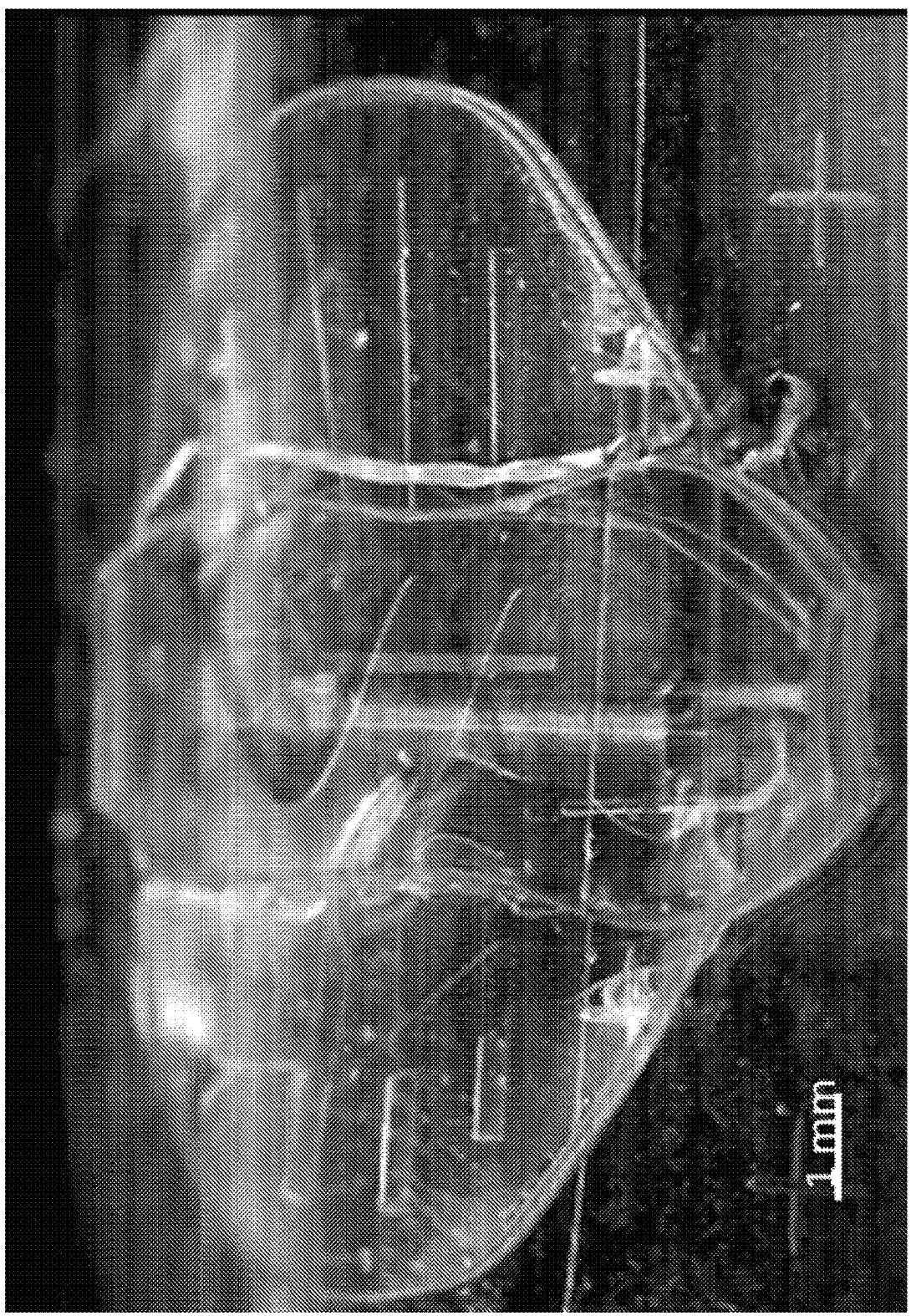
Figure 48:
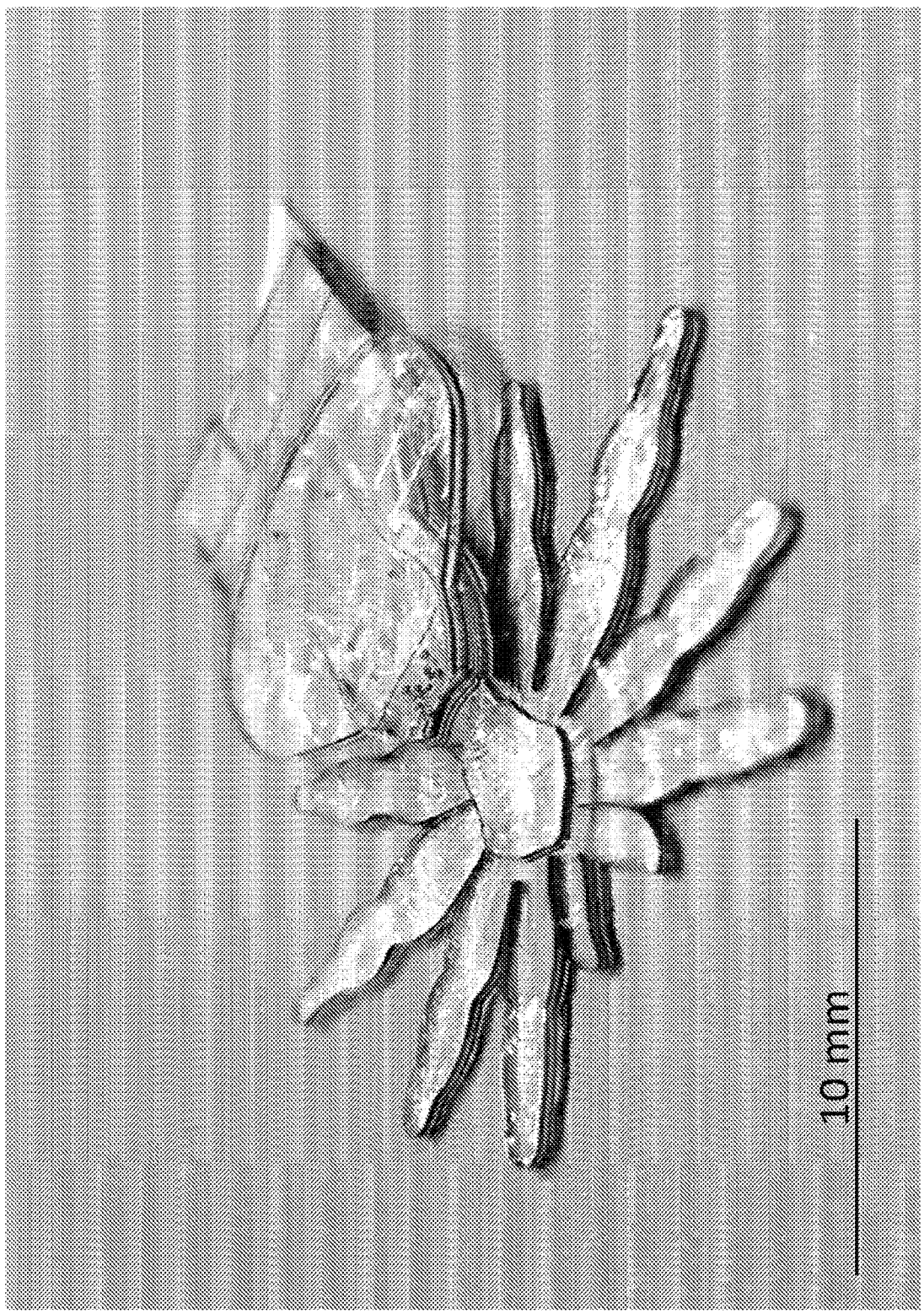

The layers of the microstructure that form the abdomen portion of the microstructure are also shown in FIGS. 39A-B, FIGS. 40A-B, FIGS. 41A-B, FIGS. 42A-B, FIGS. 43A-B, FIGS. 44A-B, and FIGS. 45A-B, with the complete microstructure shown in FIG. 46, FIG. 47, and FIG. 48. A top view of a structural layer 190 is shown in FIG. 39A, that includes a plurality of channels configured to couple to channels formed in upper layers. A side view of the structure layer is shown in FIG. 39B. A top view of a decoupling layer 192, shown in FIG. 40A, is disposed over a portion of the structural layer 190, as seen in the side view of the layers shown in FIG. 40B. An actuator layer 194 is positioned over the decoupling layer, as shown in the top view of the layers in FIG. 41A, and includes channels formed therein that are configured to lift a "tail" portion of the spider microstructure. A side view of the way in which the layers are stacked is shown in FIG. 41B. A blank layer 196, shown in the top view of the layers in FIG. 42A, is positioned over the actuator layer of FIG. 41A. A side view showing the way in which the layers are stacked is shown in FIG. 42B.

FIG. 42A shows the blank layer that separates the actuation layer shown in FIG. 41A and an actuation layer 198 shown in FIG. 43A. This layer also features a plurality holes that allow fluid to travel between layers. A side view showing the way in which the layers are stacked is shown in FIG. 43B.

FIG. 43A shows the second actuator layer 198 in the abdomen portion of the microstructure (the first actuator layer being that shown in FIG. 41A). Whereas the actuator layer 194 of FIG. 41A lifts the "tail", the actuator layer 198 of FIG. 43A bends the two sides of the "tails" in a direction perpendicular to the direction of the lifting. This layer also features a plurality holes that allow fluid to travel between layers.

FIG. 44A shows a visualization layer 200. As the penultimate layer in the laminate, colored liquid that passes through the wide microchannel in this layer are visible. The colored liquid is passed to this layer via the holes in the preceding layers (FIGS. 39-43). This layer also features a plurality holes that allow fluid to travel between layers. A side view showing the way in which the layers are stacked is shown in FIG. 44B.

FIG. 45A shows a second visualization layer 202. As the final layer in the exemplary laminate, colored liquid that passes through the wide microchannel in this layer are visible. The colored liquid is passed to this layer via the holes in the preceding layers (FIGS. 39-44). A side view showing the way in which the layers are stacked is shown in FIG. 45B.

In some embodiments, visualization layers can have a variety of functions in a microstructure. In some embodiments, one or more visualization layers can add visual aesthetics to a microstructure. For example, on the bioinspiration side, they can mimic to some degree the colorful nature of the exemplary microstructure modeled after a peacock spider (as shown in FIGS. 39-44) as colored liquid can be passed through the channels in the visualization layers, and the colored liquid can be visible to the naked eye (as shown in FIG. 47). In an embodiment, the visualization layers can assist in demonstrating fluid interaction between the different layers of a microstructure. For example, as shown in FIG. 18, fluid in the layer named "DNA strand 1" (as shown in FIG. 18 and FIG. 45) is injected in the "Channels layer" (as shown in FIG. 18 and FIG. 39), which is a full six layers below. In the intermediate layers, the fluid travels vertically between layers (via holes) and horizontally within layers (via channels). Thus, the visualization layers demonstrate that the microstructure can achieve non-trivial fluid handling. In some embodiments, if the visualization layers ("DNA strand 1" layer as shown in FIG. 45A and "DNA strand 2" layer as shown in FIG. 44A) stand in for some generic multilayer microfluidic circuit, it can be demonstrated that microfluidic action can be achieved in a transformed plane, as a historically 2D system (microfluidics) is being transformed into a new geometric structure. As such, the visualization layers can show the way in which fluid can move around in the transformed structure.

FIG. 46, FIG. 47, and FIG. 48 show the fabricated microstructure. FIG. 46 and FIG. 47 show the final tail section of the exemplary microstructure. FIG. 48 shows the complete fabricated microstructure before the structural layers have been injected with a curable material. This multilayer laminate consists of structural layers, actuator layers, and visualization layers.

Figure 32D:
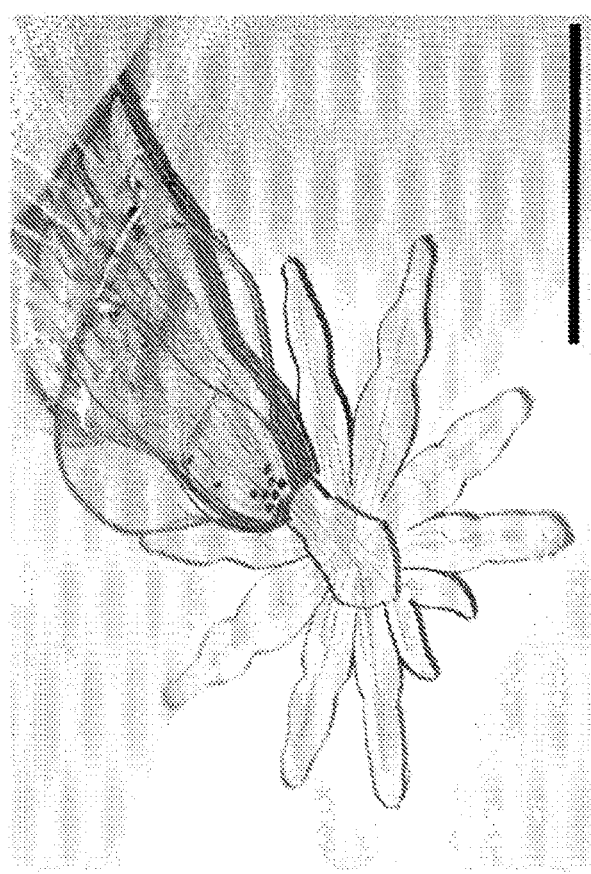
FIG. 32D is an exemplary embodiment of an assembled microstructure of a spider.
Figure 49A:
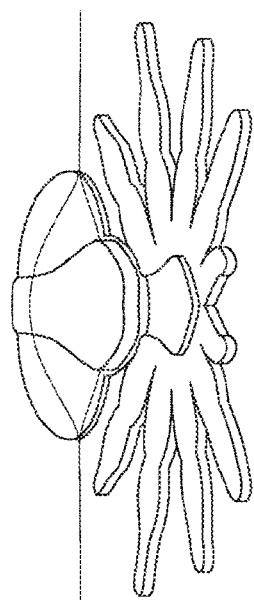
FIG. 49A, FIG. 49B, FIG. 49C, FIG. 49D, FIG. 49E, FIG. 49F, and FIG. 49G illustrate an embodiment of a sequence of injections for assembly and actuation of a microstructure.
Figure 49B:
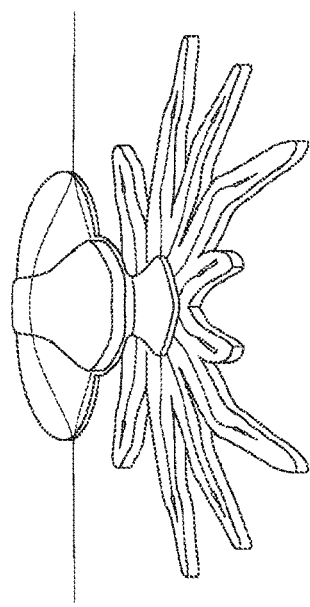
Figure 49C:
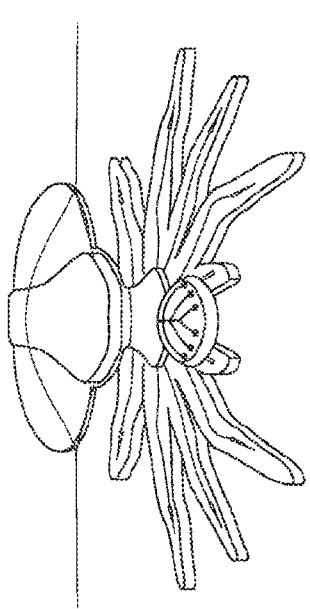
Figure 49D:
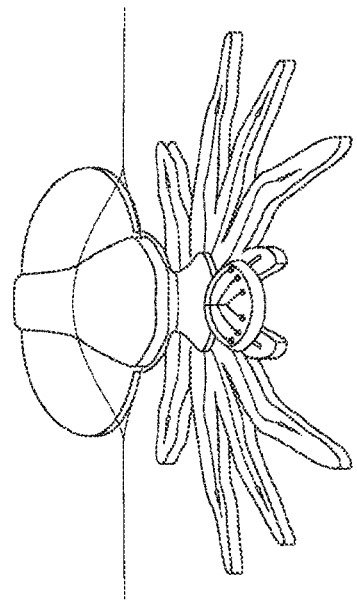
Figure 49F:
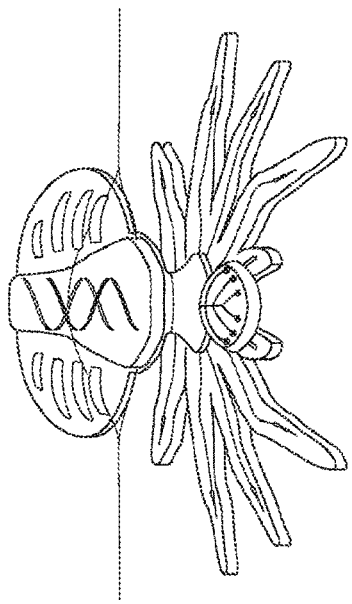
Figure 49E:
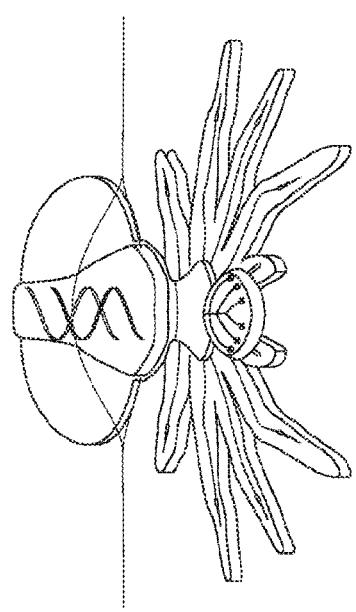
Figure 49G:
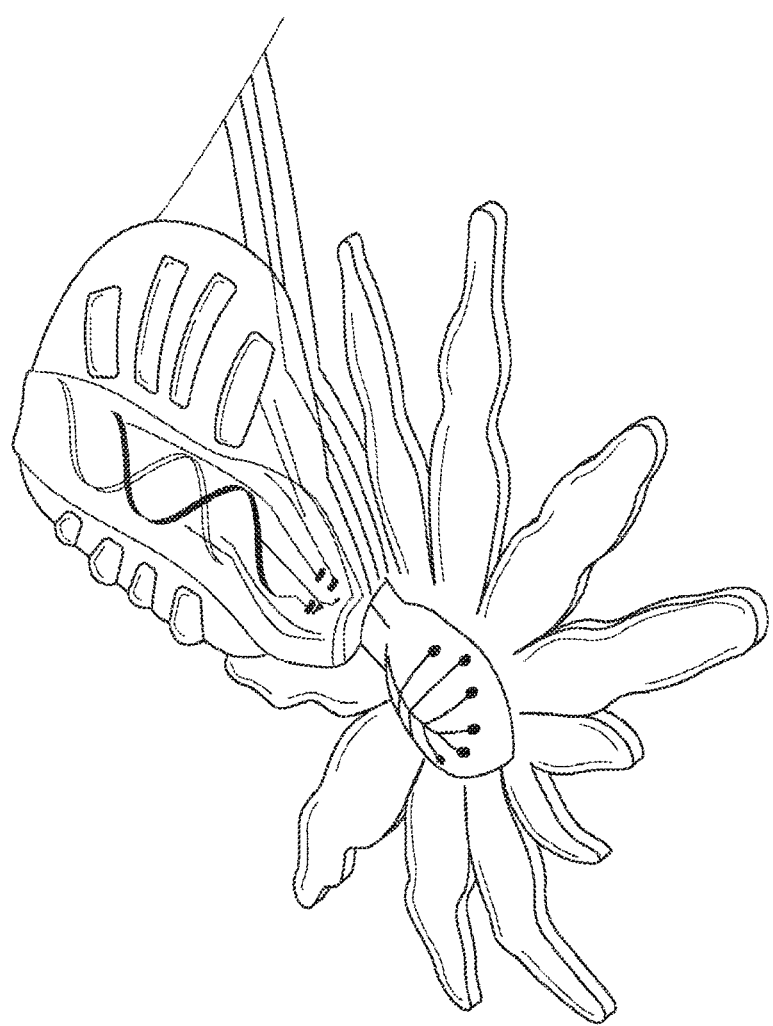

When assembled together, the three sublaminates (along with the optional additional layers, such as the visualization layers) make up a full MORPH system composed of 12 layers individually cut and collectively assembled (FIG. 32D). The device has nine independently controllable DoFs and five structural DoFs. The sequence of injection of the structural DoFs is shown in FIG. 49A-49G. FIG. 49A illustrates a flat configuration of the microstructure. FIG. 49B illustrates the legs after structural DOF inflation. FIG. 49C illustrates injection of the head and fluid in the eyes. FIG. 49D illustrates actuation of the abdomen, FIG. 49E illustrates dyed fluid added to the circuit for coloring the device, and FIG. 49F illustrates actuation of the abdomen. FIG. 49G illustrates an isometric view of the microstructure with the abdomen DoFs active. The size of the microstructure can vary. For example, the overall size of the device is 25 mm in width and the minimum feature size is 40 μm (height of the microfluidic channels). The thickness of the soft laminate in the flat configuration is ≈2.8 mm and the spider reaches a height of ≈20 mm upon injection of phase-changing materials in the leg sublaminate and injection of the abdomen elevating actuator. Structurally, this fully-3D multi-material soft system features an intricate profile and internal geometry consisting of feature sizes that, taking advantage of the scalability of soft lithographic techniques, can extend to the nanoscale. Functionally, the spider is highly reconfigurable, with nine individual DoFs to control motion in multiple distinct directions, and incorporates a multilayer microfluidic circuit with a 3D channel network that can be used to perform electrically-analogous fluidic computation.

Thus, it is possible to form microfluidic channels in one or more layers of a microstructure. The microfluidic circuitry is configured to actively reorient themselves in response to the self-folding of the 2D microstructure into a 3D microstructure. It will be understood that the overall size of the device can vary, along with the number of degrees of freedom and layers thereof depending on the application intended for a microstructure.

While various embodiments have been described for purposes of this disclosure, such embodiments should not be deemed to limit the teaching of this disclosure to those embodiments. Various changes and modifications may be made to the elements and operations described above to obtain a result that remains within the scope of the systems and processes described in this disclosure. All patents, patent applications, and published references cited herein are hereby incorporated by reference in their entirety. It should be emphasized that the above-described embodiments of the present disclosure are merely possible examples of implementations, merely set forth for a clear understanding of the principles of the disclosure. Many variations and modifications may be made to the above-described embodiment(s) without departing substantially from the spirit and principles of the disclosure. It will be appreciated that several of the above-disclosed and other features and functions, or alternatives thereof, may be desirably combined into many other different systems or applications. All such modifications and variations are intended to be included herein within the scope of this disclosure, as fall within the scope of the appended claims.

The described embodiments are to be considered in all respects only as illustrative and not restrictive and the scope of the presently disclosed embodiments is, therefore, indicated by the appended claims rather than by the foregoing description. All changes which come within the meaning and range of equivalency of the claims are to be embraced within their scope. Skilled artisans may implement the described functionality in varying ways for each particular application, but such implementation decisions should not be interpreted as causing a departure from the scope of the disclosed devices and/or methods.

What is claimed is:

1. A soft microstructure, comprising:
a plurality of elastomeric layers with fluidic networks formed between at least two of the elastomeric layers, at least one of the elastomeric layers comprising:
at least one structural actuator configured to accept a phase-changing material to convert the structural actuator into a permanent structural element by self-folding a portion of the microstructure to form a three dimensional structure from a two dimensional structure, and
at least one functional actuator configured to accept an inert working fluid to allow for motion of the 3D structure formed by the at least one structural actuator.

2. The soft microstructure of claim 1, wherein any of the plurality of elastomeric layers contains at least one structural actuator or at least one functional actuator or both at least one structural actuator and the at least one functional actuator.

3. The soft microstructure of claim 1, wherein the phase-changing material is a curable material that is configured to cause self-folding into a three dimensional structure as the curable material cures.

4. The soft microstructure of claim 1, wherein the phase-changing material is a functional material such that the three dimensional structure is responsive to a stimuli.

5. The soft microstructure of claim 4, wherein the stimuli is ultraviolet light such that the phase-changing material is cured with the UV light.

6. The soft microstructure of claim 4, wherein the stimuli is thermal energy such that the phase-changing material is cured with the thermal energy.

7. The soft microstructure of claim 1, wherein a form of the three dimensional structure is based on a number of the plurality of elastomeric layers.

8. The soft microstructure of claim 1, wherein a form of the three dimensional structure is based on a placement and size of the fluidic networks formed in the plurality of elastomeric layers.

9. A soft microstructure, comprising:
a plurality of elastomeric layers with fluidic networks formed between at least two of the elastomeric layers, any of the elastomeric layers comprising:
- at least one structural actuator configured to accept a phase-changing material to convert the structural actuator into a permanent structural element by self-folding a portion of the microstructure to form a three dimensional structure from a two dimensional structure, and
- at least one functional actuator configured to accept an inert working fluid to allow for motion of the 3D structure formed by the at least one structural actuator.

10. The soft microstructure of claim 9, wherein the at least one structural actuator and the at least one functional actuator are formed in the same elastomeric layer.

11. The soft microstructure of claim 9, wherein the at least one structural actuator and the at least one functional actuator are formed in different ones of the plurality of elastomeric layers.

12. The soft microstructure of claim 9, wherein a form of the three dimensional structure is based on a number of the plurality of elastomeric layers.

13. The soft microstructure of claim 9, wherein a form of the three dimensional structure is based on a placement and size of the fluidic networks formed in the plurality of elastomeric layers.

* * * * *